United States Patent
Lee et al.

(10) Patent No.: US 8,349,082 B2
(45) Date of Patent: Jan. 8, 2013

(54) VACUUM PROCESSING APPARATUS

(75) Inventors: Young Jong Lee, Sungnam-shi (KR); Jun Young Choi, Seoul (KR); Hyoung-Kyu Son, Gangbuk-gu (KR); Jeong-Bin Lee, Yongin (KR); Gyeong-Hoon Kim, Anyang-shi (KR); Hyung-Soo Kim, Seoul (KR); Myung-Woo Han, Seoul (KR)

(73) Assignee: Advanced Display Process Engineering Co., Ltd., Sungnam-shi (KR)

( * ) Notice: Subject to any disclaimer, the term of this patent is extended or adjusted under 35 U.S.C. 154(b) by 561 days.

(21) Appl. No.: 12/578,864

(22) Filed: Oct. 14, 2009

(65) Prior Publication Data

US 2010/0086382 A1    Apr. 8, 2010

Related U.S. Application Data

(62) Division of application No. 11/346,621, filed on Feb. 2, 2006, now abandoned.

(30) Foreign Application Priority Data

| Feb. 4, 2005 | (KR) | 10-2005-0010481 |
| Oct. 17, 2005 | (KR) | 10-2005-0097621 |
| Oct. 17, 2005 | (KR) | 10-2005-0097625 |
| Oct. 17, 2005 | (KR) | 10-2005-0097642 |
| Oct. 17, 2005 | (KR) | 10-2005-0097646 |
| Oct. 17, 2005 | (KR) | 10-2005-0097652 |
| Oct. 17, 2005 | (KR) | 10-2005-0097664 |
| Oct. 17, 2005 | (KR) | 10-2005-0097667 |

(51) Int. Cl.
*C23C 16/00* (2006.01)
*H01L 21/306* (2006.01)

(52) U.S. Cl. .............. 118/715; 294/81.1; 294/81.51; 294/81.54; 156/345.1

(58) Field of Classification Search .............. 118/715; 294/81.1, 81.51, 81.54; 156/345.1
See application file for complete search history.

(56) References Cited

U.S. PATENT DOCUMENTS

| 2,415,259 | A | 2/1947 | Renton |
| 3,549,190 | A | 12/1970 | Caldwell |
| 4,542,928 | A | 9/1985 | Fowler, Jr. |
| 5,163,726 | A | 11/1992 | Boos et al. |
| 6,565,662 | B2 | 5/2003 | Amano et al. |
| 6,719,851 | B1 | 4/2004 | Kurita et al. |
| 6,889,627 | B1 | 5/2005 | Hao |

(Continued)

FOREIGN PATENT DOCUMENTS

JP    2001-185534    6/2001

OTHER PUBLICATIONS

Office Action issued in U.S. Appl. No. 12/578,796 dated Jul. 14, 2011.

(Continued)

*Primary Examiner* — Jeffrie R Lund
(74) *Attorney, Agent, or Firm* — KED & Associates, LLP

(57) ABSTRACT

Disclosed herein is a vacuum processing apparatus for performing a desired process for a substrate after establishing a vacuum atmosphere therein. More particularly, the vacuum processing apparatus includes a vacuum chamber, which is divided into a chamber body and an upper cover. The upper cover is configured to be easily opened away from and closed to the chamber body.

4 Claims, 34 Drawing Sheets

U.S. PATENT DOCUMENTS

| | | | |
|---|---|---|---|
| 6,954,585 B2 | 10/2005 | Mokuo | |
| 7,138,629 B2* | 11/2006 | Noji et al. | 250/311 |
| 7,335,277 B2* | 2/2008 | Makino et al. | 156/345.32 |
| 7,365,324 B2* | 4/2008 | Noji et al. | 250/310 |
| 7,682,454 B2 | 3/2010 | Sneh | |
| 7,828,928 B2* | 11/2010 | Makino et al. | 156/345.51 |
| 7,879,181 B2 | 2/2011 | Lee et al. | |
| 8,075,691 B2* | 12/2011 | Lee et al. | 118/715 |
| 8,152,926 B2* | 4/2012 | Lee et al. | 118/715 |
| 8,187,384 B2* | 5/2012 | Lee et al. | 118/715 |
| 2001/0006094 A1 | 7/2001 | Amano et al. | |
| 2003/0180458 A1 | 9/2003 | Sneh | |
| 2003/0201190 A1 | 10/2003 | Graham et al. | |
| 2004/0110106 A1 | 6/2004 | Mokuo | |
| 2005/0045821 A1* | 3/2005 | Noji et al. | 250/311 |
| 2005/0051091 A1* | 3/2005 | Makino et al. | 118/719 |
| 2005/0051092 A1* | 3/2005 | Makino et al. | 118/719 |
| 2005/0051093 A1* | 3/2005 | Makino et al. | 118/719 |
| 2005/0139160 A1 | 6/2005 | Lei et al. | |
| 2005/0183824 A1* | 8/2005 | Lee et al. | 156/345.31 |
| 2006/0021573 A1 | 2/2006 | Monsma et al. | |
| 2006/0071384 A1 | 4/2006 | Lee et al. | |
| 2006/0169900 A1* | 8/2006 | Noji et al. | 250/310 |
| 2006/0191118 A1 | 8/2006 | Lee et al. | |
| 2007/0051312 A1 | 3/2007 | Sneh | |
| 2007/0269983 A1 | 11/2007 | Sneh | |
| 2008/0145193 A1* | 6/2008 | Makino et al. | 414/217 |
| 2008/0317581 A1* | 12/2008 | Makino et al. | 414/939 |
| 2009/0000739 A1* | 1/2009 | Makino et al. | 156/345.31 |
| 2009/0078200 A1 | 3/2009 | Lee et al. | |
| 2009/0078373 A1 | 3/2009 | Lee et al. | |
| 2009/0084316 A1 | 4/2009 | Lee et al. | |
| 2009/0101816 A1* | 4/2009 | Noji et al. | 250/310 |
| 2009/0133837 A1* | 5/2009 | Lee et al. | 156/345.31 |
| 2010/0086381 A1 | 4/2010 | Lee et al. | |
| 2010/0086382 A1 | 4/2010 | Lee et al. | |
| 2010/0086383 A1 | 4/2010 | Lee et al. | |
| 2010/0089531 A1 | 4/2010 | Lee et al. | |
| 2010/0237243 A1* | 9/2010 | Noji et al. | 250/310 |
| 2011/0259522 A1* | 10/2011 | Makino et al. | 156/345.29 |

OTHER PUBLICATIONS

U.S. Notice of Allowance issued in U.S. Appl. No. 12/578,918 dated Oct. 6, 2011.
Office Action dated Oct. 19, 2009 for U.S. Appl. No. 11/346,621.
Notice of Allowance issued in U.S. Appl. No. 12/578,820 dated Jan. 6, 2012.

* cited by examiner

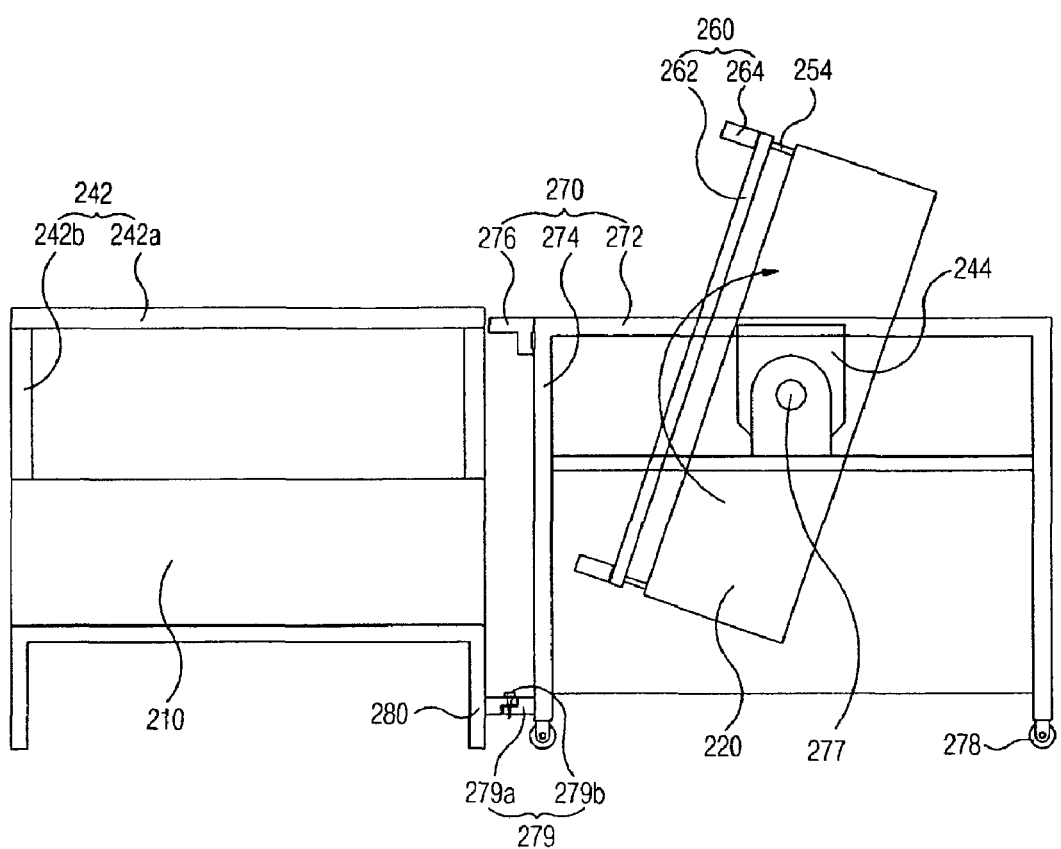

VACUUM PROCESSING APPARATUS

This application is a Divisional of U.S. patent application Ser. No. 11/346,621, filed Feb. 2, 2006 now abandoned, the entirety of which is incorporated herein by reference. This application claims priority under 35 U.S.C. §119 to Korean Application Serial Nos. 10-2005-0010481 filed on Feb. 4, 2005, 10-2005-0097664 filed on Oct. 17, 2005, 10-2005-0097621 filed on Oct. 17, 2005, 10-2005-0097652 filed on Oct. 17, 2005, 10-2005-0097625 filed on Oct. 17, 2005, 10-2005-0097642 filed on Oct. 17, 2005, 10-2005-0097646 filed on Oct. 17, 2005, and 10-2005-0097667 filed on Oct. 17, 2005.

BACKGROUND OF THE INVENTION

1. Field of the Invention

The present invention relates to a vacuum processing apparatus which can perform a desired process for a substrate after establishing a vacuum atmosphere therein. More particularly, the present invention relates to a vacuum processing apparatus in which a vacuum chamber is divided into a chamber body and an upper cover, whereby the upper cover can be easily opened away from and closed to the chamber body.

2. Description of the Related Art

Vacuum processing apparatuses are mainly used in semiconductor manufacturing apparatuses and flat-panel display (FPD) manufacturing apparatuses. The semiconductor or FPD manufacturing apparatuses are designed to feed a substrate thereinto and to perform a desired process, such as an etching process, for the substrate by use of plasma, etc. Here, examples of FPDs include LCDs, PDPs, OLEDs, etc. Referring to FIG. 1, a prior art vacuum processing apparatus generally comprises three kinds of vacuum chambers including a load-lock chamber R, a feeding chamber T, and a process chamber P.

The load-lock chamber R is used to receive a substrate, which will be processed in the apparatus, from an external station for loading the substrate or to discharge a substrate completely processed in the apparatus for unloading the substrate. The feeding chamber T is provided with a robot for feeding a substrate between respective chambers, so that it conveys the substrate, which will be processed, from the load-lock chamber to the process chamber or conveys the substrate, which was completely processed, from the process chamber to the load-lock chamber. The process chamber P is used to perform a desired process, such as a film deposition process or etching process, for a substrate by use of plasma or thermal energy under a vacuum atmosphere. For this, the process chamber P contains: a supporting member to support a substrate in the chamber; a process gas supply system to supply a process gas thereinto; and an exhaust system to empty the chamber and create a vacuum in the chamber.

The process chamber is used to repeatedly perform a great number of processes by use of a variety of process gases or plasma, and therefore, equipment inside the process chamber tends to be easily damaged or polluted, requiring periodical exchange or repair. Referring to FIG. 2, a prior art process chamber, designated by reference numeral 1, is divided into a chamber body 10 and an upper cover 20, so that the upper cover 20 can be opened away from the chamber body 10 for the maintenance and repair of the interior of the process chamber 1. In a conventional solution to open and close the upper cover 20, a crane has been mounted to the top of a clean room in which the process chamber 1 is provided, so that the upper cover 20 is lifted and opened away from the chamber body 10 by use of the crane. In another conventional opening/closing solution, the process chamber may be separately equipped with an opening/closing device to open and close the upper cover.

Referring to FIG. 3 illustrating an example of the conventional opening/closing device for the upper cover 20, the upper cover opening/closing device, designated by reference numeral 50, is provided at an outer surface of the process chamber 1 to open and close the upper cover 20. The opening/closing device 50 includes: a vertical drive unit to vertically lift the upper cover 20; a horizontal drive unit to horizontally move the upper cover 20; and a rotating unit to rotate the upper cover 20. Additionally, the opening/closing device 50 is provided with a horizontal movement guide 60 to provide a movement path of the horizontal drive unit.

Hereinafter, the opening/closing procedure of the upper cover 20 carried out by the opening/closing device 50 having the above configuration will be explained. First, the upper cover 20 is lifted vertically by a predetermined height by use of the vertical drive unit included in the opening/closing device 50. In succession, the lifted upper cover 20 is horizontally moved along the horizontal movement guide 60. After completing such a horizontal movement, the upper cover 20 is rotated by 180° by use of the rotating unit. As a result, both the chamber body 10 and the upper cover 20 of the process chamber 1 are opened, whereby exchange and repair of respective equipment provided in the process chamber 1 can be performed.

Recently, a substrate, which will be processed by the FPD manufacturing apparatus, has been increased in size. More particularly, the size of a vacuum chamber included in the FPD manufacturing apparatus is rapidly increasing. For example, considering a current available vacuum chamber, an upper cover of the chamber has a large size of 3 by 4 meters and a heavy weight of more than 3 to 4 tons. Therefore, in order to vertically lift the large-size heavy upper cover of the vacuum chamber, it is necessary to provide the vertical drive unit with an air cylinder having an extremely high capacity. Due to this, the upper cover of the bulky chamber exhibits an increased lack of stability when it is vertically lifted, and therefore, has an adverse effect on the maintenance and repair of the interior of the vacuum chamber.

SUMMARY OF THE INVENTION

Therefore, the present invention has been made in view of the above problems, and it is an object of the present invention to provide a large-scale vacuum processing apparatus capable of ensuring easy opening and closing operations of an upper cover.

In accordance with a first aspect of the present invention, the above and other objects can be accomplished by the provision of a vacuum processing apparatus comprising a chamber body having a gate valve for enabling loading and unloading of a substrate and an upper cover separably disposed on the chamber body to have a predetermined gap therebetween, the vacuum processing apparatus further comprising: a horizontal drive device to horizontally move the upper cover in a direction facing the arrangement direction of the gate valve; an inner wall structure inserted into side walls of the upper cover and adapted to vertically move for closing and opening the gap between the chamber body and the upper cover; and an inner wall structure lifting device provided above the upper cover and adapted to vertically move the inner wall structure.

In accordance with a second aspect of the present invention, the above and other objects can be accomplished by the provision of a vacuum processing apparatus comprising a chamber body having a gate valve for enabling loading and unloading of a substrate and an upper cover separably disposed on the chamber body to have a predetermined gap therebetween, the vacuum processing apparatus further comprising: a horizontal drive device coupled to an outer surface of the upper cover and adapted to horizontally move the upper cover in a direction perpendicular to the arrangement direction of the gate valve; an inner wall structure inserted into side walls of the upper cover and adapted to vertically move for closing the gap between the chamber body and the upper cover; and an inner wall structure lifting device provided above the upper cover and coupled to the inner wall structure to vertically move the inner wall structure.

In accordance with a third aspect of the present invention, the above and other objects can be accomplished by the provision of a vacuum processing apparatus comprising a chamber body having a gate valve for enabling loading and unloading of a substrate and an upper cover separably disposed on the chamber body to have a predetermined gap therebetween, the vacuum processing apparatus further comprising: a horizontal drive device coupled to an outer surface of the upper cover and adapted to horizontally move the upper cover in a direction perpendicular to the arrangement direction of the gate valve; and a sealing device to selectively seal rim regions of both the chamber body and the upper cover, the sealing device being separable from both the chamber body and the upper cover.

In accordance with a fourth aspect of the present invention, the above and other objects can be accomplished by the provision of a processing apparatus comprising a chamber body having a gate valve for enabling loading and unloading of a substrate and an upper cover separably disposed on the chamber body, the processing apparatus further comprising: a chamber body lifting device mounted at a lower surface of the chamber body and adapted to vertically move the chamber body; and a horizontal drive device mounted at an outer surface of the upper cover to horizontally move the upper cover in a direction facing the arrangement direction of the gate valve.

In accordance with a fifth aspect of the present invention, the above and other objects can be accomplished by the provision of a processing apparatus comprising a chamber body having a gate valve for enabling loading and unloading of a substrate and an upper cover separably disposed on the chamber body, the processing apparatus further comprising: a chamber body lifting device mounted at a lower surface of the chamber body and adapted to vertically move the chamber body; and a horizontal drive device mounted at an outer surface of the upper cover to horizontally move the upper cover in a direction perpendicular to the arrangement direction of the gate valve.

In accordance with a sixth aspect of the present invention, the above and other objects can be accomplished by the provision of a processing apparatus comprising a chamber body having a gate valve for enabling loading and unloading of a substrate and an upper cover separably disposed on the chamber body, the processing apparatus further comprising: one or more horizontal drive units to support the upper cover so as to horizontally move the upper cover in a direction facing the arrangement direction of the gate valve; a pair of upper cover movement frames located at opposite sides of the upper cover in a vertically movable manner and adapted to provide a horizontal movement path of the horizontal drive units; and a plurality of vertical drive units coupled to a lower surface of each of the upper cover movement frames while being spaced apart from one another by a predetermined distance, the vertical drive units serving to vertically move the upper cover movement frames and the upper cover.

In accordance with a seventh aspect of the present invention, the above and other objects can be accomplished by the provision of a processing apparatus comprising a chamber body having a gate valve for enabling loading and unloading of a substrate and an upper cover separably disposed on the chamber body, the processing apparatus further comprising: an upper cover lifting device separably disposed on the upper cover to vertically move the upper cover; and a horizontal drive device disposed at opposite sides of the upper cover and adapted to horizontally move the upper cover after the upper cover is lifted by the upper cover lifting device.

In accordance with an eighth aspect of the present invention, the above and other objects can be accomplished by the provision of a processing apparatus comprising a chamber body having a gate valve for enabling loading and unloading of a substrate and an upper cover separably disposed on the chamber body, the processing apparatus further comprising: a transportation hoist jig system, and the transportation hoist jig system includes: a body having a polygonal column shape having an appropriate thickness, the body being centrally provided with a connecting loop; and a plurality of connecting loops provided at respective corners of a lower surface of the body to move toward a center of the body in a diagonal direction, the connecting loops being simultaneously moved inward or outward to be changed in position.

BRIEF DESCRIPTION OF THE DRAWINGS

The above and other objects, features and other advantages of the present invention will be more clearly understood from the following detailed description taken in conjunction with the accompanying drawings, in which:

FIGS. 14A to 14C are views illustrating the opening procedure of an upper cover included in the vacuum processing apparatus in accordance with the second embodiment of the present invention;

DESCRIPTION OF THE PREFERRED EMBODIMENTS

Now, preferred embodiments of a vacuum processing apparatus according to the present invention will be explained in detail with reference to the accompanying drawings.

First Embodiment

Figure 1:
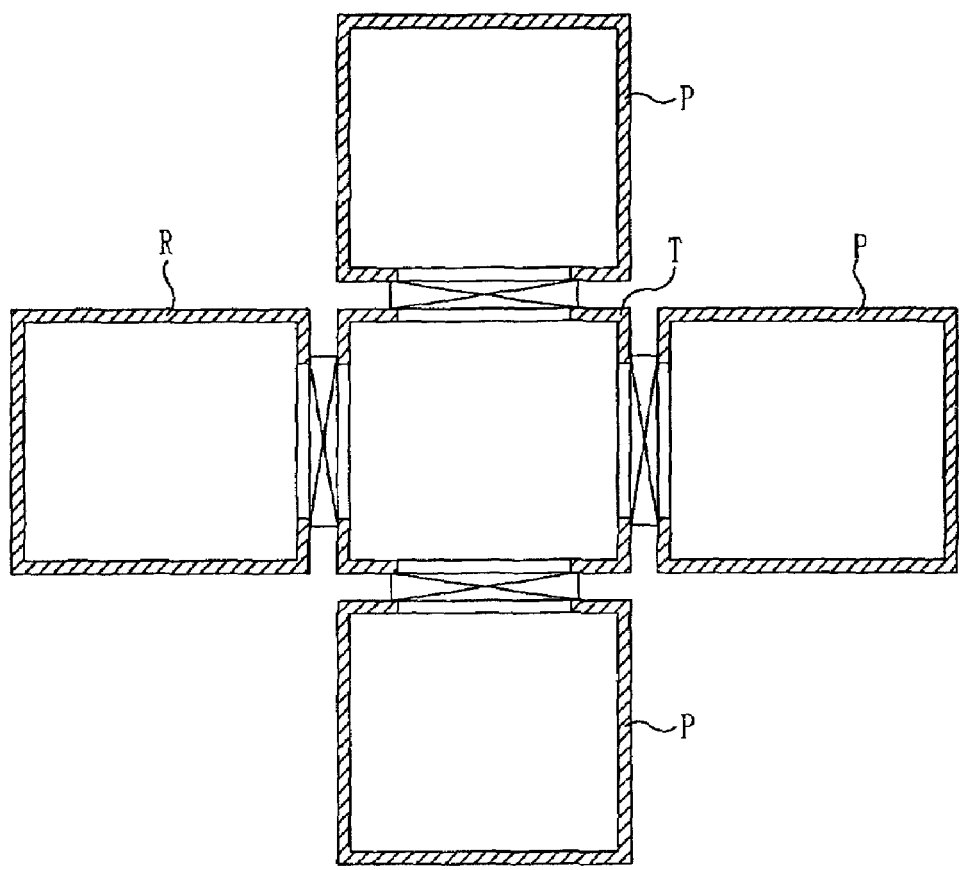
FIG. 1 is a view illustrating the layout of respective chambers of a prior art vacuum processing apparatus.
Figure 2:
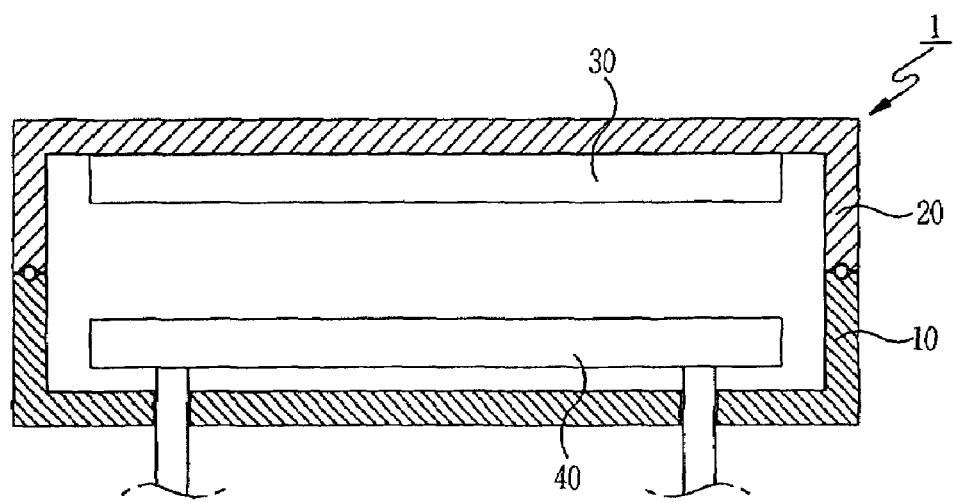
FIG. 2 is a diagrammatic sectional view explaining the interior of the prior art vacuum processing apparatus.
Figure 3:
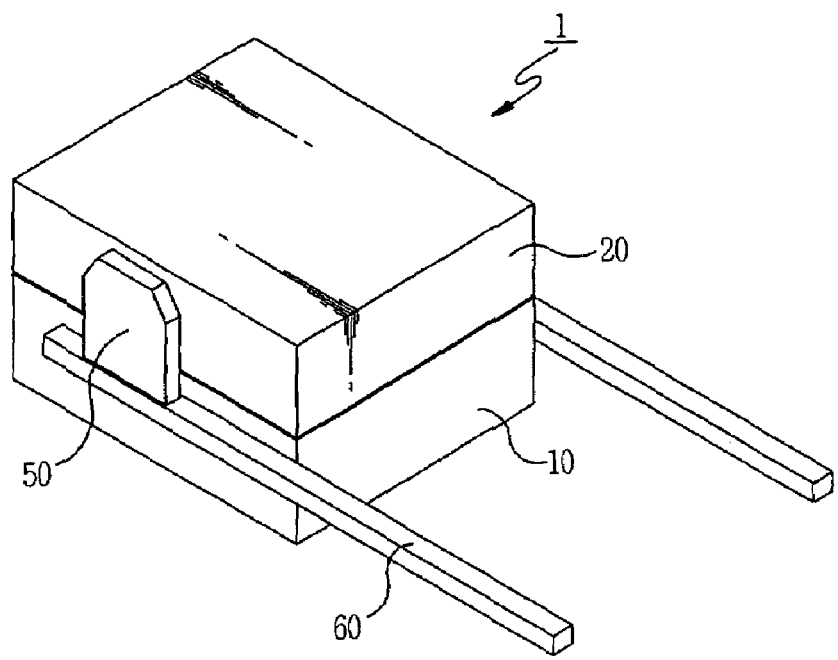
FIG. 3 is a perspective view illustrating a prior art upper cover opening/closing device.
Figure 4:
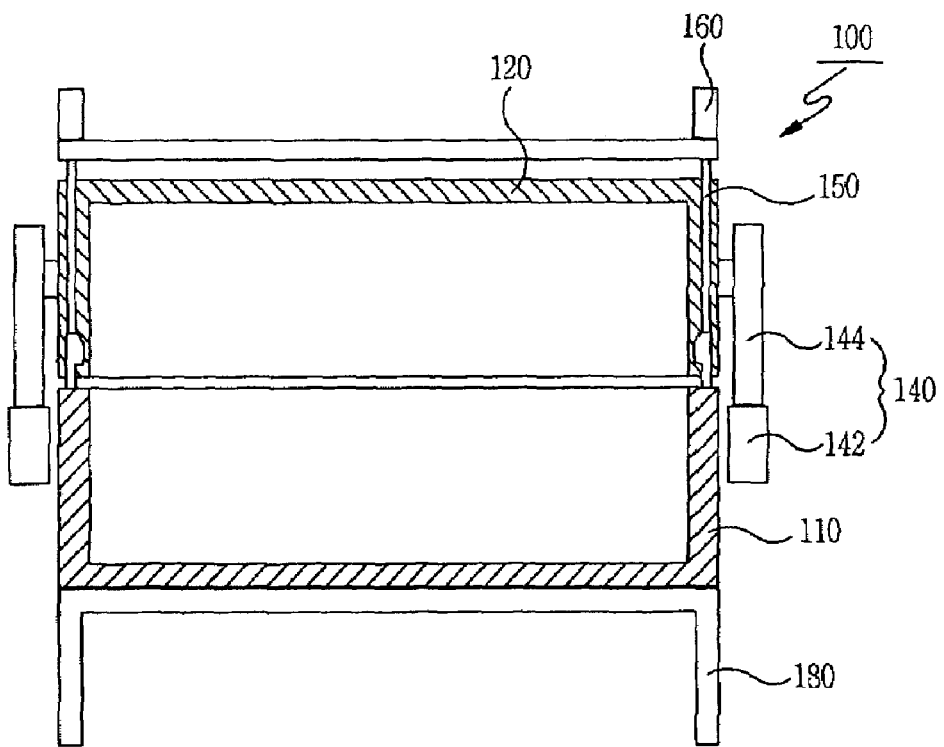
FIG. 4 is a sectional view illustrating a vacuum processing apparatus in accordance with a first embodiment of the present invention.

The vacuum processing apparatus according to the present embodiment comprises: a load lock chamber; a feeding chamber; and one or more process chambers, but the following description deals with only one process chamber for the convenience of explanation. Referring to FIG. 4, the vacuum processing apparatus 100 according to the present embodiment includes: a chamber body 110; an upper cover 120; a horizontal drive device 140; an inner wall structure 150; and an inner wall structure lifting device 160.

In the vacuum processing apparatus 100 according to the present embodiment, the chamber body 110 generally has a rectangular box shape and the upper cover 120 is separably disposed on the chamber body 110, to constitute a vacuum chamber. The vacuum chamber is used to process a large-area flat panel display substrate, having a rectangular shape, therein, and therefore, generally has a rectangular box shape corresponding to the rectangular substrate. The vacuum chamber is internally provided with an exhaust system (not shown) to create a vacuum in the chamber. After a vacuum is established in the chamber in accordance with the operation of the exhaust system, a desired process for the substrate disposed in the chamber is performed.

The chamber body 110 is formed with a substrate entrance, which serves as a passage to receive a substrate from an external station for loading the substrate and to discharge a substrate for unloading the substrate. Generally, a substrate is loaded and unloaded as it is horizontally moved in a lying state, and therefore, the substrate entrance is perforated through one of side walls of the chamber body 110. To open and close the substrate entrance, the chamber body 110 is provided with a gate valve. The substrate entrance is maintained open during loading and unloading of a substrate, but must be closed after the substrate is completely loaded, such that a desired process for the substrate is performed in a closed state of the chamber. Accordingly, the gate valve is moved vertically to open and close the substrate entrance.

Figure 5:
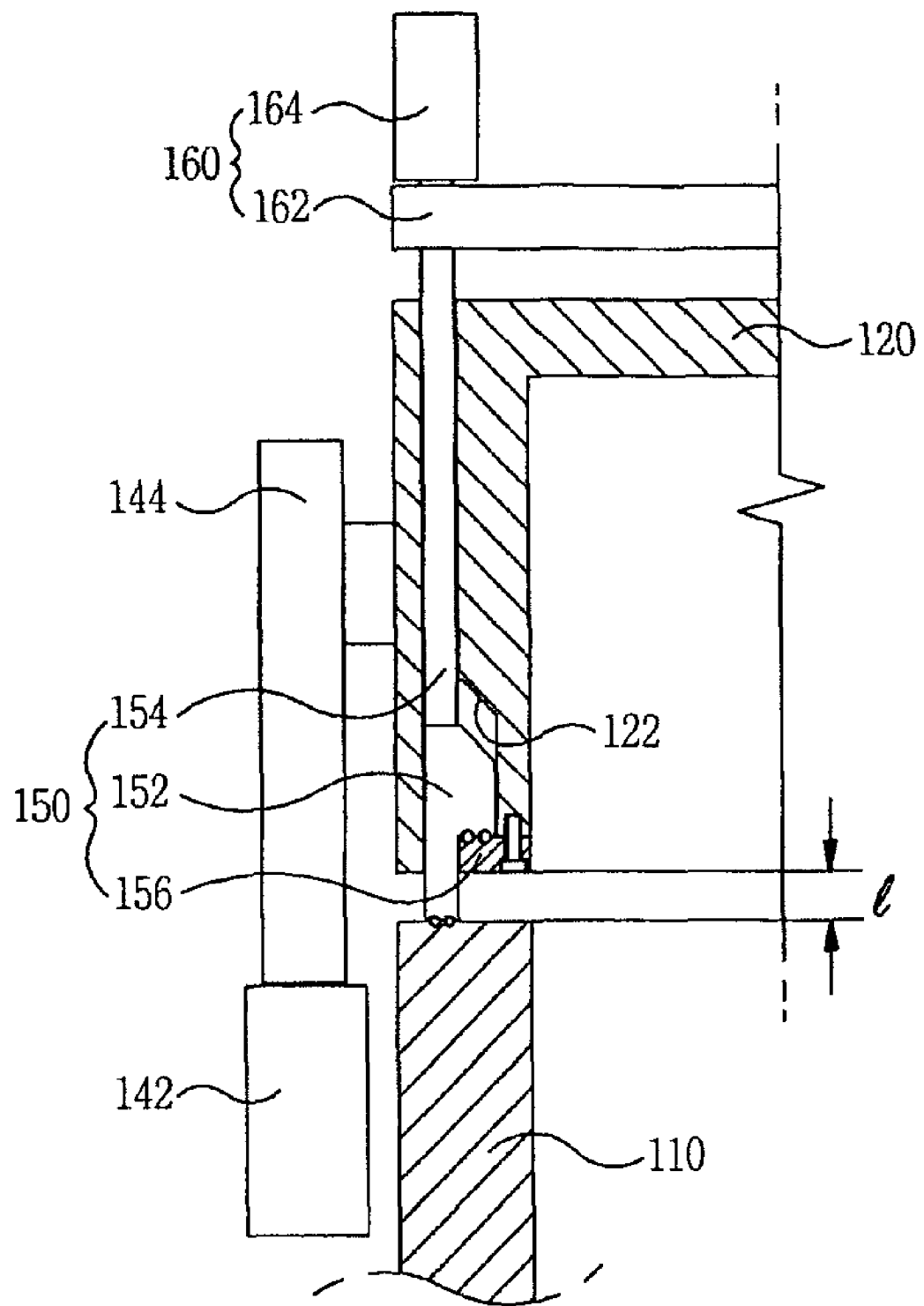
FIG. 5 is a side view illustrating an inner wall structure and an inner wall structure lifting device in accordance with the first embodiment of the present invention.

The inner wall structure 150 is inserted in side walls of the upper cover 120 and is adapted to create and release a vacuum in the chamber as it is vertically moved. Referring to FIG. 5, the inner wall structure 150 of the present embodiment includes: a sealing member 152; a plurality of connecting rods 154; and an auxiliary sealing member 156. The sealing member 152 is inserted into an insertion groove 122, which is dented along lower surfaces of the side walls of the upper cover 120, and is adapted to seal a gap between the upper cover 120 and the chamber body 110. Specifically, the sealing member 152 is inserted into the side walls of the upper cover 120 when the upper cover 120 is supported to be spaced apart from the chamber body 110 by a predetermined distance. The sealing member 152 serves to create and release a vacuum in the chamber as it is vertically moved. In the present embodiment, the sealing member 152 generally has a rectangular ring shape, and is coupled to the upper cover 120 as it is moved upward to a lower end of the upper cover 120. The plurality of connecting rods 154 are vertically penetrated through certain positions of the side walls of the upper cover 120 to connect the sealing member 152 to the inner wall structure lifting device 160. The connecting rods 154 are coupled at lower ends thereof to a plurality of positions of an upper surface of the sealing member 152 and therefore, enable stable vertical movements of the sealing member 152. Meanwhile, the sealing member 152 of the present embodiment has a stepped shape, such that one surface of the resulting stepped portion comes into close contact with a surface of the chamber body 110 and the other surface of the stepped portion comes into close contact with the auxiliary sealing member 156, to create a vacuum in the chamber.

The auxiliary sealing member 156, accordingly, is an essential component of the present embodiment. The auxiliary sealing member 156 comes into contact with the sealing member 152 at a position higher than an upper surface of the chamber body 110, to maintain the interior of the chamber in an airtight state. More particularly, as shown in FIG. 5, the sealing member 152 has a stepped lower portion defining two horizontal contact surfaces, i.e. a first contact surface and a second contact surface. The first contact surface comes into contact with upper surfaces of the side walls of the chamber body 110, and the second contact surface comes into contact with the auxiliary sealing member 156.

The inner wall structure lifting device 160 is located above the upper cover 120, and is coupled to the inner wall structure 150, which is penetrated through the side walls of the upper cover 120, to vertically lift the inner wall structure 150. In the present embodiment, as shown in FIG. 5, the inner wall structure lifting device 160 preferably includes: a guide plate 162 which is located above the upper cover 120 and is coupled to upper ends of the plurality of connecting rods 154, the guide plate 162 serving to guide simultaneous movement of the connecting rods 154; and drive motors 164 fixedly mounted on the guide plate 162 to vertically move the guide plate 162. Since the plurality of connecting rods 154 must be simultaneously moved, the guide plate 162 serves to synchronize the lifting movements of all the connecting rods 154.

The horizontal drive device 140 serves to horizontally move the upper cover 120 in a direction facing the arrangement direction of the gate valve. That is, the horizontal drive device 140 is coupled to the upper cover 120 to support the upper cover 120 in a horizontally movable manner. When the chamber body 110 is moved downward by a desired distance in accordance with the operation of a chamber body lifting device (not shown), and thus, is separated from the upper cover 120, the horizontal drive device 140 horizontally moves the upper cover 120 until the upper cover 120 attains a desired rotating radius.

Figure 6:
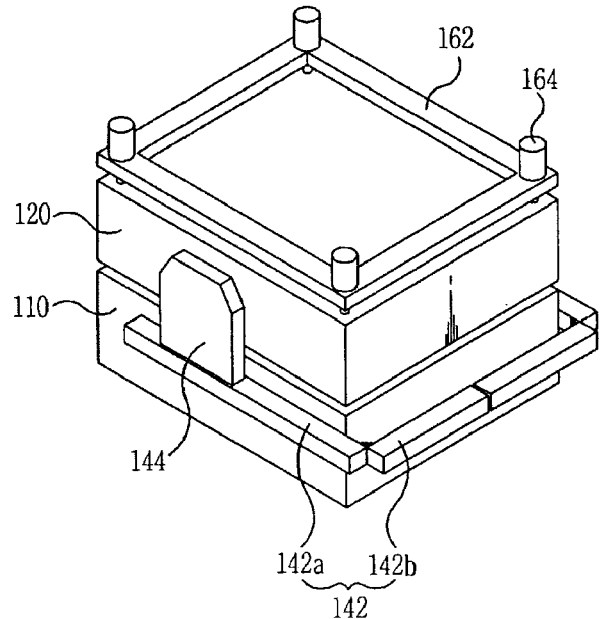
FIG. 6 is a perspective view of the vacuum processing apparatus in accordance with the first embodiment of the present invention.

In the present embodiment, the horizontal drive device 140 includes a pair of guide rails 142, which are horizontally arranged parallel to each other such that the upper cover 120 is located therebetween. The guide rails 142 serve to guide the upper cover 120 in a horizontal direction, and thus, provides a horizontal movement path of the upper cover 120. Referring to FIG. 6, each of the guide rails 142 is divided into a first portion 142a facing the upper cover 120 and a second portion 142b horizontally extending beyond the upper cover 120. Preferably, the second portion 142b is foldable toward the side wall of the upper cover 120 perpendicular to the first portion 142a, such that it is folded when not in use to minimize an area occupied by the vacuum processing apparatus.

The vacuum processing apparatus 100 according to the present embodiment may further comprise a supporting frame 170, which is disposed aside the chamber body 110 and is adapted to receive the upper cover 120 when the upper cover 120 is horizontally moved along the guide rails 142. Providing the separate supporting frame 170 has an advantage in that a single supporting frame can be used for a plurality of vacuum chambers included in the vacuum processing apparatus. That is, instead of providing a plurality of vacuum chambers with supporting frames, respectively, a single movable supporting frame is commonly used for the plurality of vacuum chambers.

Figure 7:
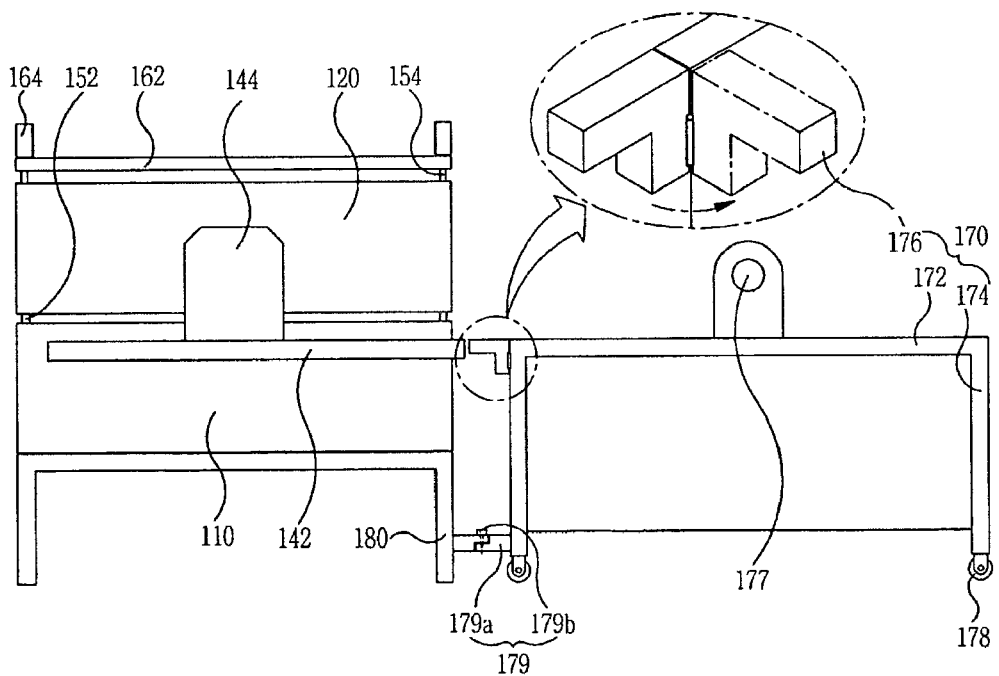
FIG. 7 is a side view illustrating a supporting frame in accordance with the first embodiment of the present invention.

Referring to FIG. 7, in the present embodiment, the supporting frame 170 includes: a rectangular horizontal frame piece 172; vertical frame pieces 174; and gap fillers 176. The horizontal frame piece 172 has the same height as the guide rails 142, and extends in the same direction as the guide rails 142 to guide the horizontal movement of the upper cover 120. The vertical frame pieces 174 serve to support the horizontal frame piece 172 at the same height as the guide rails 142. Preferably, the vertical frame pieces 174 are adapted to regulate the height of the horizontal frame piece 172, to eliminate a height difference between the horizontal frame piece 172 and the guide rails 142.

The gap fillers 176 are provided at an end of the horizontal frame piece 172 facing the chamber. When the supporting frame 170 approaches the guide rails 142, the gap fillers 176 are adapted to fill a gap between the horizontal frame piece 172 and the guide rails 142. As is known, the horizontal frame piece 172 has difficulty coming into close contact with the guide rails 142 due to various elements provided around the chamber and due to the configuration of the supporting frame itself, and therefore, as shown in FIG. 7, the gap fillers 176 must be provided to fill the gap between the horizontal frame piece 172 and the guide rails 142. In the present embodiment, the gap fillers 176 are hinged to the horizontal frame piece 172 in a pivotally rotatable manner, such that they are folded during transportation, but are pivotally rotated in use to fill the gap between the horizontal frame piece 172 and the guide rails 142.

Preferably, each of the gap fillers 176 may be provided with a vertical drive unit to ensure a vertical movement thereof.

The supporting frame 170 according to the present embodiment preferably further includes wheels 178 for facilitating the movement thereof. The wheels 178 are mounted at lower ends of the vertical frame pieces 174, respectively, and are adapted to reduce a frictional force between the vertical frame pieces 174 and the floor, to ensure easy horizontal movement of the vertical frame pieces 174.

The supporting frame 170 according to the present embodiment may further include a pair of rotating members 177. The rotating members 177 serve to rotate the upper cover 120. In the present embodiment, the pair of rotating members 177 are mounted to the horizontal frame piece 172 such that they are located at opposite sides of the upper cover 120. Specifically, the rotating members 177 are coupled to centers of opposite side walls of the upper cover 120 to rotatably support the upper cover 120. Accordingly, after the upper cover 120 is moved by the horizontal drive device 140 to attain a sufficient rotating radius, the rotating members 177 rotate the upper cover 120, whereby the upper cover 120 is opened upward to enable easy management and repair of interior equipment thereof.

Preferably, the supporting frame 170 further includes one or more fixing units 179 to fix the supporting frame 170 to the chamber body 110. The fixing units 179 serve to prevent the supporting frame 170 from moving away from the chamber body 110 during the horizontal movement and rotation of the upper cover 120. In the present embodiment, each of the fixing units 179 includes a pair of fixing blocks 179a and a fixing pin 179b. Accordingly, if the pair of fixing blocks 179 are accurately aligned to each other, the fixing pin 179b is inserted through the fixing blocks 179a to maintain the supporting frame 170 in a fixed position.

Hereinafter, the opening/closing procedure of the upper cover 120 of the vacuum processing apparatus 100 according to the present embodiment will be explained.

Figure 8A:
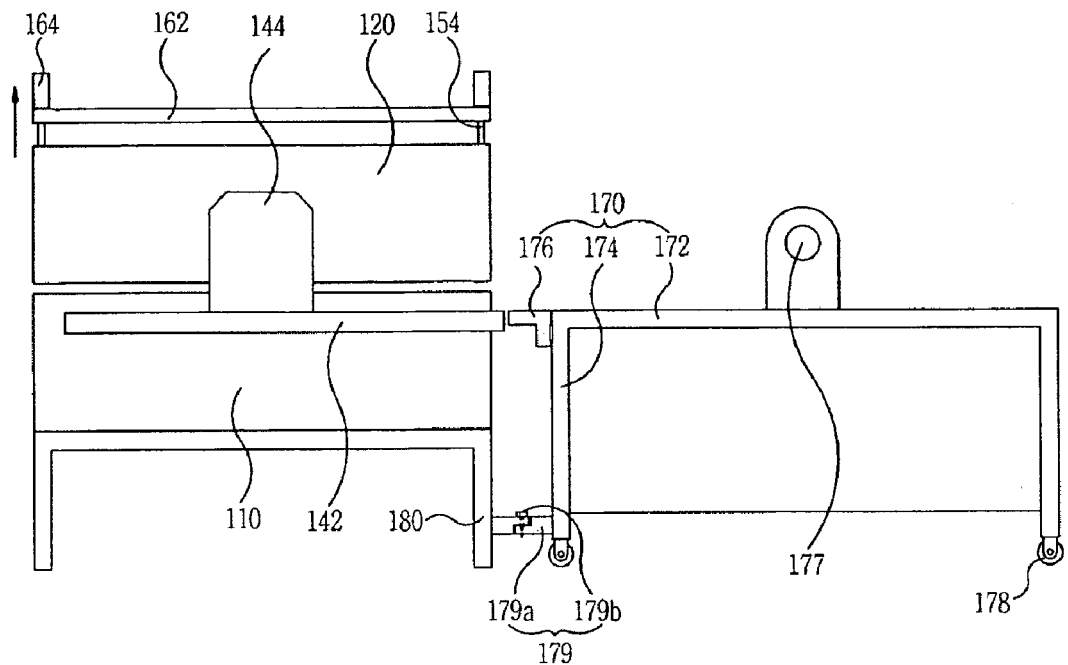
FIGS. 8A to 8C are views illustrating the opening procedure of an upper cover included in the vacuum processing apparatus in accordance with the first embodiment of the present invention.
Figure 8B:
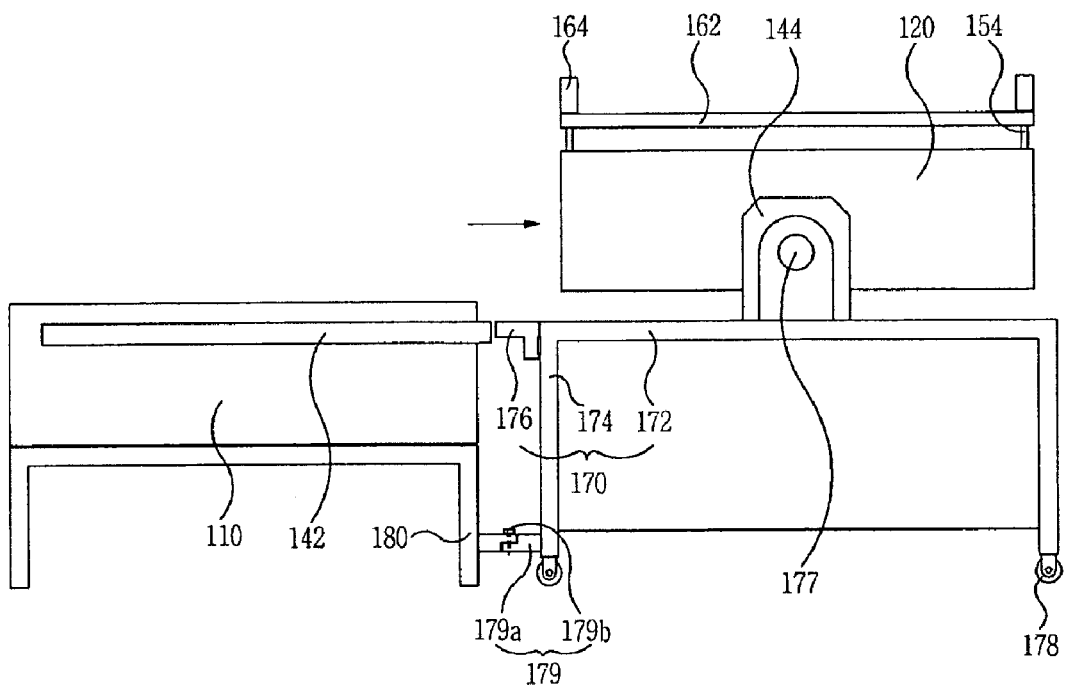
Figure 8C:
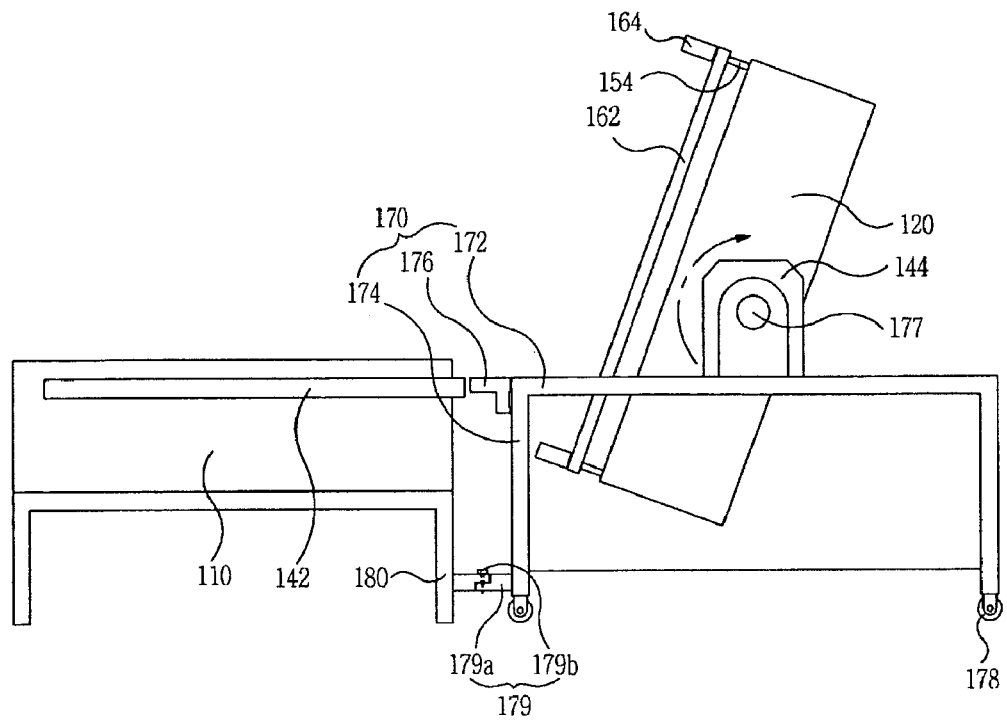

In the vacuum processing apparatus 100 according to the present embodiment, the upper cover 120 is supported such that it is spaced apart upward from the chamber body 110 by a distance of 1 mm to 10 mm, and therefore, there is no need for lifting the upper cover 120. Simply, as shown in FIG. 8A, only the inner wall structure 150 is lifted in accordance with the operation of the associated lifting device 160. As the inner wall structure 150 is lifted, the airtight state of the chamber is destroyed, and therefore, a vacuum in the chamber is released. After that, as shown in FIG. 8B, the upper cover 120 is horizontally moved in accordance with the operation of the horizontal drive device 140. In this case, when using the supporting frame 170, the supporting frame 170 must be positioned to come into close contact with the guide rails 142. When using only the guide rails 142, the second portions 142b of the guide rails 142 are unfolded to attain a stable rotating radius of the upper cover 120. After the upper cover 120 is horizontally moved to ensure a stable rotation thereof, as shown in FIG. 8C, the rotating members 177 are operated to rotate the upper cover 120 by 180°. In this way, the upper cover 120 is opened upward to enable the repair of equipment therein. After completing the repair of equipment, the above-described opening procedure of the upper cover 120 is performed in reverse order, to close the upper cover 120.

Second Embodiment

Figure 9:
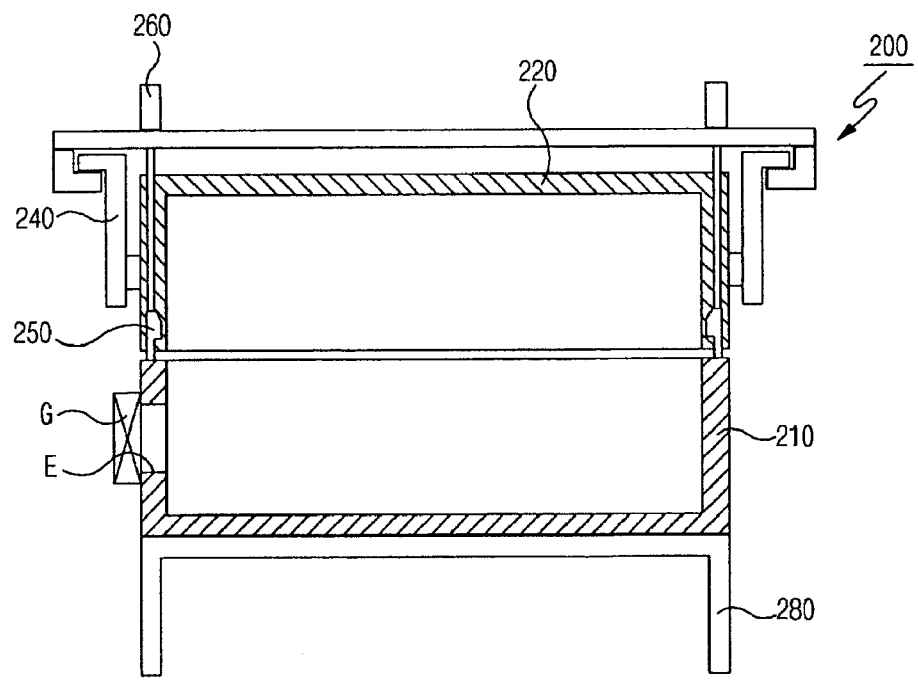
FIG. 9 is a sectional view illustrating a vacuum processing apparatus in accordance with a second embodiment of the present invention.

The vacuum processing apparatus according to the present embodiment comprises: a load lock chamber; a feeding chamber; and one or more process chambers, and the following description deals with only one process chamber for the convenience of explanation. Referring to FIG. 9, the vacuum processing apparatus 200 according to the present embodiment includes: a chamber body 210; an upper cover 220; a horizontal drive device 240; an inner wall structure 250; and an inner wall structure lifting device 260.

In the vacuum processing apparatus 200 according to the present embodiment, the chamber body 210 generally has a rectangular box shape and the upper cover 220 is separably disposed on the chamber body 210, to constitute a vacuum chamber. The vacuum chamber is used to process a large-area flat panel display substrate having a rectangular shape therein, and therefore, generally has a rectangular box shape corresponding to the rectangular substrate. The vacuum chamber is internally provided with an exhaust system (not shown) to create a vacuum in the chamber. After a vacuum is established in the chamber with the operation of the exhaust system, a desired process for the substrate disposed in the chamber is performed.

The chamber body 210 is formed with a substrate entrance E, which serves as a passage to receive a substrate from an external station for loading the substrate or to discharge a substrate for unloading the substrate. Generally, a substrate is loaded or unloaded as it is horizontally moved in a lying state, and therefore, the substrate entrance E is perforated through one of side walls of the chamber body 210. To open and close the substrate entrance E, the chamber body 210 is provided with a gate valve G. The substrate entrance E is continuously opened during loading and unloading of a substrate, but must be closed after the substrate is completely loaded, such that a desired process for the substrate is performed in a closed state of the chamber. Accordingly, the gate valve G is moved vertically to open and close the substrate entrance E.

Figure 10:
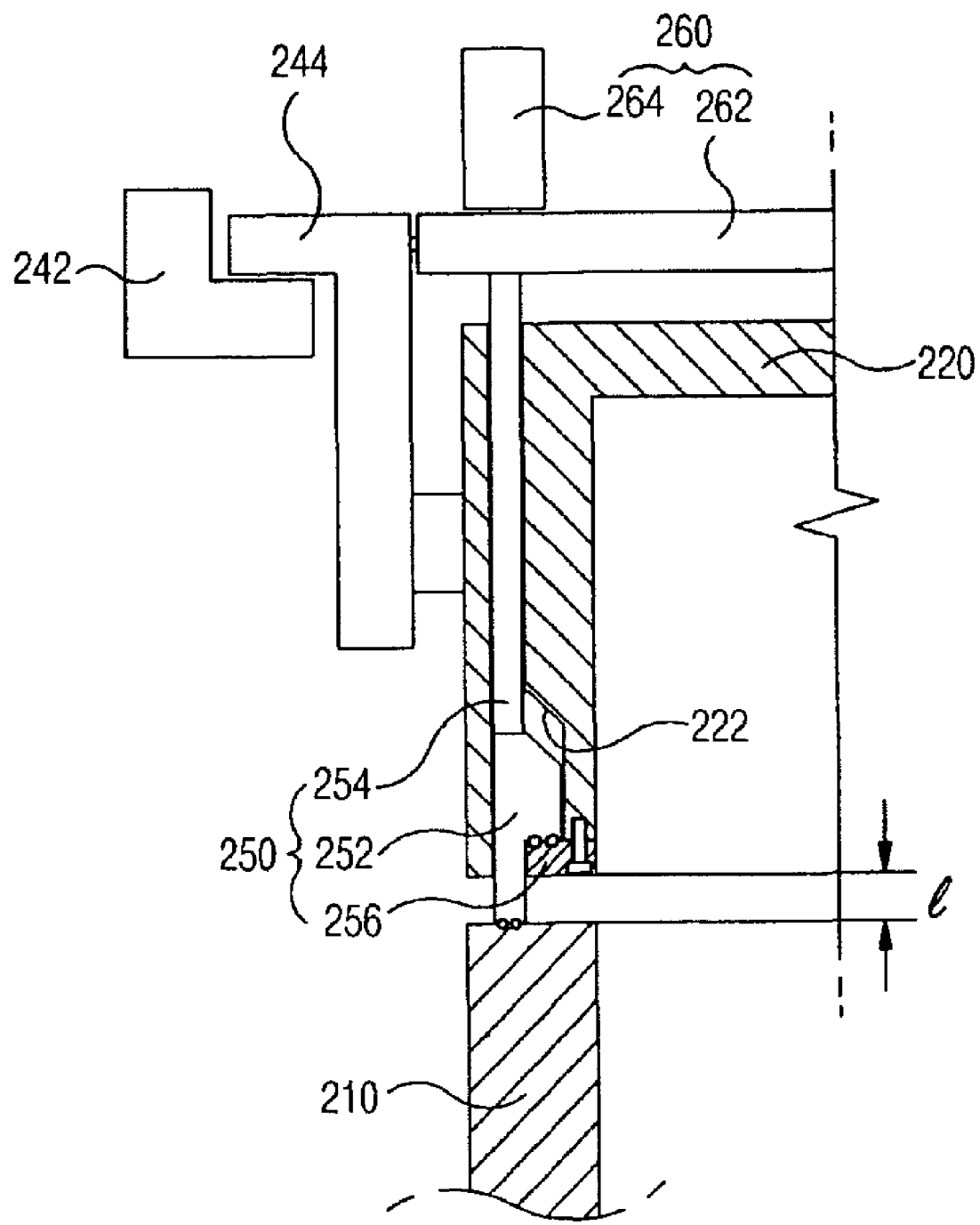
FIG. 10 is a side view illustrating an inner wall structure and an inner wall structure lifting device in accordance with the second embodiment of the present invention.

The inner wall structure 250 is inserted in side walls of the upper cover 220 and is adapted to create and release a vacuum in the chamber as it is vertically moved. Referring to FIG. 10, the inner wall structure 250 of the present embodiment includes: a sealing member 252; a plurality of connecting rods 254; and an auxiliary sealing member 256. The sealing member 252 is inserted into an insertion groove 222, which is dented along lower surfaces of the side walls of the upper cover 220, and is adapted to seal a gap between the upper cover 220 and the chamber body 210. Specifically, the sealing member 252 is inserted into the side walls of the upper cover 220 such that the upper cover 220 is supported to be spaced apart from the chamber body 210 by a predetermined distance. The sealing member 252 serves to create and release a vacuum in the chamber as it is vertically moved. In the present embodiment, the sealing member 252 generally has a rectangular ring shape, and is coupled to the upper cover 220 as it moves upward to a lower end of the upper cover 220.

The plurality of connecting rods 254 are vertically penetrated through certain positions of the side walls of the upper cover 220 to connect the sealing member 252 to the inner wall structure lifting device 260. The connecting rods 254 are coupled at lower ends thereof to a plurality of positions of an upper surface of the sealing member 252 to achieve stable vertical movements of the sealing member 252. The sealing member 252 of the present embodiment has a stepped shape, such that one surface of the resulting stepped portion comes into close contact with a surface of the chamber body 210 and the other surface of the stepped portion comes into close contact with the auxiliary sealing member 256, to create a vacuum in the chamber. The auxiliary sealing member 256, accordingly, is an essential component of the present embodiment. The auxiliary sealing member 256 comes into contact with the sealing member 252 at a position higher than an upper surface of the chamber body 210, and is adapted to maintain the interior of the chamber in an airtight state. More particularly, as shown in FIG. 10, the sealing member 252 has a stepped lower portion defining two horizontal contact surfaces, i.e. a first contact surface and a second contact surface. The first contact surface comes into contact with upper surfaces of the side walls of the chamber body 210, and the second contact surface comes into contact with the auxiliary sealing member 256.

The inner wall structure lifting device 260 is located above the upper cover 220, and is coupled to the inner wall structure 250, which is penetrated through the side walls of the upper cover 220, to vertically lift the inner wall structure 250. In the present embodiment, the inner wall structure lifting device 260 preferably includes: a guide plate 262 which is located above the upper cover 220 and is coupled to upper ends of the plurality of connecting rods 254, the guide plate 262 serving to guide simultaneous movement of the connecting rods 254; and drive motors 264 fixedly mounted on the guide plate 262 to vertically move the guide plate 262. Since the plurality of connecting rods 254 must be simultaneously moved, the guide plate 262 serves to synchronize all the connecting rods 154.

The horizontal drive device 240 serves to horizontally move the upper cover 220 in a direction perpendicular to the arrangement direction of the gate valve G. To minimize footprint occupied by the vacuum processing apparatus 200, the present embodiment proposes that the upper cover 220 is repaired in an unused space between the respective process chambers. For this, the upper cover 220 must be horizontally moved in a direction perpendicular to the arrangement direction of the gate valve G, and therefore, the horizontal drive device 240 is located at the same plane as the gate valve G. In this case, to prevent interference between the gate valve G and the horizontal drive device 240 which are located at the same plane as each other, as shown in FIG. 9, the horizontal drive device 240 is located higher than the gate valve G.

Accordingly, in the present embodiment, the horizontal drive device 240 includes: an upper cover movement frame 242; and a pair of horizontal movers 244. The upper cover movement frame 242 is partially disposed at opposite sides of the upper cover 220 at a position higher than a drive height of the gate valve G. The upper cover movement frame 242 provides a horizontal movement path of the upper cover 220.

Figure 11:
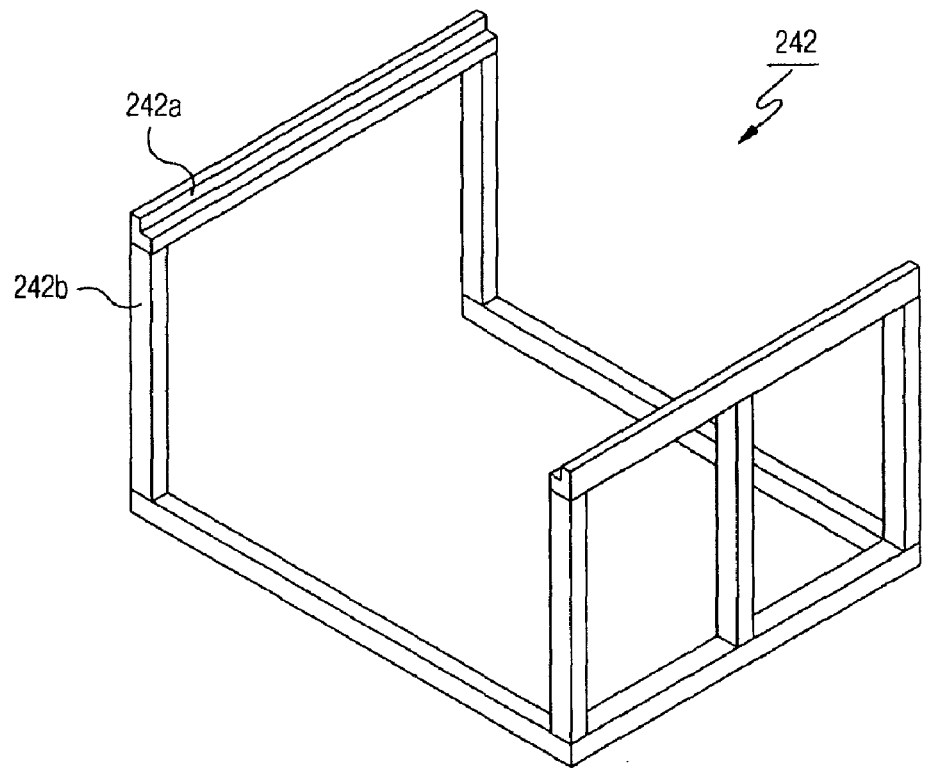
FIG. 11 is a perspective view illustrating an upper cover movement frame in accordance with the second embodiment of the present invention.

Referring to FIG. 11, the upper cover movement frame 242 includes: first horizontal frame pieces 242a each to support a first end of one of the horizontal movers 244 at an upper surface thereof; and first vertical frame pieces 242b coupled to lower surfaces of the first horizontal frame pieces 242a to support the first horizontal frame pieces 242a at a predetermined height. In the present embodiment, to allow the completely assembled upper cover movement frame 242 to be mounted to the vacuum chamber, the first horizontal frame pieces 242a are disposed at a position higher than an upper end of the upper cover 220. Also, the first vertical frame pieces 242b are arranged such that adjacent ones of them are spaced apart from each other by a distance wider than a width of the vacuum processing apparatus.

Figure 12:
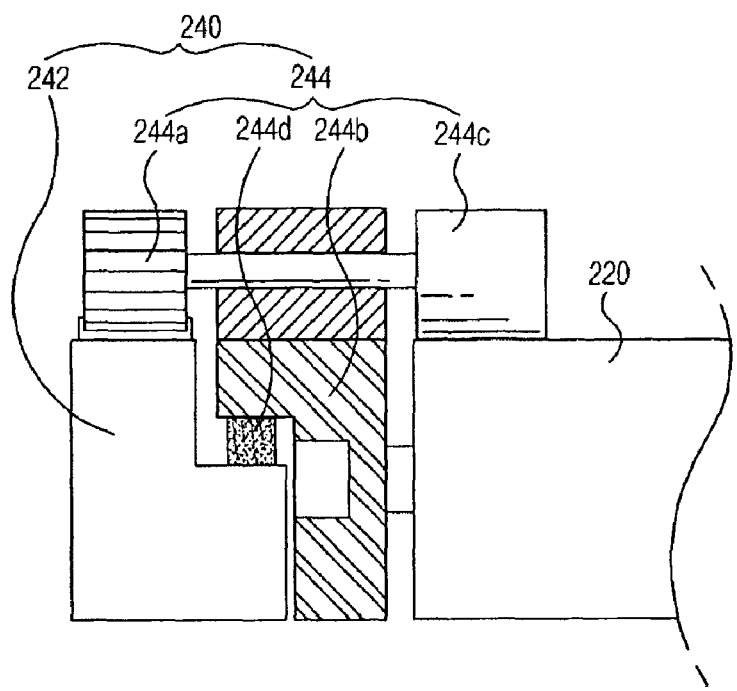
FIG. 12 is a sectional view illustrating a horizontal drive device in accordance with the second embodiment of the present invention.

Each of the horizontal movers 244 has the first end fixedly disposed on the upper cover movement frame 242 and a second end coupled to the upper cover 220. The horizontal mover 244 serves to horizontally move the upper cover 220 along the upper cover movement frame 242. Referring to FIG. 12, the horizontal mover 244 of the present embodiment includes: a roller 244a coupled to the upper cover movement frame 242 to perform a rotating movement thereon; a vertical connector 244b connected to both the roller 244a and the center of the upper cover 220 at different heights; and a motor 244c to provide power required to rotate the roller 244a. With this configuration, even when the roller 244a is disposed at a different height from the center of the upper cover 220, the roller 244a is stably coupled to the upper cover 220 by means of the vertical connector 244b, whereby smooth rotating and horizontal movements of the upper cover 220 can be accomplished.

The vacuum processing apparatus 200 according to the present embodiment may further comprise a supporting frame 270, which is disposed aside the chamber body 210 and is adapted to receive the upper cover 220 when the upper cover 220 is horizontally moved along the first horizontal frame pieces 242a. Providing the separate supporting frame 270 has an advantage in that a single supporting frame can be used for a plurality of vacuum chambers included in the vacuum processing apparatus. That is, instead of providing a plurality of vacuum chambers with supporting frames, respectively, a single movable supporting frame is commonly used for the plurality of vacuum chambers.

Figure 13:
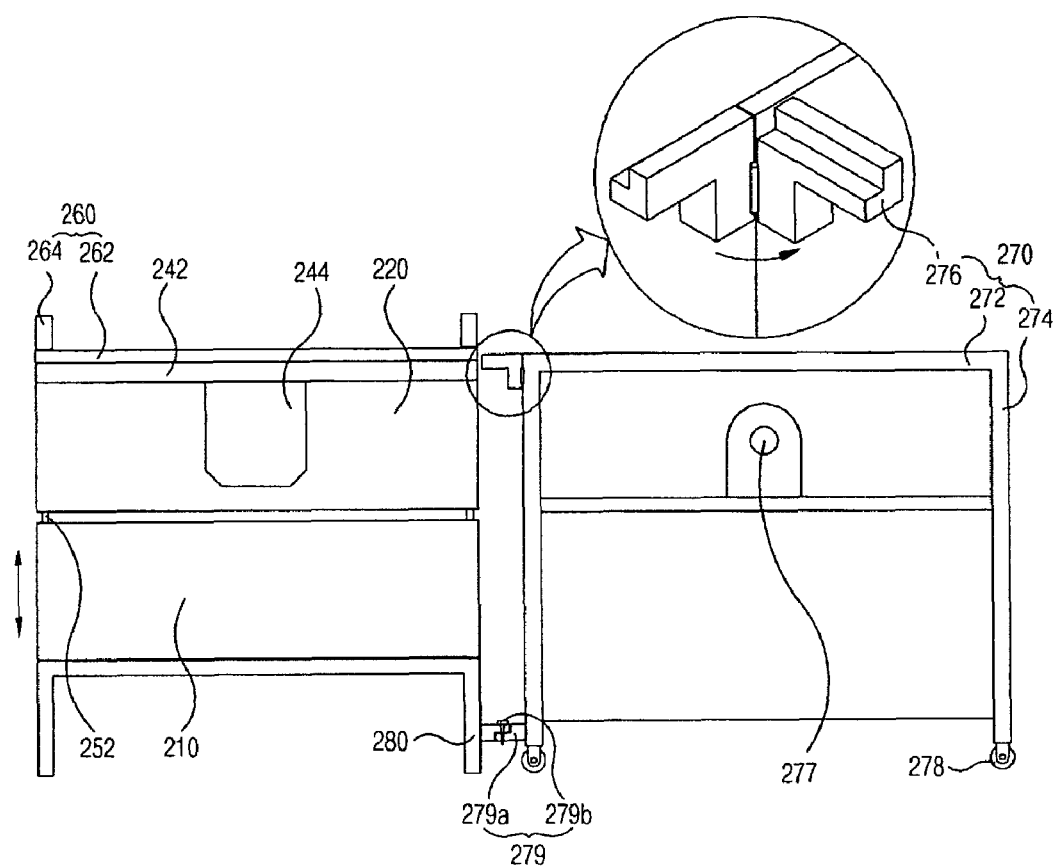
FIG. 13 is a side view illustrating a supporting frame in accordance with the second embodiment of the present invention.

Referring to FIG. 13, in the present embodiment, the supporting frame 270 includes: a second horizontal frame piece 272; second vertical frame pieces 274; and gap fillers 276. The second horizontal frame piece 272 has the same height as the first horizontal frame pieces 242a, and extends in the same direction as the first horizontal frame pieces 242a to guide the horizontal movement of the upper cover 220. The second vertical frame pieces 274 serve to support the second horizontal frame piece 272 at the same height as the first horizontal frame pieces 242a. Preferably, the second vertical frame pieces 274 are adapted to regulate the height of the second horizontal frame piece 272, to eliminate a height difference between the first and second horizontal frame pieces 242a and 272.

The gap fillers 276 are provided at an end of the second horizontal frame piece 272 facing the chamber. When the supporting frame 270 approaches the first horizontal frame pieces 242a, the gap fillers 276 are adapted to fill a gap between the first and second horizontal frame pieces 242a and 272. As is known, the second horizontal frame piece 272 has difficulty coming into close contact with the first horizontal frame pieces 242a due to various elements provided around the chamber and due to the configuration of the supporting frame itself. Accordingly, as shown in FIG. 13, the gap fillers 276 are separately provided to fill the gap between the first and second horizontal frame pieces 242a and 272. In the present embodiment, the gap fillers 276 are hinged to the second horizontal frame piece 272 in a pivotally rotatable manner, such that they are folded during transportation, but are pivotally rotated in use to fill the gap between the first and second horizontal frame pieces 242a and 272.

Preferably, each of the gap fillers 276 may be provided with a vertical drive unit to ensure a vertical movement thereof.

The supporting frame 270 according to the present embodiment preferably further includes wheels 278 for facilitating the movement thereof. The wheels 278 are mounted at lower ends of the second vertical frame pieces 274, respectively, such that they reduce a frictional force between the second vertical frame pieces 274 and the floor, to ensure easy horizontal movement of the second vertical frame pieces 274.

The supporting frame 270 according to the present embodiment may further include a pair of rotating members 277. The rotating members 277 serve to rotate the upper cover 220. In the present embodiment, the pair of rotating members 277 are mounted to the second horizontal frame piece 272 such that they are located at opposite sides of the upper cover 220. Specifically, the rotating members 277 are coupled to centers of opposite side walls of the upper cover 220 and are adapted to rotatably support the upper cover 220. Accordingly, when the upper cover 220 is moved by the horizontal drive device 240 to attain a sufficient rotating radius, the rotating members 277 rotate the upper cover 220, such that the upper cover 220 is opened upward to enable easy management and repair of interior equipment thereof.

Hereinafter, the opening/closing procedure of the upper cover 220 of the vacuum processing apparatus 200 according to the present embodiment will be explained.

Figure 14A:
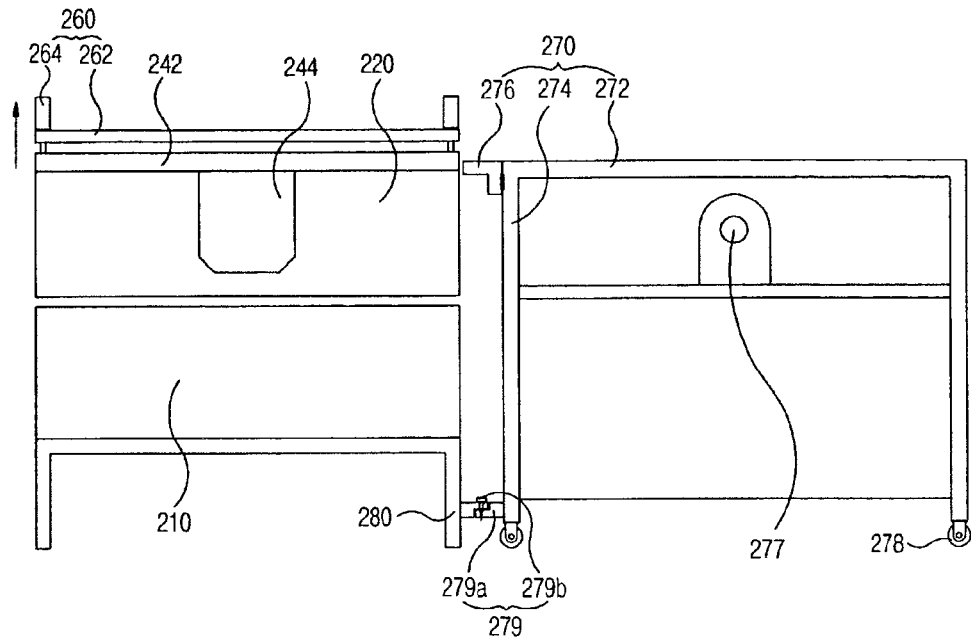
Figure 14B:
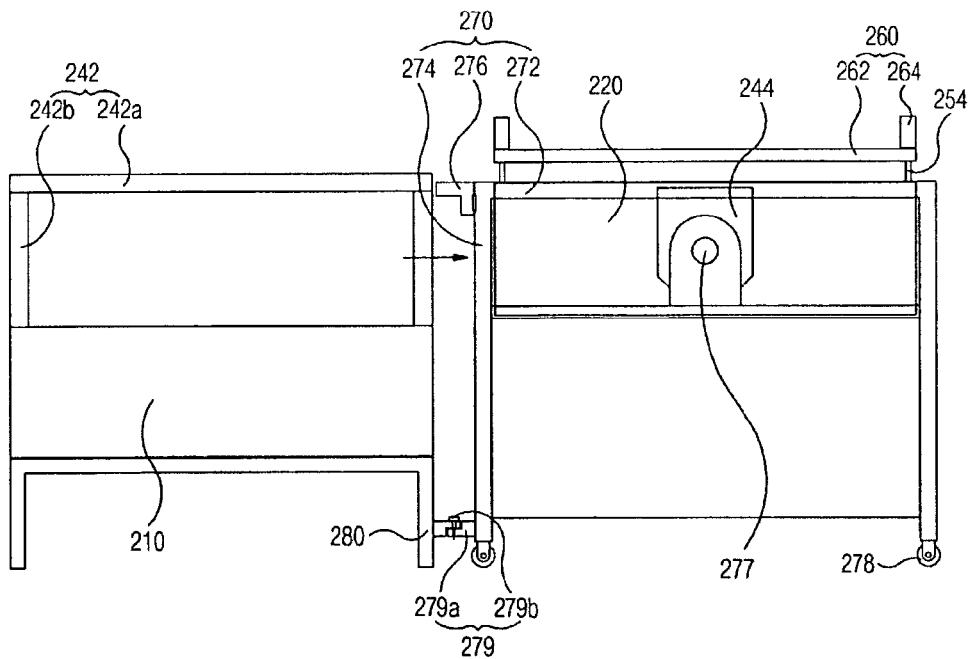

In the vacuum processing apparatus 200 according to the present embodiment, the upper cover 220 is supported such that it is spaced apart upward from the chamber body 210 by a distance of 1 mm to 10 mm, and therefore, there is no need for lifting the upper cover 220. Simply, as shown in FIG. 14A, the inner wall structure 250 is lifted in accordance with the operation of the associated lifting device 260. As the inner wall structure 250 is lifted, the airtight state of the chamber is destroyed, and therefore, a vacuum in the chamber is released. After that, as shown in FIG. 14B, the upper cover 220 is horizontally moved in accordance with the operation of the horizontal drive device 240. In this case, if the supporting frame 270 is used, the supporting frame 270 must be disposed to come into close contact with the first horizontal frame pieces 242a. After the upper cover 220 is horizontally moved to ensure a stable rotation thereof, as shown in FIG. 14C, the rotating members 277 are operated to rotate the upper cover 220 by 180°. In this way, the upper cover 220 is opened upward to enable the repair of equipment therein. After completing the repair of equipment, the above-described opening procedure of the upper cover 220 is performed in reverse order, to close the upper cover 220.

Third Embodiment

Figure 15:
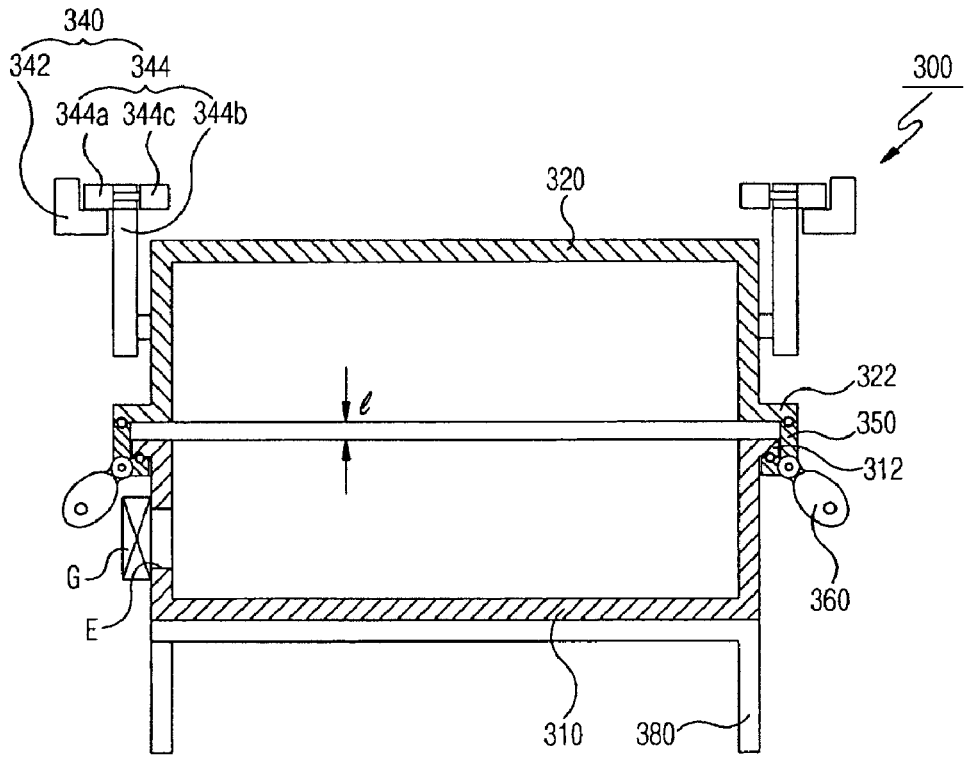
FIG. 15 is a sectional view illustrating a vacuum processing apparatus in accordance with a third embodiment of the present invention.

The vacuum processing apparatus according to the present embodiment comprises: a load lock chamber; a feeding chamber; and one or more process chambers, but the following description deals with only one process chamber for the convenience of explanation. Referring to FIG. 15, the vacuum processing apparatus 300 according to the present embodiment includes: a chamber body 310; an upper cover 320; a horizontal drive device 340; and a sealing device 350.

In the vacuum processing apparatus 300 according to the present embodiment, the chamber body 310 generally has a rectangular box shape and the upper cover 320 is separably disposed on the chamber body 310, to constitute a vacuum chamber. The vacuum chamber is used to process a large-area flat panel display substrate having a rectangular shape therein, and therefore, generally has a rectangular box shape corresponding to the rectangular substrate. The vacuum chamber is internally provided with an exhaust system (not shown) to create a vacuum in the chamber. After a vacuum is established in the chamber with the operation of the exhaust system, a desired process for the substrate disposed in the chamber is performed.

As shown in FIG. 15, the chamber body 310 is formed with a substrate entrance E, which serves as a passage to receive a substrate from an external station for loading the substrate or to discharge a substrate for unloading the substrate. Generally, a substrate is loaded or unloaded as it is horizontally moved in a lying state, and therefore, the substrate entrance E is perforated through one of side walls of the chamber body 310. To open and close the substrate entrance, the chamber body 310 is provided with a gate valve G. The substrate entrance E is continuously opened during loading and unloading of a substrate, but must be closed after the substrate is completely loaded, such that a desired process for the substrate is performed in a closed state of the chamber. Accordingly, the gate valve G is moved vertically to open and close the substrate entrance E.

The sealing device 350 serves to close a gap between the chamber body 310 and the upper cover 320, and to seal the rims of both the chamber body 310 and the upper cover 320. In the present embodiment, the upper cover 320 is spaced apart from the chamber body 310 by a predetermined distance, and therefore, it is necessary to seal the gap therebetween in order to create a vacuum in the vacuum chamber. The sealing devices 350 of the present embodiment allow the upper cover 320 to be separably coupled to the chamber body 310.

Specifically, the chamber body 310 is provided along an upper end surface thereof with an outwardly extending lower protrusion 312, and the upper cover 320 is provided along a lower end surface thereof with an outwardly extending upper protrusion 322. Here, the upper end surface of the chamber body 310 includes upper surfaces of the side walls of the chamber body 310, and the lower end surface of the upper cover 320 includes lower surfaces of the side walls of the upper cover 320.

The sealing device 350 has a lower contact surface 352 to come into close contact with the lower protrusion 312, and an upper contact surface 354 to come into close contact with the upper protrusion 322. To achieve a perfect contact and engagement between the lower contact surface 352 and the lower protrusion 312 and between the upper contact surface 354 and the upper protrusion 322, they are configured to have perfectly concordant shapes.

By the way, due to the fact that the side walls of the chamber are made of a relatively rigid material, such as metal, even if the upper and lower protrusions 322 and 312 and the upper and lower contact surfaces 354 and 352 are processed finely, there inevitably exist fine gaps therebetween. This makes it difficult to achieve a perfect airtight state in the chamber. To solve this problem, it is preferable that auxiliary seals O be formed at the lower and upper contact surfaces 352 and 354. In this case, the auxiliary seals O are made of a slightly flexible material. Accordingly, when the sealing device 350 comes into close contact with both the lower and upper protrusions 312 and 322, the auxiliary seals O are slightly constricted while being interposed between the lower and upper contact surfaces 352 and 354 and the lower and upper protrusions 312 and 322, thereby preventing the generation of gaps therebetween. In a specific case, to achieve an increased sealing efficiency, two or more auxiliary seals O may be laminated one above another. More preferably, to prevent the auxiliary seals O from shifting from their correct positions, it is preferable that the lower and upper contact surfaces 352 and 354 be formed with fixing grooves for the positioning and fixation of the auxiliary seals O.

Figure 18:
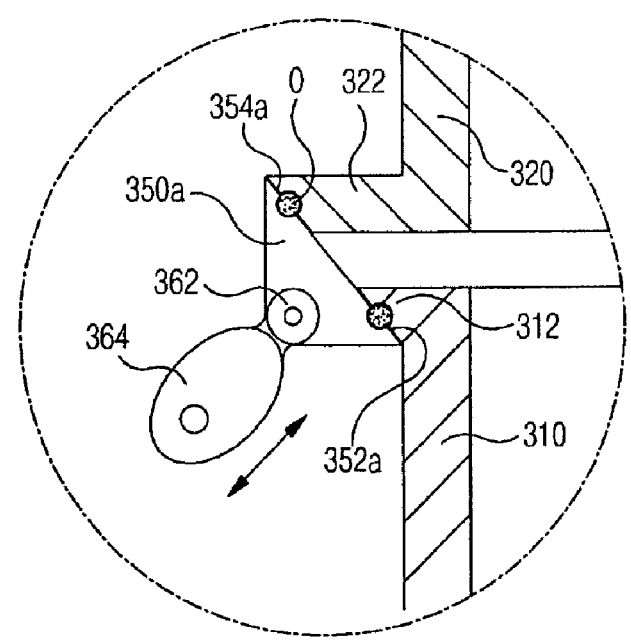
FIG. 18 is a sectional view of the sealing device in accordance with the third embodiment of the present invention.

Alternatively, as shown in FIG. 18, a sealing device 350a may have inclined lower and upper contact surfaces 352a and 354a, and both the corresponding lower and upper protrusions 312 and 322 of the chamber may have inclined surfaces. Using the inclined contact surfaces has the effect of increasing a contact area as compared to the above-described horizontal contact surfaces, resulting in an increase in sealing efficiency. Moreover, when providing the inclined contact surfaces with the auxiliary seals O, the contact area can be more expanded and a plurality of auxiliary seals can be easily arranged thereat.

Figure 16:
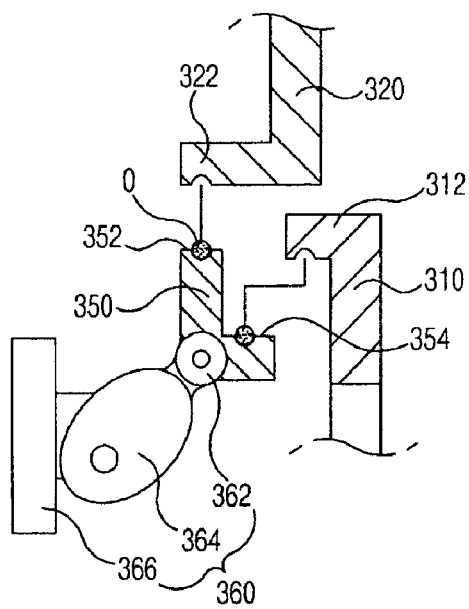
FIG. 16 is a side view illustrating a sealing device and a sealing device drive unit in accordance with the third embodiment of the present invention.

In the present embodiment, a plurality of sealing device drive units 360 are further provided to enable an automatic movement of the sealing device 350 in a diagonal direction. The plurality of sealing device drive units 360 are coupled to corners of a lower end of the sealing device 350. Here, the diagonal direction is a direction forming an angle of 45° with respect to a vertical direction, thus being inclined relative to the floor. Referring to FIG. 16, each of the sealing device drive units 360 of the present embodiment includes: a roller 362; and a cam 364. The roller 362 is located at one of lower corners of the sealing device 350 in a rotatable manner. The cam 364 is configured to rotate while coming into contact with the roller 362 and to move the sealing device 350 in a diagonal direction. Accordingly, the roller 362 is rotated as the cam 364 rotates while coming into contact with the roller 362, causing the sealing device 350 to move in a diagonal direction.

Preferably, the sealing device drive unit 360 further includes a cam rotation stopper 366 to restrict a rotating radius of the cam 364 and consequently, to restrict the diagonal movement range of the sealing device 350. In view of efficient operation, it is preferable that the sealing device 350 have a minimum movement sufficient to create and release a vacuum in the chamber, and therefore, the cam rotation stopper 366 is used to achieve the minimum movement range of the sealing device 350.

Figure 17:
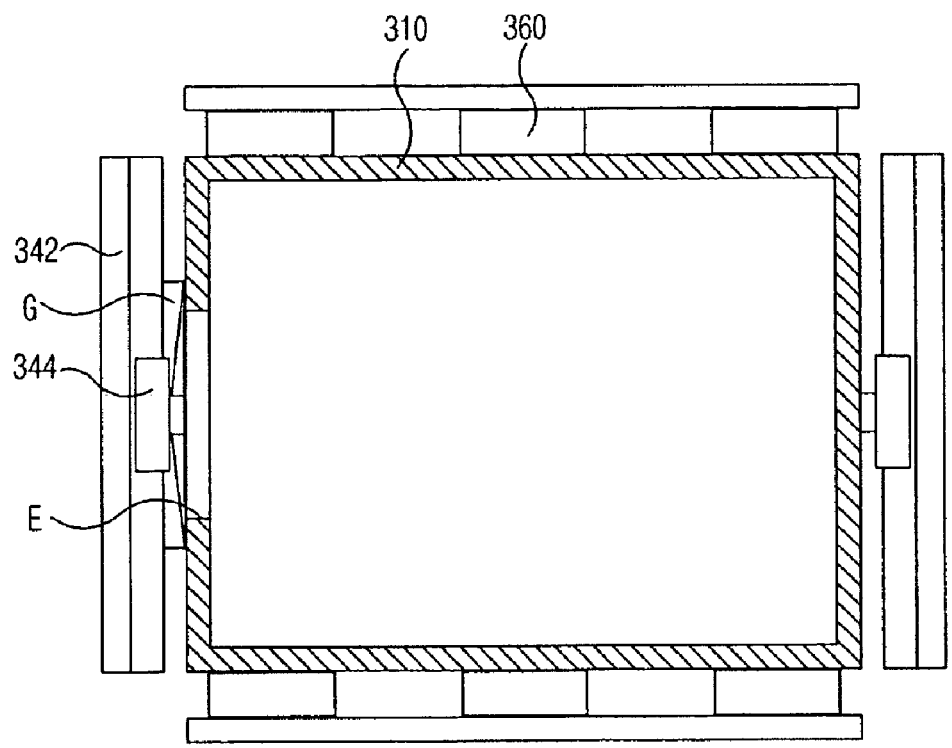
FIG. 17 is a plan view illustrating the arrangement of the sealing device drive unit and a horizontal drive device in accordance with the third embodiment of the present invention.

In the present embodiment, as shown in FIG. 17, preferably, the sealing device drive units 360 are arranged at opposite lateral sides of the chamber body 310 except for opposite sides of the chamber body 310 provided with the horizontal movers 344 of the horizontal drive device 340. If both the sealing device drive units 360 and the horizontal drive device 340 are provided at the same sides as each other, they suffer from an interference in operation of the sealing device drive units 360 and the horizontal drive device 340 and difficult installation thereof. Therefore, the sealing device drive units 360 must be arranged at the side walls of the chamber body 310 except for the side walls provided with the horizontal movers 344.

The horizontal drive device 340 serves to horizontally move the upper cover 320 in a direction perpendicular to the arrangement direction of the gate valve G. To minimize footprint occupied by the vacuum processing apparatus 300, the present embodiment proposes that the upper cover 320 is repaired in an unused space between the respective process chambers. For this, the upper cover 320 must be horizontally moved in a direction perpendicular to the arrangement direction of the gate valve G, and therefore, the horizontal drive device 340 is disposed at the same plane as the gate valve G. In this case, to prevent interference between the gate valve G and the horizontal drive unit 340 which are disposed at the same plane as each other, the horizontal drive device 340 is located higher than the gate valve G.

Accordingly, in the present embodiment, the horizontal drive device 340 includes: an upper cover movement frame 342; and a pair of horizontal movers 344. The upper cover movement frame 342 is partially disposed at opposite sides of the upper cover 320 at a position higher than a drive height of the gate valve G. The upper cover movement frame 342 provides a horizontal movement path of the upper cover 320.

The upper cover movement frame 342 includes: first horizontal frame pieces each to support a first end of one of the horizontal movers 344 at an upper surface thereof; and first vertical frame pieces coupled to lower surfaces of the first horizontal frame pieces to support the first horizontal frame pieces at a predetermined height. In the present embodiment, to allow the completely assembled upper cover movement frame 342 to be mounted to the vacuum chamber, the first horizontal frame pieces are disposed at a position higher than an upper end of the upper cover 320. Also, the first vertical frame pieces are arranged such that adjacent ones of them are spaced apart from each other by a distance wider than a width of the vacuum processing apparatus.

Each of the horizontal movers 344 has the first end fixedly disposed on the upper cover movement frame 342 and a second end coupled to the upper cover 320. The horizontal mover 344 serves to horizontally move the upper cover 320 along the upper cover movement frame 342. The horizontal mover 344 of the present embodiment includes: a roller 344a coupled to the upper cover movement frame 342 to perform a rotating movement thereon; a vertical connector 344b connected to both the roller 344a and the center of the upper cover 320 at different heights; and a motor 344c to provide power required to rotate the roller 344a. With this configuration, even when the roller 344a is disposed at a different height from the center of the upper cover 320, the roller 344a is stably coupled to the upper cover 320 by means of the vertical connector 344b, whereby smooth rotating and horizontal movements of the upper cover 320 can be accomplished.

The vacuum processing apparatus 300 according to the present embodiment may further comprise a supporting frame 370, which is disposed aside the chamber body 310 and is adapted to receive the upper cover 320 when the upper cover 320 is horizontally moved along the first horizontal frame pieces of the upper cover movement frame 342. Providing the separate supporting frame 370 has an advantage in that a single supporting frame can be used for a plurality of vacuum chambers included in the vacuum processing apparatus. That is, instead of providing a plurality of vacuum chambers with supporting frames, respectively, a single movable supporting frame is commonly used for the plurality of vacuum chambers.

Figure 19:
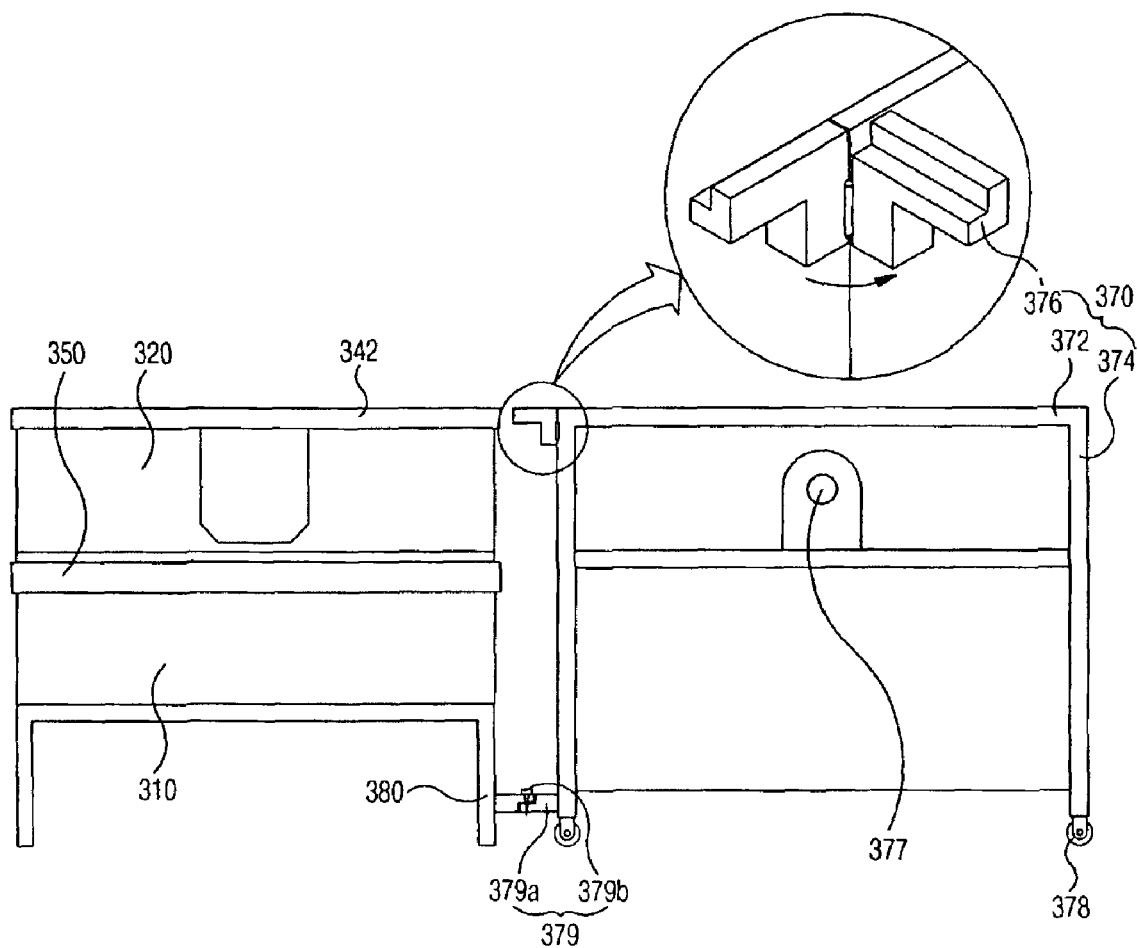
FIG. 19 is a side view illustrating a supporting frame in accordance with the third embodiment of the present invention.

Referring to FIG. 19, in the present embodiment, the supporting frame 370 includes: a second horizontal frame piece 372; second vertical frame pieces 374; and gap fillers 376. The second horizontal frame piece 372 has the same height as the first horizontal frame pieces of the upper cover movement frame 342, and extends in the same direction as the first horizontal frame pieces to guide the horizontal movement of the upper cover 320. The second vertical frame pieces 374 serve to support the second horizontal frame piece 372 at the same height as the first horizontal frame pieces. Preferably, the vertical frame pieces 374 are adapted to regulate the height of the second horizontal frame piece 372, to eliminate a height difference between the first and second horizontal frame pieces.

The gap fillers 376 are provided at an end of the second horizontal frame piece 372 facing the chamber. When the supporting frame 370 approaches the first horizontal frame pieces, the gap fillers 376 are adapted to fill a gap between the first and second horizontal frame pieces. As is known, the second horizontal frame piece 372 has difficulty coming into close contact with the first horizontal frame pieces due to various elements provided around the chamber and due to the configuration of the supporting frame itself. Accordingly, as shown in FIG. 19, the gap fillers 376 are separately provided to fill the gap between the first and second horizontal frame pieces. In the present embodiment, the gap fillers 376 are hinged to the second horizontal frame piece 372 in a pivotally rotatable manner, such that they are folded during transportation, but are pivotally rotated in use to fill the gap between the first horizontal frame pieces and the second horizontal frame piece 372.

Preferably, each of the gap fillers 376 may be provided with a vertical drive unit to ensure a vertical movement thereof.

The supporting frame 370 according to the present embodiment preferably further includes wheels 378 for facilitating the movement thereof. The wheels 378 are mounted at lower ends of the second vertical frame pieces 374, respectively, such that they reduce a frictional force between the second vertical frame pieces 374 and the floor, to ensure easy horizontal movement of the second vertical frame pieces 374.

The supporting frame 370 according to the present embodiment may further include a pair of rotating members 377. The rotating members 377 serve to rotate the upper cover 320. In the present embodiment, the pair of rotating members 377 are mounted to the second horizontal frame piece 372 such that they are located at opposite sides of the upper cover 320. The rotating members 377 are coupled to centers of opposite side walls of the upper cover 320 and are adapted to rotatably support the upper cover 320. Accordingly, when the upper cover 320 is moved by the horizontal drive device 340 to attain a sufficient rotating radius, the rotating members 377 rotate the upper cover 320, such that the upper cover 320 is opened upward to enable easy management and repair of interior equipment thereof.

Preferably, the supporting frame 370 further includes one or more fixing units 379 to fix the supporting frame 370 to the chamber body 310. The fixing units 379 serve to prevent the supporting frame 370 from moving away from the chamber body 310 during the horizontal movement and rotation of the upper cover 320. In the present embodiment, each of the fixing units 379 includes a pair of fixing blocks 379a and a fixing pin 379b. Accordingly, if the pair of fixing blocks 379 are accurately aligned to each other, the fixing pin 379b is inserted through the fixing blocks 379a to maintain the supporting frame 370 in a fixed position.

Hereinafter, the opening/closing procedure of the upper cover 320 of the vacuum processing apparatus 300 according to the present embodiment will be explained.

Figure 20A:
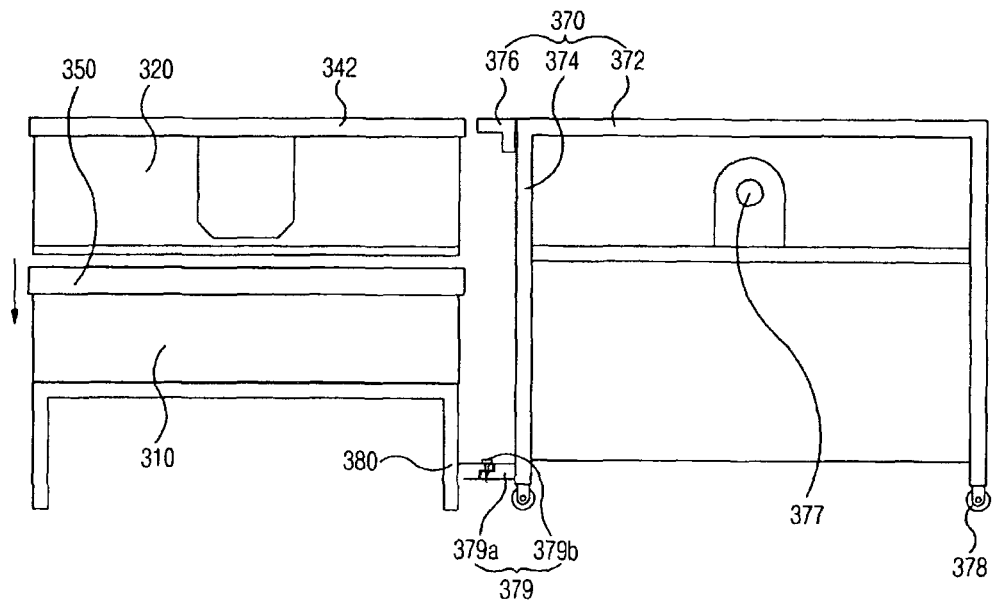
FIGS. 20A to 20C are views illustrating the opening procedure of an upper cover included in the vacuum processing apparatus in accordance with the third embodiment of the present invention.
Figure 20B:
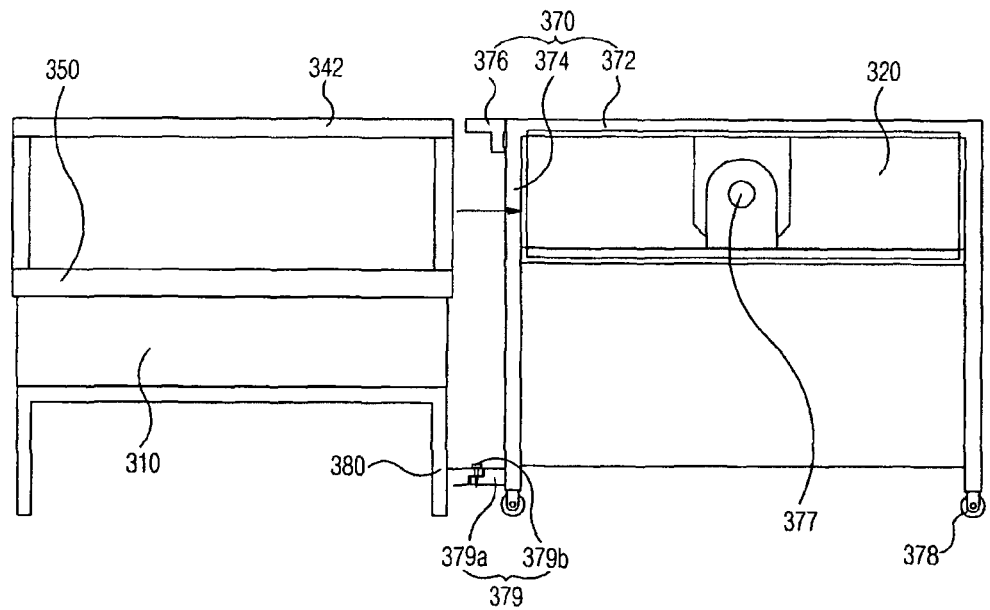
Figure 20C:
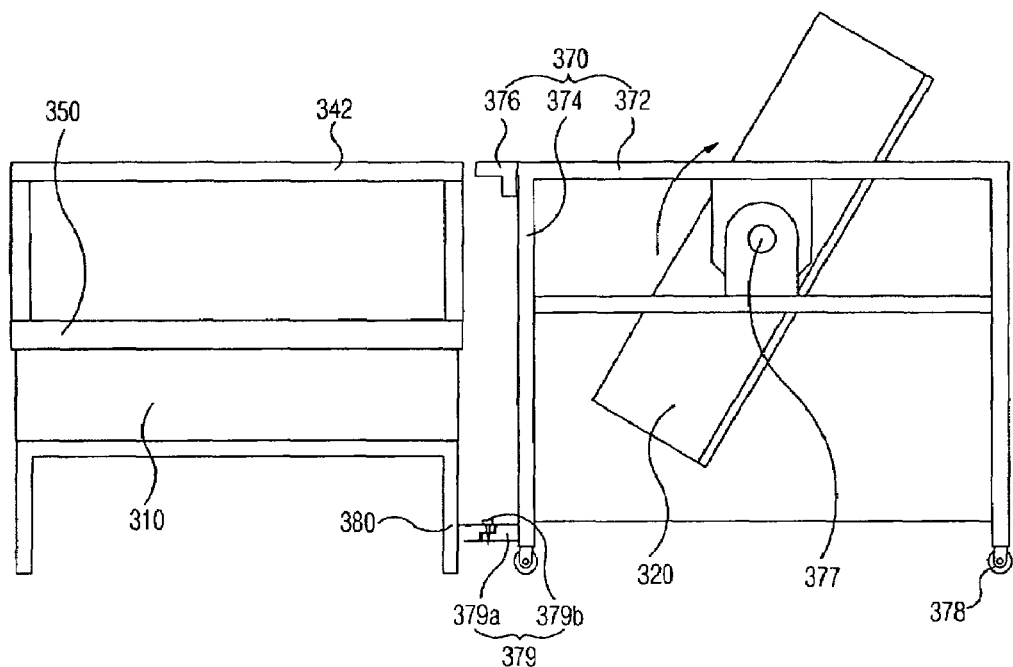

In the vacuum processing apparatus 300 according to the present embodiment, the upper cover 320 is supported such that it is spaced apart upward from the chamber body 310 by a distance of 10 mm to 15 mm, and therefore, there is no need for lifting the upper cover 320. Simply, as shown in FIG. 20A, the sealing device drive units 360 are driven to move the sealing device 350 in a diagonal direction, thereby causing the upper cover 320 from being spaced apart from the chamber body 310. As the upper cover 320 is moved, the airtight state of the chamber is destroyed, and therefore, a vacuum in the chamber is released. After that, as shown in FIG. 20B, the upper cover 320 is horizontally moved in accordance with the operation of the horizontal drive device 340. In this case, when using the supporting frame 370, the supporting frame 370 must be disposed to come into close contact with the first horizontal frame pieces. After the upper cover 320 is horizontally moved to ensure a stable rotation thereof, as shown in FIG. 20C, the rotating members 377 are operated to rotate the upper cover 320 by 180°. In this way, the upper cover 320 is opened upward to enable the repair of equipment therein. After completing the repair of equipment, the above-described opening procedure of the upper cover 320 is performed in reverse order, to close the upper cover 220.

Fourth Embodiment

Figure 21:
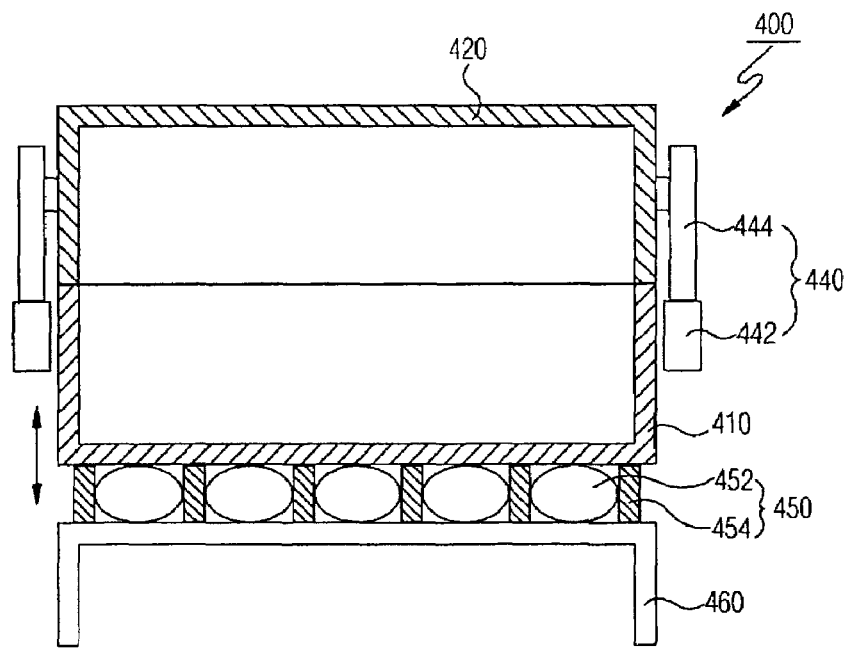
FIG. 21 is a sectional view illustrating a vacuum processing apparatus in accordance with a fourth embodiment of the present invention.

The vacuum processing apparatus according to the present embodiment comprises: a load lock chamber; a feeding chamber; and one or more process chambers, but the following description deals with only one process chamber for the convenience of explanation. Referring to FIG. 21, the vacuum processing apparatus 400 according to the present embodiment includes: a chamber body 410; an upper cover 420; a horizontal drive device 440; and a chamber body lifting device 450.

In the vacuum processing apparatus 400 according to the present embodiment, the chamber body 410 generally has a rectangular box shape and the upper cover 420 is separably disposed on the chamber body 410, to constitute a vacuum chamber. The vacuum chamber is used to process a large-area flat panel display substrate having a rectangular shape therein, and therefore, generally has a rectangular box shape corresponding to the rectangular substrate. The vacuum chamber is internally provided with an exhaust system (not shown) to create a vacuum in the chamber. After a vacuum is established in the chamber with the operation of the exhaust system, a desired process for the substrate disposed in the chamber is performed.

The chamber body 410 is formed with a substrate entrance, which serves as a passage to receive a substrate from an external station for loading the substrate or to discharge a substrate for unloading the substrate. Generally, a substrate is loaded or unloaded as it is horizontally moved in a lying state, and therefore, the substrate entrance is perforated through one of side walls of the chamber body 410. To open and close the substrate entrance, the chamber body 410 is provided with a gate valve. The substrate entrance is continuously opened during loading and unloading of a substrate, but must be closed after the substrate is completely loaded, such that a desired process for the substrate is performed in a closed state of the chamber. Accordingly, the substrate entrance is opened and closed as the gate valve is moved vertically.

The chamber body lifting device 450 serves to vertically move the chamber body 410. In the present embodiment, the chamber body lifting device 450 includes: a plurality of lifting drive members 452; and a guide member 454.

The lifting drive members 452 are interposed between the chamber body 410 and a chamber base frame 460, which supports the chamber body 410 at a predetermined height from the floor. The lifting drive members 452 are adapted to vertically move the chamber body 410. Vertically moving the chamber body 410 has the effect of preventing the chamber body 410 from interfering with the horizontal movement of the upper cover 420 as it contacts with a lower end of the upper cover 420 and also preventing interference between the upper cover 420 and an O-ring. In a state wherein the upper cover 420 is fixed at a predetermined height, the chamber body 410 is lowered to be spaced apart from the upper cover 420 by a predetermined distance.

Figure 22:
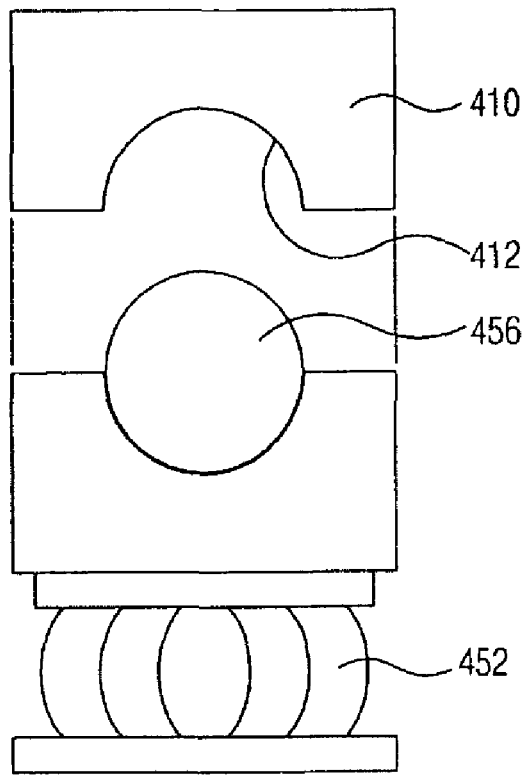
FIG. 22 is a side view illustrating a chamber body lifting device in accordance with the fourth embodiment of the present invention.

The present embodiment employs the plurality of lifting drive members 452 each having a small capacity. Using the plurality of small-capacity lifting drive members 452 is advantageous as compared to using a single large-capacity lifting drive member in view of price. Also, the plurality of lifting drive members 452 can support a heavy chamber body at a plurality of positions, and therefore, are advantageous in maintaining the balance of the chamber body. Each of the lifting drive members 452 preferably takes the form of a bellows cylinder. In this case, as shown in FIG. 22, the bellows cylinders are preferably provided with eccentricity compensators 456, respectively. Specifically, the eccentricity compensators 456, each having a semispherical shape, are formed at upper ends of the bellows cylinders 452, respectively. In this case, the chamber body 410 is formed with eccentricity compensator insertion recesses 412 at positions of a lower surface thereof corresponding to the center of the respective bellows cylinders 452. With this configuration, when the bellows cylinders 452 come into contact with the lower surface of the chamber body 410 to vertically move the chamber body 410, the eccentricity compensators 456 slide into the insertion recesses 412 while being lifted, to smoothly find accurate contact positions.

The guide member 454 is coupled to the chamber body 410 and is adapted to guide vertical movements of the chamber body 410. Referring to FIG. 21, in the present embodiment, the guide member 454 preferably takes the form of a guide block unit coupled at a lower surface thereof to an upper surface of the chamber base frame 460 and inserted at an upper surface thereof into a guide groove formed at the lower surface of the chamber body 410. Providing the guide block unit, serving as the guide member, at the lower surface of the chamber body has the effect of guiding an accurate vertical movement direction of the chamber body without requiring a separate installation space for the guide member.

Alternatively, the guide member may take the form of guide columns, which are located aside the chamber body 410 and coupled to the side walls of the chamber body 410 to guide a vertical movement direction of the chamber body 410.

The horizontal drive device 440 serves to horizontally move the upper cover 220 in a direction facing the arrangement direction of the gate valve. For this, the horizontal drive device 440 is coupled to the upper cover 420 so as to support the upper cover 420 in a horizontally movable manner. When the chamber body 410 is moved downward by a predetermined distance in accordance with the operation of the chamber body lifting device 450, and thus, is separated from the upper cover 420, the horizontal drive device 440 horizontally moves the upper cover 420 until the upper cover 420 attains a desired rotating radius.

Figure 23:
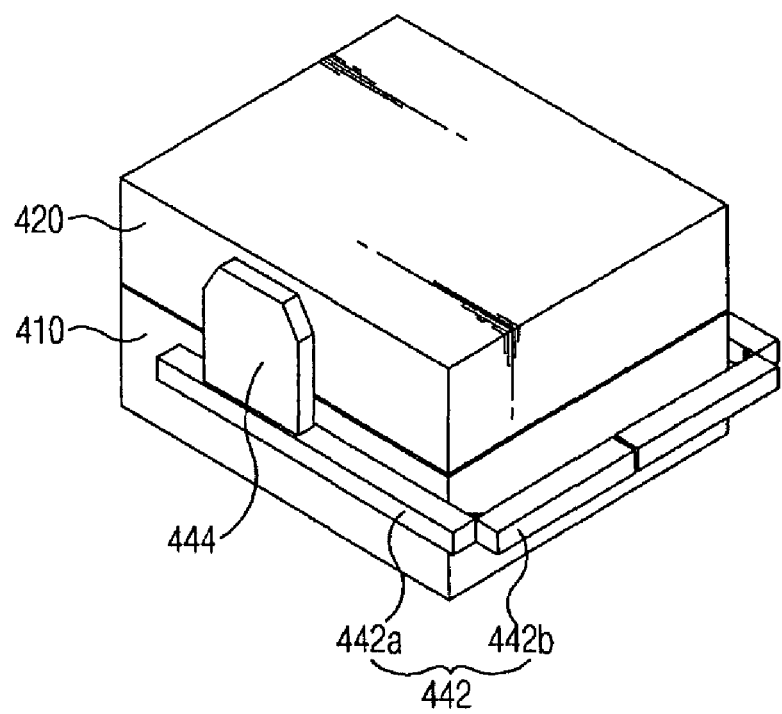
FIG. 23 is a perspective view of the vacuum processing apparatus in accordance with the fourth embodiment of the present invention.

In the present embodiment, the horizontal drive device 440 includes a pair of guide rails 442, which are horizontally arranged parallel to each other such that the upper cover 420 is located therebetween. The guide rails 442 serve to guide the upper cover 420 in a horizontal direction, and thus, provides a horizontal movement path of the upper cover 420. Referring to FIG. 23, each of the guide rails 442 is divided into a first portion 442a facing the upper cover 420 and a second portion 442b horizontally extending beyond the upper cover 420. Preferably, the second portion 442b is foldable toward the side wall of the upper cover 420 perpendicular to the first portion 442a, such that it is folded when not in use, to minimize an area occupied by the vacuum processing apparatus.

The vacuum processing apparatus 400 according to the present embodiment may further comprise a supporting frame 470, which is disposed aside the chamber body 410 and is adapted to receive the upper cover 420 when the upper cover 420 is horizontally moved along the guide rails 442. Providing the separate supporting frame 470 has an advantage in that a single supporting frame can be used for a plurality of vacuum chambers included in the vacuum processing apparatus. That is, instead of providing a plurality of vacuum chambers with supporting frames, respectively, a movable supporting frame is commonly used for the plurality of vacuum chambers.

Figure 24:
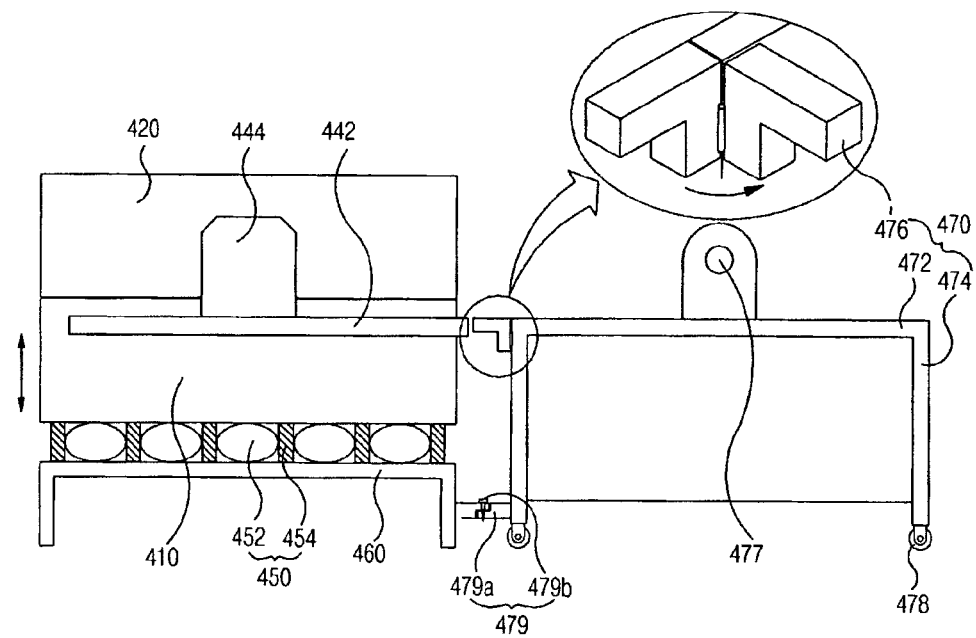
FIG. 24 is a side view illustrating a supporting frame in accordance with the fourth embodiment of the present invention.

Referring to FIG. 24, in the present embodiment, the supporting frame 470 includes: a horizontal frame piece 472; vertical frame pieces 474; and gap fillers 476. The horizontal frame piece 472 has the same height as the guide rails 442, and extends in the same direction as the guide rails 442 to guide the horizontal movement of the upper cover 420. The vertical frame pieces 474 serve to support the horizontal frame piece 472 at the same height as the guide rails 442. Preferably, the vertical frame pieces 474 are adapted to regulate the height of the horizontal frame pieces 472, to eliminate a height difference between the horizontal frame piece 472 and the guide rails 442.

The gap fillers 476 are provided at an end of the horizontal frame piece 472 facing the chamber. When the supporting frame 470 approaches the guide rails 442, the gap fillers 476 are adapted to fill a gap between the horizontal frame piece 472 and the guide rails 442. As is known, the horizontal frame piece 472 has difficulty coming into close contact with the guide rails 442 due to various elements provided around the chamber and due to the configuration of the supporting frame itself. Accordingly, as shown in FIG. 24, the gap fillers 476 are separately provided to fill the gap between the horizontal frame piece 472 and the guide rails 442. In the present embodiment, the gap fillers 476 are hinged to the horizontal frame piece 472 in a pivotally rotatable manner, such that they are folded during transportation, but are pivotally rotated in use to fill the gap between the horizontal frame piece 472 and the guide rails 442.

Preferably, each of the gap fillers 476 may be provided with a vertical drive unit to ensure a vertical movement thereof. Although not shown, the vertical drive unit preferably takes the form of a ball screw to achieve an accurate vertical movement of the gap filler 476.

The supporting frame 470 according to the present embodiment preferably further includes wheels 478 for facilitating the movement thereof. The wheels 478 are mounted at lower ends of the vertical frame pieces 474, respectively, such that they reduce a frictional force between the vertical frame pieces 474 and the floor, to ensure easy horizontal movement of the vertical frame pieces 474.

The supporting frame 470 according to the present embodiment may further include a pair of rotating members 477. The rotating units 477 serve to rotate the upper cover 420. In the present embodiment, the pair of rotating members 477 are mounted to the horizontal frame piece 472 such that they are located at opposite sides of the upper cover 420. The rotating members 477 are coupled to centers of opposite side walls of the upper cover 420 and are adapted to rotatably support the upper cover 420. Accordingly, when the upper cover 420 is moved by the horizontal drive device 440 to attain a sufficient rotating radius, the rotating members 477 rotate the upper cover 420, such that the upper cover 420 is opened upward to enable easy management and repair of interior equipment thereof.

Preferably, the supporting frame 470 further includes one or more fixing units 479 to fix the supporting frame 470 to the chamber body 410. The fixing units 479 serve to prevent the supporting frame 470 from moving away from the chamber body 410 during the horizontal movement and rotation of the upper cover 420. In the present embodiment, each of the fixing units 479 includes a pair of fixing blocks 479a and a fixing pin 479b. Accordingly, if the pair of fixing blocks 479 are accurately aligned to each other, the fixing pin 479b is inserted through the fixing blocks 479a to maintain the supporting frame 470 in a fixed position.

Hereinafter, the opening/closing procedure of the upper cover 420 of the vacuum processing apparatus 400 according to the present embodiment will be explained.

Figure 25A:
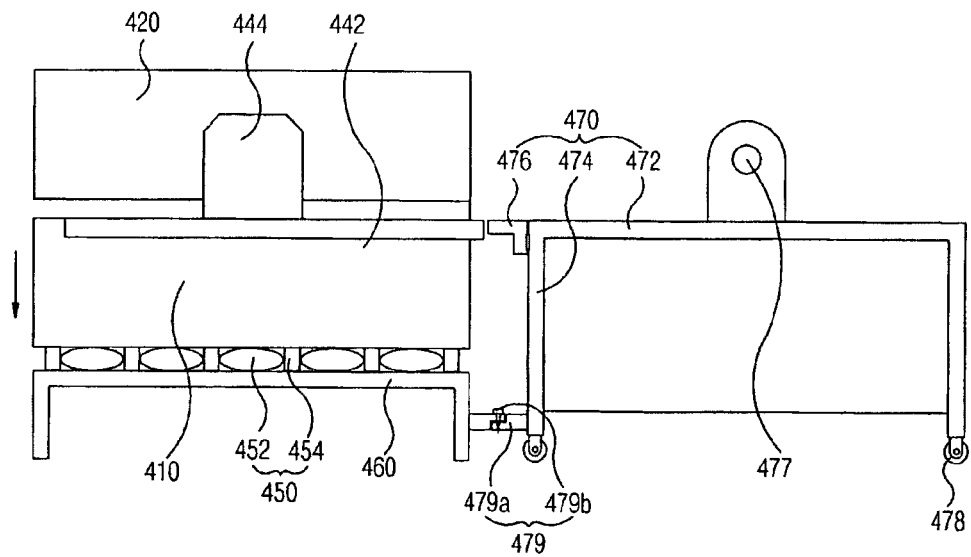
FIGS. 25A to 25C are views illustrating the opening procedure of an upper cover included in the vacuum processing apparatus in accordance with the fourth embodiment of the present invention.
Figure 25B:
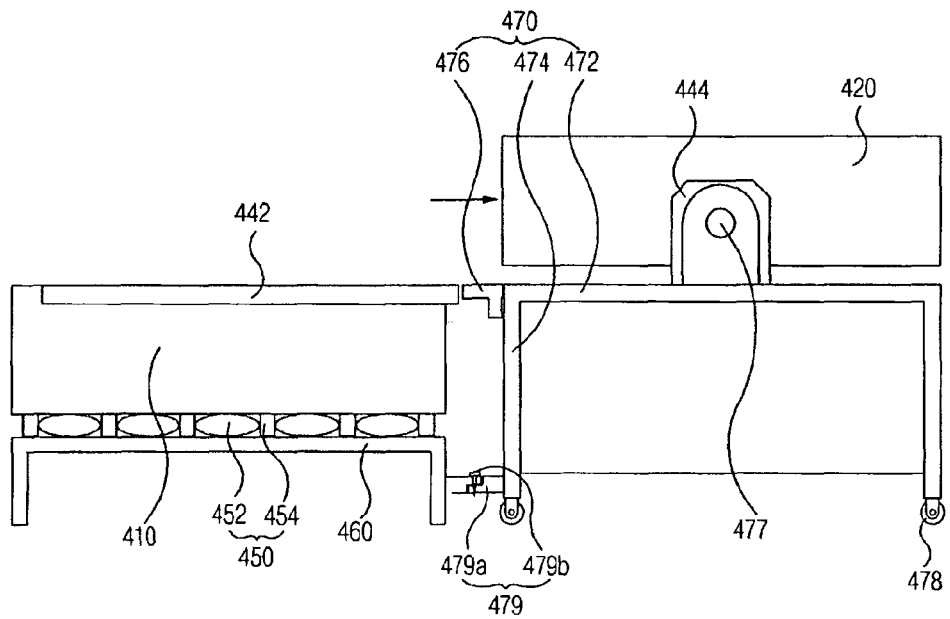
Figure 25C:
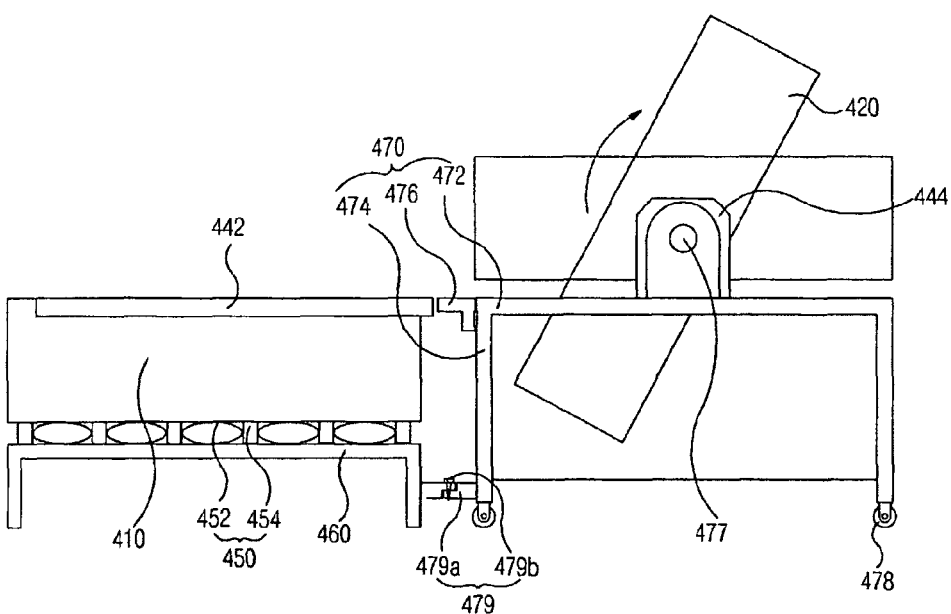

First, as shown in FIG. 25A, the chamber body 410 is lowered by a distance of 10 mm to 15 mm by use of the chamber body lifting device 450, to prevent interference between the upper cover 420 and the chamber body 410. Then, as shown in FIG. 25B, the upper cover 420 is horizontally moved in accordance with the operation of the horizontal drive device 440. In this case, when using the supporting frame 470, the supporting frame 470 must be disposed to come into close contact with the guide rails 442. Also, when using only the guide rails 442, the second portions 442b of the guide rails 442 are unfolded to attain a stable rotating radius of the upper cover 420. After the upper cover 420 is horizontally moved to ensure a stable rotation thereof, as shown in FIG. 25C, the rotating members 477 are operated to rotate the upper cover 420 by 180°. In this way, the upper cover 420 is opened upward to enable the repair of equipment therein. After completing the repair of equipment, the above-described opening procedure of the upper cover 420 is performed in reverse order, to close the upper cover 120.

Fifth Embodiment

Figure 26:
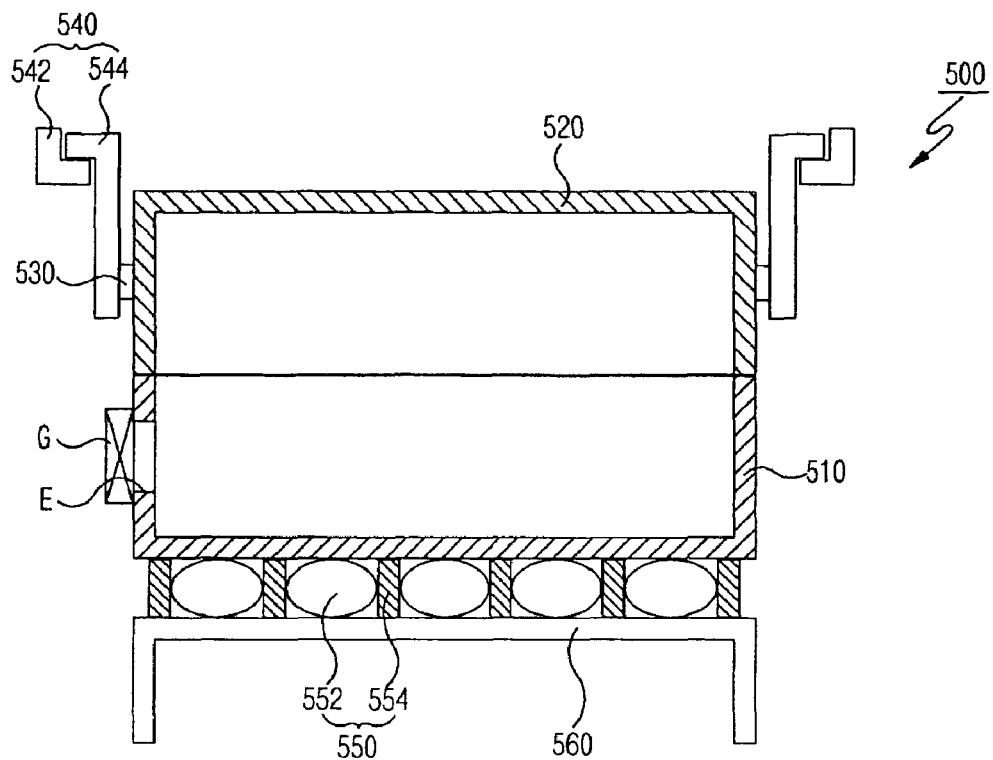
FIG. 26 is a sectional view illustrating a vacuum processing apparatus in accordance with a fifth embodiment of the present invention.

The vacuum processing apparatus according to the present embodiment comprises: a load lock chamber; a feeding chamber; and one or more process chambers, and the following description deals with only one process chamber for the convenience of explanation. Referring to FIG. 26, the vacuum processing apparatus 500 according to the present embodiment includes: a chamber body 510; an upper cover 520; a horizontal drive device 540; a substrate entrance E; a gate valve G; and a chamber body lifting device 550.

In the vacuum processing apparatus 500 according to the present embodiment, the chamber body 510 generally has a rectangular box shape and the upper cover 520 is separably disposed on the chamber body 510, to constitute a vacuum chamber. The vacuum chamber is used to process a large-area flat panel display substrate having a rectangular shape therein, and therefore, generally has a rectangular box shape corresponding to the rectangular substrate. The vacuum chamber is internally provided with an exhaust system (not shown) to create a vacuum in the chamber. After a vacuum is established in the chamber with the operation of the exhaust system, a desired process for the substrate disposed in the chamber is performed.

The chamber body 510 is formed with a substrate entrance E, which serves as a passage to receive a substrate from an external station for loading the substrate or to discharge a substrate for unloading the substrate. Generally, a substrate is loaded or unloaded as it is horizontally moved in a lying state, and therefore, the substrate entrance E is perforated through one of side walls of the chamber body 510. To open and close the substrate entrance E, the chamber body 510 is provided with a gate valve G. The substrate entrance E is continuously opened during loading and unloading of a substrate, but must be closed after the substrate is completely loaded, such that a desired process for the substrate is performed in a closed state of the chamber. Accordingly, the gate valve G is moved vertically to open and close the substrate entrance E.

The horizontal drive device 540 serves to horizontally move the upper cover 520 in a direction perpendicular to the arrangement direction of the gate valve G. To minimize footprint occupied by the vacuum processing apparatus 500, the present embodiment proposes that the upper cover 520 is repaired in an unused space between the respective process chambers. For this, the upper cover 520 must be horizontally moved in a direction perpendicular to the arrangement direction of the gate valve G, and therefore, the horizontal drive device 540 is disposed at the same plane as the gate valve G. In this case, to prevent interference between the gate valve G and the horizontal drive unit 540 which are disposed at the same plane as each other, the horizontal drive device 540 is located higher than the gate valve G.

Figure 29:
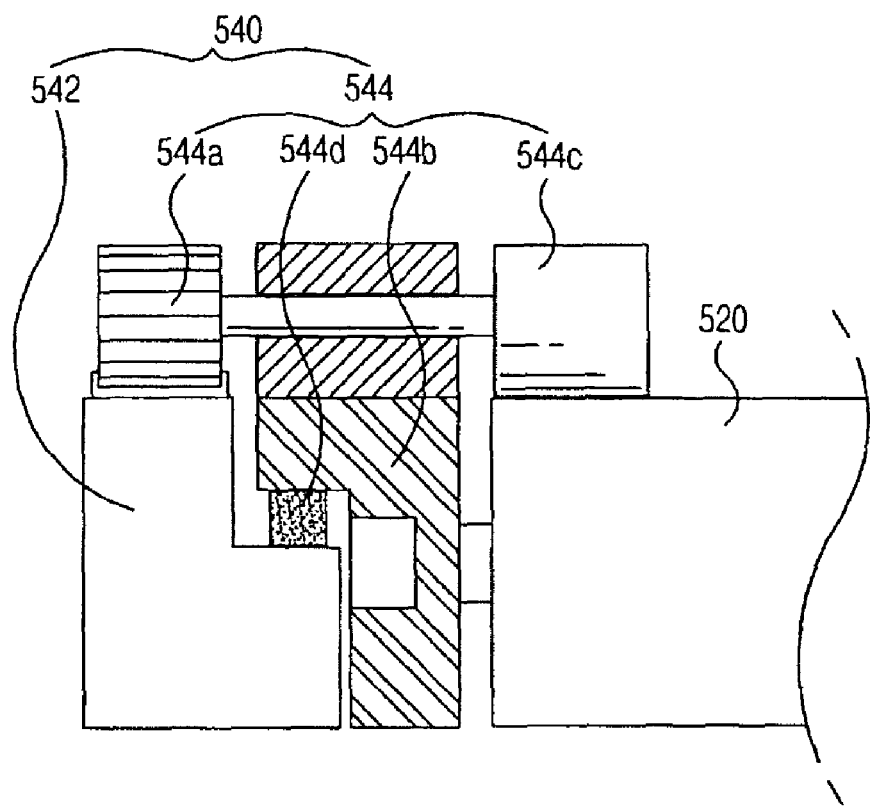
FIG. 29 is a sectional view illustrating a horizontal drive device in accordance with the fifth embodiment of the present invention.

Referring to FIG. 29, the horizontal drive device 540 of the present embodiment includes: an upper cover movement frame 542; and a pair of horizontal movers 544. The upper cover movement frame 542 is partially disposed at opposite sides of the upper cover 520 at a position higher than a drive height of the gate valve G. The upper cover movement frame 542 provides a horizontal movement path of the upper cover 520.

Figure 28:
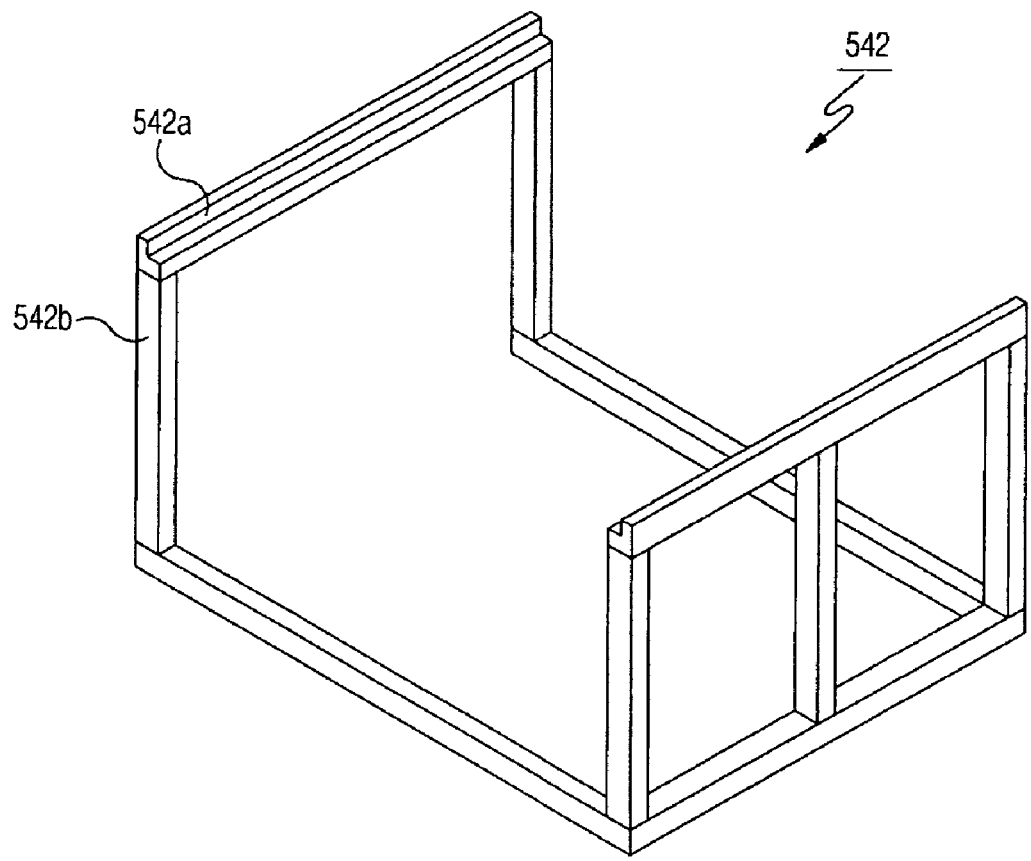
FIG. 28 is a perspective view illustrating an upper cover movement frame in accordance with the fifth embodiment of the present invention.

Referring to FIG. 28, the upper cover movement frame 542 includes: first horizontal frame pieces 542a each to support a first end of one of the horizontal movers 544 at an upper surface thereof; and first vertical frame pieces 542b coupled to lower surfaces of the first horizontal frame pieces 542a to support the first horizontal frame pieces 542a at a predetermined height. In the present embodiment, to allow the completely assembled upper cover movement frame 542 to be mounted to the vacuum chamber, the first horizontal frame pieces 542a are disposed at a height higher than an upper end of the upper cover 520. Also, the first vertical frame pieces 542b are arranged such that adjacent ones are spaced apart from each other by a distance wider than a width of the vacuum processing apparatus. Preferably, horizontal gears are formed at the upper surface of each of the first horizontal frame pieces 542a such that the gears are engaged with rollers 544a to guide an accurate horizontal movement of the upper cover 520.

Each of the horizontal movers 544 has the first end fixedly disposed on the upper cover movement frame 542 and a second end coupled to the upper cover 520. The horizontal mover 544 serves to horizontally move the upper cover 520 along the upper cover movement frame 542. The horizontal mover 544 of the present embodiment includes: a roller 544a coupled to the upper cover movement frame 542 to perform a rotating movement thereon; a vertical connector 544b connected to both the roller 544a and the center of the upper cover 520 at different heights; and a motor 544c to provide power required to rotate the roller 544a. With this configuration, even when the roller 544a is disposed at a different height from the center of the upper cover 520, the roller 544a is stably coupled to the upper cover 520 by means of the vertical connector 544b, whereby smooth rotating and horizontal movements of the upper cover 520 can be accomplished. Also, a roller 544d is interposed between each of the first horizontal frame piece 542a and the associated connector 544b to reduce load and frictional force during the movement of the upper cover.

The vacuum processing apparatus 500 according to the present embodiment may further comprise a supporting frame 570, which is disposed aside the chamber body 510 and is adapted to receive the upper cover 520 when the upper cover 520 is horizontally moved along the first horizontal frame pieces 542a. Providing the separate supporting frame 570 has an advantage in that a single supporting frame can be used for a plurality of vacuum chambers included in the vacuum processing apparatus. That is, instead of providing a plurality of vacuum chambers with supporting frames, respectively, a single movable supporting frame is commonly used for the plurality of vacuum chambers.

Figure 30:
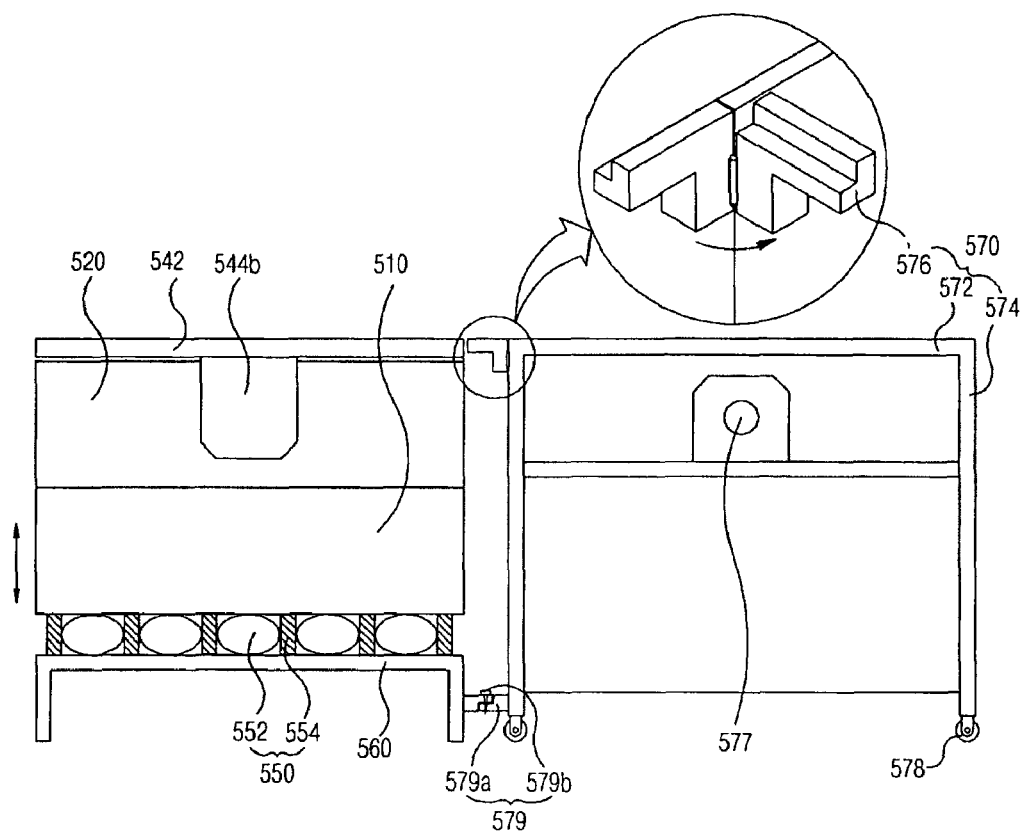
FIG. 30 is a side view illustrating a supporting frame in accordance with the fifth embodiment of the present invention.

Referring to FIG. 30, in the present embodiment, the supporting frame 570 includes: a second horizontal frame piece 572; second vertical frame pieces 574; and gap fillers 576. The second horizontal frame piece 572 has the same height as the first horizontal frame pieces 542a, and extends in the same direction as the first horizontal frame pieces 542a to guide the horizontal movement of the upper cover 520. The second vertical frame pieces 574 serve to support the second horizontal frame piece 572 at the same height as the first horizontal frame pieces 542a. Preferably, the vertical frame pieces 574 are adapted to regulate the height of the second horizontal frame piece 572, to eliminate a height difference between the first and second horizontal frame pieces 542a and 572. Although not shown, a vertical drive unit having a ball screw shape is provided to achieve precious regulation in the height of the second horizontal frame piece 572.

The gap fillers 576 are provided at an end of the second horizontal frame piece 572 facing the chamber. When the supporting frame 570 approaches the first horizontal frame pieces 542a, the gap fillers 576 are adapted to fill a gap between the first and second horizontal frame pieces 542a and 572. As is known, the second horizontal frame piece 572 has difficulty coming into close contact with the first horizontal frame pieces 542a due to various elements provided around the chamber and due to the configuration of the supporting frame itself. Accordingly, as shown in FIG. 30, the gap fillers 576 are separately provided to fill the gap between the first and second horizontal frame pieces 542a and 572. In the present embodiment, the gap fillers 576 are hinged to the second horizontal frame piece 572 in a pivotally rotatable manner, such that they are folded during transportation, but are pivotally rotated in use to fill the gap between the first and second horizontal frame pieces 542a and 572.

Preferably, each of the gap fillers 576 may be provided with a vertical drive unit to ensure a vertical movement thereof.

The supporting frame 570 according to the present embodiment preferably further includes wheels 578 for facilitating the movement thereof. The wheels 578 are mounted at lower ends of the second vertical frame pieces 574, respectively, such that they reduce a frictional force between the second vertical frame pieces 574 and the floor, to ensure easy horizontal movement of the second vertical frame pieces 574.

The supporting frame 570 according to the present embodiment may further include a pair of rotating members 577. The rotating members 577 serve to rotate the upper cover 520. In the present embodiment, the pair of rotating members 577 are mounted to the second horizontal frame piece 572 such that they are located at opposite sides of the upper cover 520 located therebetween. The rotating members 577 are coupled to centers of opposite side walls of the upper cover 520 and are adapted to rotatably support the upper cover 520. Accordingly, when the upper cover 520 is moved by the horizontal drive unit 540 to attain a sufficient rotating radius, the rotating members 577 rotate the upper cover 520, such that the upper cover 520 is opened upward to enable easy management and repair of interior equipment thereof.

Preferably, the supporting frame 570 further includes one or more fixing units 579 to fix the supporting frame 570 to the chamber body 510. The fixing units 579 serve to prevent the supporting frame 570 from moving away from the chamber body 510 during the horizontal movement and rotation of the upper cover 520. In the present embodiment, each of the fixing units 579 includes a pair of fixing blocks 579a and a fixing pin 579b. Accordingly, if the pair of fixing blocks 579 are accurately aligned to each other, the fixing pin 579b is inserted through the fixing blocks 579a to maintain the supporting frame 570 in a fixed position.

The chamber body lifting device 550 serves to vertically move the chamber body 510. In the present embodiment, the chamber body lifting device 550 includes: a plurality of lifting drive members 552; and a guide member 554.

The lifting drive members 552 are interposed between the chamber body 510 and a chamber base frame 560, which supports the chamber body 510 at a predetermined height from the floor. The lifting drive members 552 are adapted to vertically move the chamber body 510. Vertically moving the chamber body 510 has the effect of preventing the chamber body 510 from interfering with the horizontal movement of the upper cover 520 as it contacts with a lower end of the upper cover 520 and also preventing interference between the upper cover 520 and an O-ring. In a state wherein the upper cover 520 is fixed at a predetermined height, the chamber body 510 is lowered to be spaced apart from the upper cover 520 by a predetermined distance.

Figure 27:
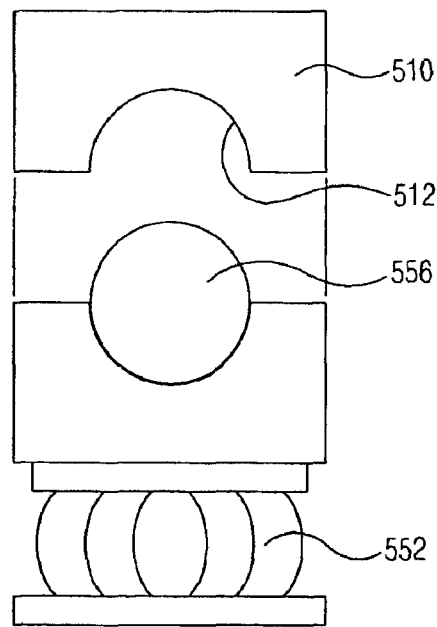
FIG. 27 is a side view illustrating a chamber body lifting device in accordance with the fifth embodiment of the present invention.

The present embodiment employs the plurality of lifting drive members 552 each having a small capacity. Using the plurality of small-capacity lifting drive members 552 is advantageous as compared to using a single large-capacity lifting drive member in view of price. Also, the plurality of lifting drive members 552 can support a heavy chamber body at a plurality of positions, and therefore, is advantageous in maintaining the balance of the chamber body. Each of the lifting drive members 552 preferably takes the form of a bellows cylinder. In this case, as shown in FIG. 27, the bellows cylinders are preferably provided with eccentricity compensators 556, respectively. Specifically, the eccentricity compensators 556, each having a semispherical shape, are formed at upper ends of the bellows cylinders 552. The chamber body 510 is formed with eccentricity compensator insertion recesses 512 at positions of a lower surface thereof corresponding to the center of the respective bellows cylinders 552. With this configuration, when the bellows cylinders 552 come into contact with the lower surface of the chamber body 510 to vertically lift the chamber body 510, the eccentricity compensators 556 slide into the insertion recesses 512 while being lifted, to smoothly find accurate contact positions.

The guide member 554 is coupled to the chamber body 510 and is adapted to guide vertical movements of the chamber body 510. Referring to FIG. 26, in the present embodiment, the guide member 554 preferably takes the form of a guide block unit coupled at a lower surface thereof to an upper surface of the chamber base frame 560 and inserted at an upper surface thereof into a guide recess formed at the lower surface of the chamber body 510. Providing the guide block unit at the lower surface of the chamber body has the effect of guiding an accurate movement direction of the chamber body without requiring a separate installation space for the guide member.

Alternatively, the guide member may take the form of guide columns, which are located aside the chamber body 510 and coupled to the side walls of the chamber body 510 to guide a vertical movement direction of the chamber body 510.

Hereinafter, the opening/closing procedure of the upper cover 520 of the vacuum processing apparatus 500 according to the present embodiment will be explained.

Figure 31A:
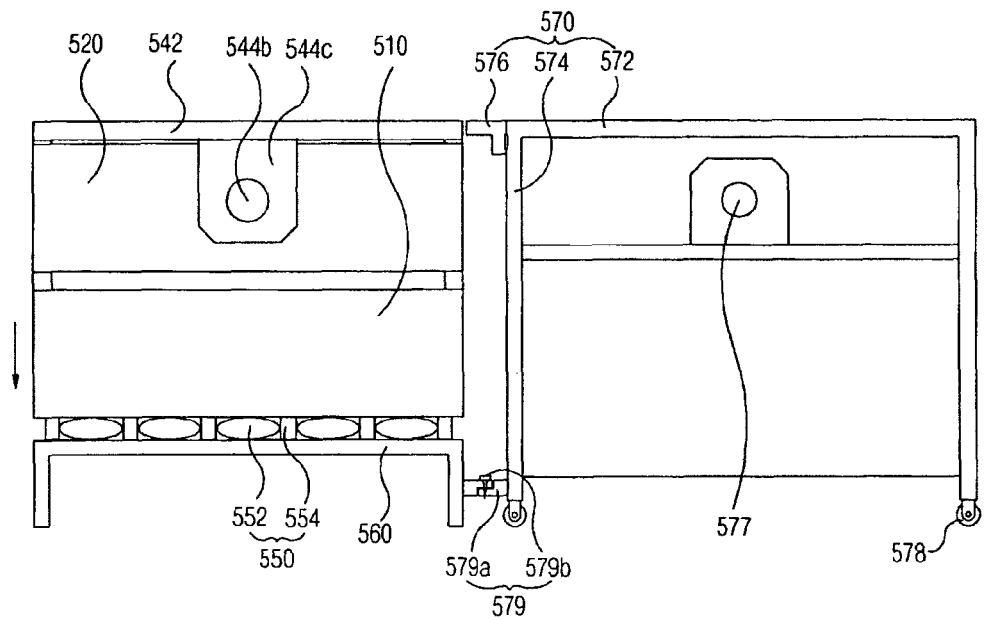
FIGS. 31A to 31C are views illustrating the opening procedure of an upper cover included in the vacuum processing apparatus in accordance with the fifth embodiment of the present invention.
Figure 31B:
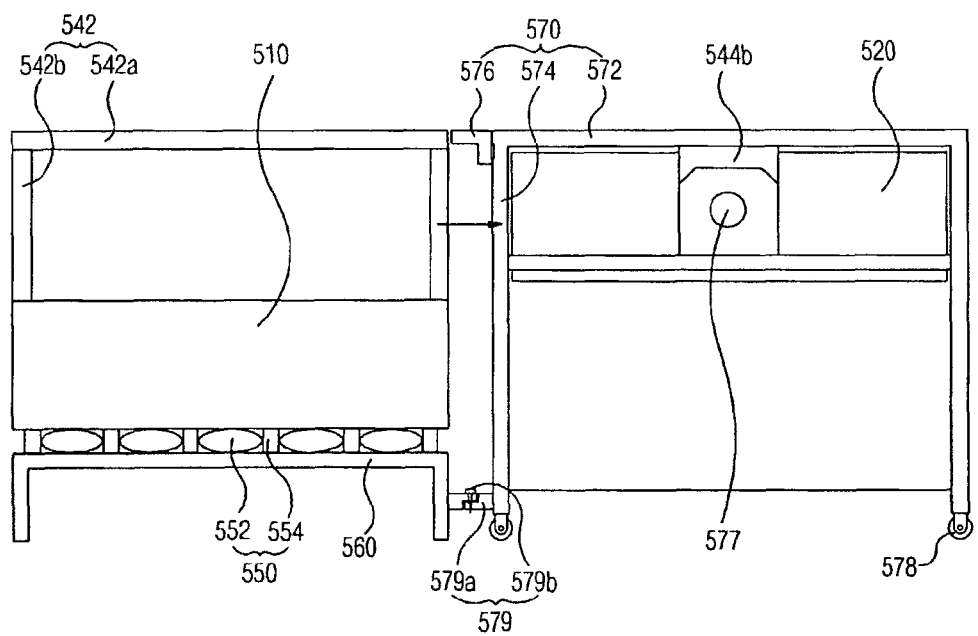
Figure 31C:
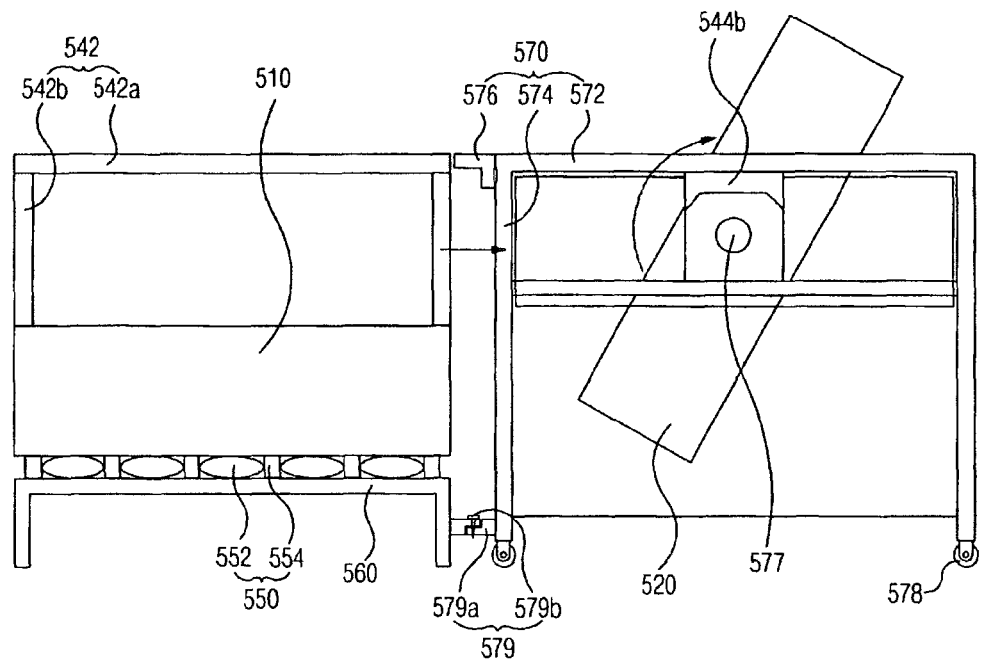

First, as shown in FIG. 31A, the chamber body 510 is lowered by a distance of 10 mm to 15 mm by use of the chamber body lifting device 550, to prevent interference between the upper cover 520 and the chamber body 510. Then, as shown in FIG. 31B, the upper cover 520 is horizontally moved in accordance with the operation of the horizontal drive device 540. In this case, when using the supporting frame 570, the supporting frame 570 must be disposed to come into close contact with the first horizontal frame pieces 542a. After the upper cover 520 is horizontally moved to ensure a stable rotation thereof, as shown in FIG. 31C, the rotating members 577 are operated to rotate the upper cover 520 by 180°. In this way, the upper cover 520 is opened upward to enable the repair of equipment therein. After completing the repair of equipment, the above-described opening procedure of the upper cover 520 is performed in reverse order, to close the upper cover 520.

Sixth Embodiment

Figure 32:
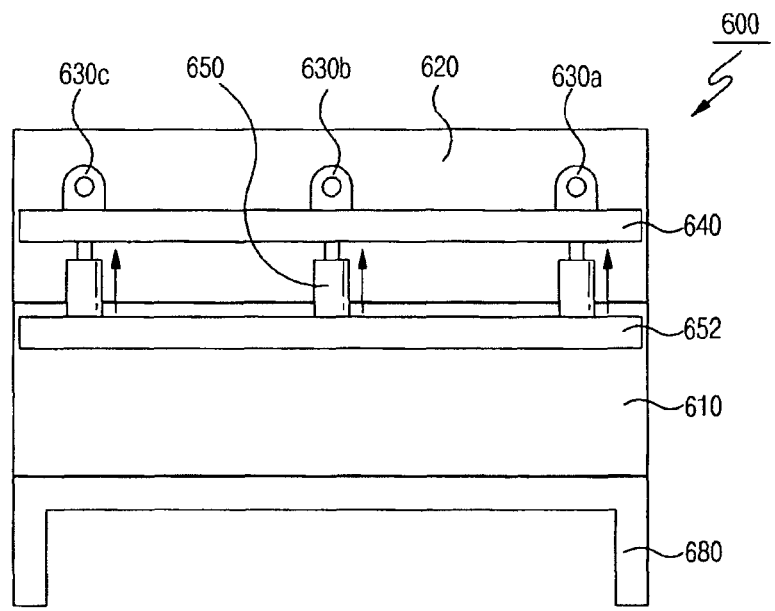
FIG. 32 is a sectional view illustrating a vacuum processing apparatus in accordance with a sixth embodiment of the present invention.

The vacuum processing apparatus according to the present embodiment comprises: a load lock chamber; a feeding chamber; and one or more process chambers, but the following description deals with only one process chamber for the convenience of explanation. Referring to FIG. 32, the vacuum processing apparatus 600 according to the present embodiment includes: a chamber body 610; an upper cover 620; one or more horizontal drive units 630; a pair of upper cover movement frames 640; and a plurality of vertical drive units 650.

In the vacuum processing apparatus 600 according to the present embodiment, the chamber body 610 generally has a rectangular box shape and the upper cover 620 is separably disposed on the chamber body 610, to constitute a vacuum chamber. The vacuum chamber is used to process a large-area flat panel display substrate having a rectangular shape therein, and therefore, generally has a rectangular box shape corresponding to the rectangular substrate. The vacuum chamber is internally provided with an exhaust system (not shown) to create a vacuum in the chamber. After a vacuum is established in the chamber with the operation of the exhaust system, a desired process for the substrate disposed in the chamber is performed.

The chamber body 610 is formed with a substrate entrance, which serves as a passage to receive a substrate from an external station for loading the substrate or to discharge a substrate for unloading the substrate. Generally, a substrate is loaded or unloaded as it is horizontally moved in a lying state, and therefore, the substrate entrance is perforated through one of side walls of the chamber body 610. To open and close the substrate entrance, the chamber body 610 is provided with a gate valve. The substrate entrance is continuously opened during loading and unloading of a substrate, but must be closed after the substrate is completely loaded, such that a desired process for the substrate is performed in a closed state of the chamber. Accordingly, the gate valve is moved vertically to open and close the substrate entrance.

The horizontal drive units 630 serve to horizontally move the upper cover 620 in a direction facing the arrangement direction of the gate valve. As shown in FIG. 32, in the present embodiment, a plurality of horizontal drive units 630 may be provided. In this case, the plurality of horizontal drive units 630 shares the load of the heavy upper cover 620, achieving an increased stability. Furthermore, the upper cover 620 is able to be supported at a plurality of positions, and therefore, there is no risk of vibration of the upper cover 620. This increases the stability of processing operation.

The pair of upper cover movement frames 640 are located at opposite sides of the upper cover 620 in a vertically movable manner. The upper cover movement frames 640 serve to provide a horizontal movement path of the horizontal drive units 630, such that the upper cover 620 is horizontally moved to attain a sufficient rotating radius required to be opened.

The plurality of vertical drive units 650 are coupled to a lower surface of each of the upper cover movement frames 640 such that they are spaced apart from one another by a predetermined distance. The vertical drive units 650 serve to vertically move the upper cover movement frames 640 and the upper cover 620. In the present embodiment, instead of directly lifting the upper cover 620, the upper cover movement frames 640, on which the upper cover 620 is supported, are lifted. Also, a plurality of small-capacity cylinders, rather than a single large-capacity cylinder, are used as the vertical drive units 650, providing an improvement in processing stability. Accordingly, in the present embodiment, the plurality of vertical drive units 650 are arranged along each of the upper cover movement frames 640. A lower frame 652 is provided below each of the upper cover movement frames 640 in parallel to each other, such that the plurality of vertical drive units 650 are disposed on the lower frame 652 by the predetermined distance. Preferably, the plurality of vertical drive units 650 are simultaneously driven on the lower frame 652 to vertically move the upper cover movement frames 640, allowing the upper cover movement frames 640 to move parallel to the floor.

Figure 33:
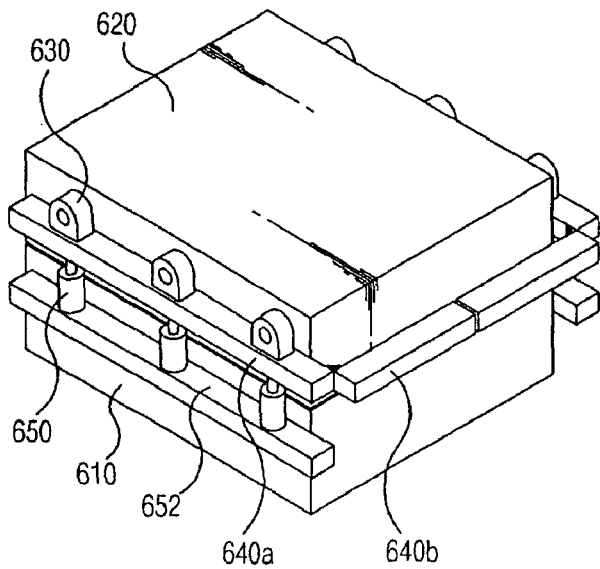
FIG. 33 is a perspective view of the vacuum processing apparatus in accordance with the sixth embodiment of the present invention.

Referring to FIG. 33, each of the upper cover movement frames 640 is divided into a first portion 640a facing the upper cover 620 and a second portion 640b horizontally extending beyond the upper cover 620. Preferably, the second portion 640b is foldable toward the side wall of the upper cover 620 perpendicular to the first portion 640a, such that it is folded when not in use, to minimize an area occupied by the vacuum processing apparatus.

The vacuum processing apparatus 600 according to the present embodiment may further comprise a supporting frame 670, which is disposed aside the chamber body 610 and is adapted to receive the upper cover 620 when the upper cover 620 is horizontally moved along the upper cover movement frames 640. Providing the separate supporting frame 670 has an advantage in that a single supporting frame can be used for a plurality of vacuum chambers included in the vacuum processing apparatus. That is, instead of providing a plurality of vacuum chambers with supporting frames, respectively, a single movable supporting frame is commonly used for the plurality of vacuum chambers.

Figure 34:
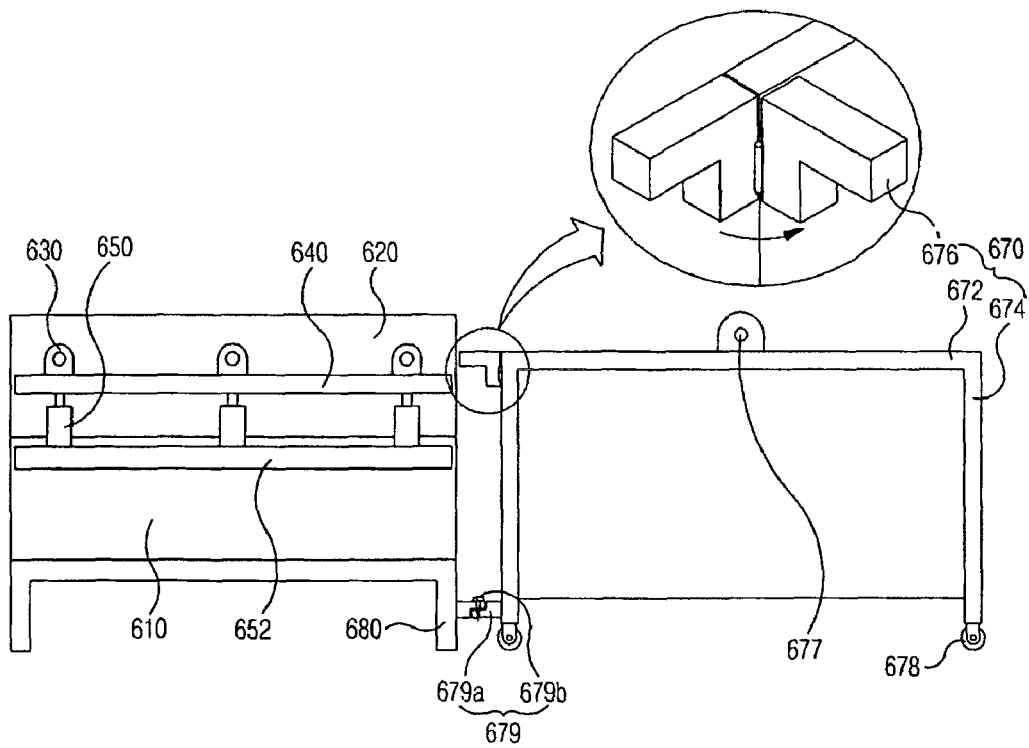
FIG. 34 is a side view illustrating a supporting frame in accordance with the sixth embodiment of the present invention.

Referring to FIG. 34, in the present embodiment, the supporting frame 670 includes: a horizontal frame piece 672; vertical frame pieces 674; and gap fillers 676. The horizontal frame piece 672 has the same height as the upper cover movement frames 640, and extends in the same direction as the upper cover movement frames 640 to guide the horizontal movement of the upper cover 620. The vertical frame pieces 674 serve to support the horizontal frame piece 672 at the same height as the upper cover movement frames 640. Preferably, the vertical frame pieces 674 are adapted to regulate the height of the horizontal frame pieces 672, to eliminate a height difference between the horizontal frame piece 672 and the upper cover movement frames 640.

The gap fillers 676 are provided at an end of the horizontal frame piece 672 facing the chamber. When the supporting frame 670 approaches the upper cover movement frames 640, the gap fillers 676 are adapted to fill a gap between the horizontal frame piece 672 and the upper cover movement frames 640. As is known, the horizontal frame piece 672 has difficulty coming into close contact with the upper cover movement frames 640 due to various elements provided around the chamber and due to the configuration of the supporting frame itself. Accordingly, as shown in FIG. 34, the gap fillers 676 are separately provided to fill the gap between the horizontal frame piece 672 and the upper cover movement frames 640. In the present embodiment, the gap fillers 676 are hinged to the horizontal frame piece 672 in a pivotally rotatable manner, such that they are folded during transportation, but are pivotally rotated in use to fill the gap between the horizontal frame piece 672 and the upper cover movement frames 640.

Preferably, each of the gap fillers 676 may be provided with a vertical drive unit to ensure a vertical movement thereof.

The supporting frame 670 according to the present embodiment preferably further includes wheels 678 for facilitating the movement thereof. The wheels 678 are mounted at lower ends of the vertical frame pieces 674, respectively, such that they reduce a frictional force between the vertical frame pieces 674 and the floor, to ensure easy horizontal movement of the vertical frame pieces 674.

The supporting frame 670 according to the present embodiment may further include a pair of rotating members 677. The rotating units 677 serve to rotate the upper cover 620. In the present embodiment, the pair of rotating members 677 are mounted to the horizontal frame piece 672 such that they are located at opposite sides of the upper cover 620 located therebetween. The rotating members 677 are coupled to centers of opposite side walls of the upper cover 620 and are adapted to rotatably support the upper cover 620. Accordingly, when the upper cover 620 is moved by the horizontal drive units 630 to attain a sufficient rotating radius, the rotating members 677 rotate the upper cover 620, such that the upper cover 620 is opened upward to enable easy management and repair of interior equipment thereof.

Preferably, the supporting frame 670 further includes one or more fixing units 679 to fix the supporting frame 670 to the chamber body 610. The fixing units 679 serve to prevent the supporting frame 670 from moving away from the chamber body 610 during the horizontal movement and rotation of the upper cover 620. In the present embodiment, each of the fixing units 679 includes a pair of fixing blocks 679a and a fixing pin 679b. Accordingly, if the pair of fixing blocks 679 are accurately aligned to each other, the fixing pin 679b is inserted through the fixing blocks 679a to maintain the supporting frame 670 in a fixed position.

Hereinafter, the opening/closing procedure of the upper cover 620 of the vacuum processing apparatus 600 according to the present embodiment will be explained.

Figure 35A:
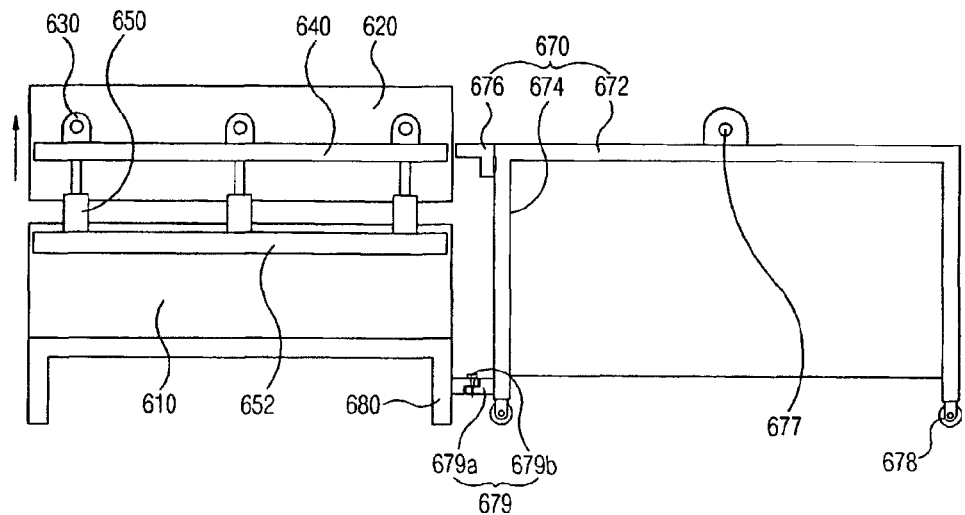
FIGS. 35A to 35C are views illustrating the opening procedure of an upper cover included in the vacuum processing apparatus in accordance with the sixth embodiment of the present invention.
Figure 35B:
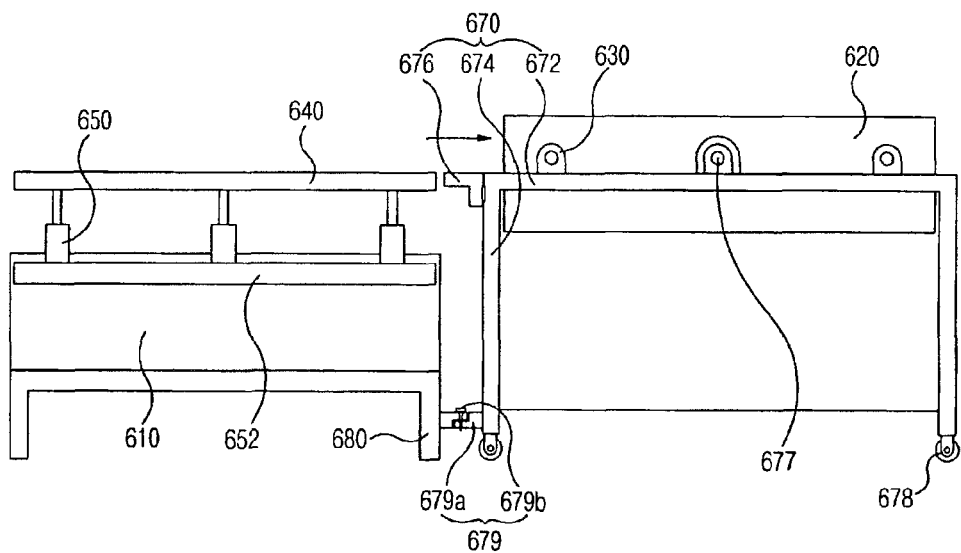
Figure 35C:
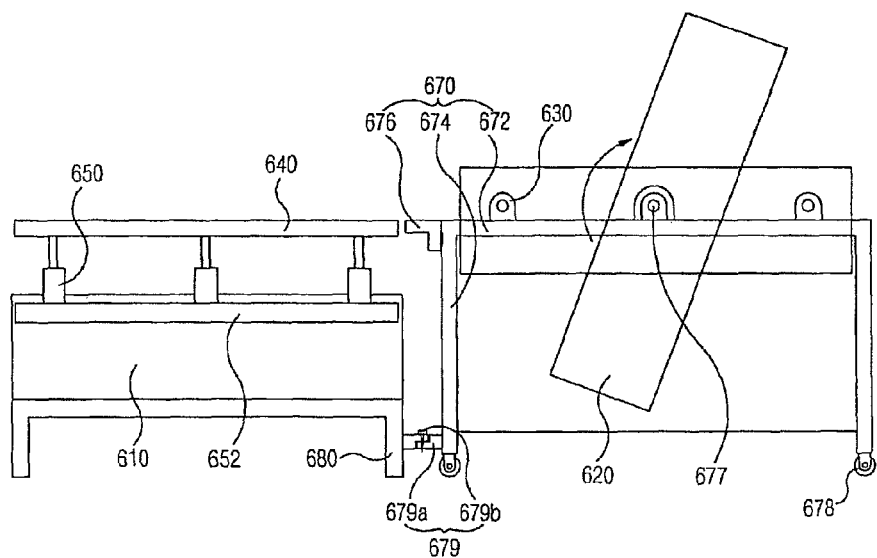

First, as shown in FIG. 35A, the upper cover movement frames 640 are lifted by a distance of 1 mm to 10 mm as the plurality of vertical drive units 650 are simultaneously driven. Thereby, the horizontal drive units 630, rotating members 677, and upper cover 620, which are supported on the upper cover movement frames 640, are lifted. Thereby, if a vacuum in the chamber is released, as shown in FIG. 35B, the upper cover 620 is horizontally moved in accordance with the operation of the horizontal drive units 630. In this case, when using the supporting frame 670, the supporting frame 670 must be disposed to come into close contact with the upper cover movement frames 640. After the upper cover 620 is horizontally moved to attain a sufficient rotating radius, as shown in FIG. 35C, the rotating members 677 are operated to rotate the upper cover 620 by 180°. In this way, the upper cover 120 is opened upward to enable the repair of equipment therein. After completing the repair of equipment, the above-described opening procedure of the upper cover 620 is performed in reverse order, to close the upper cover 620.

Seventh Embodiment

Figure 36:
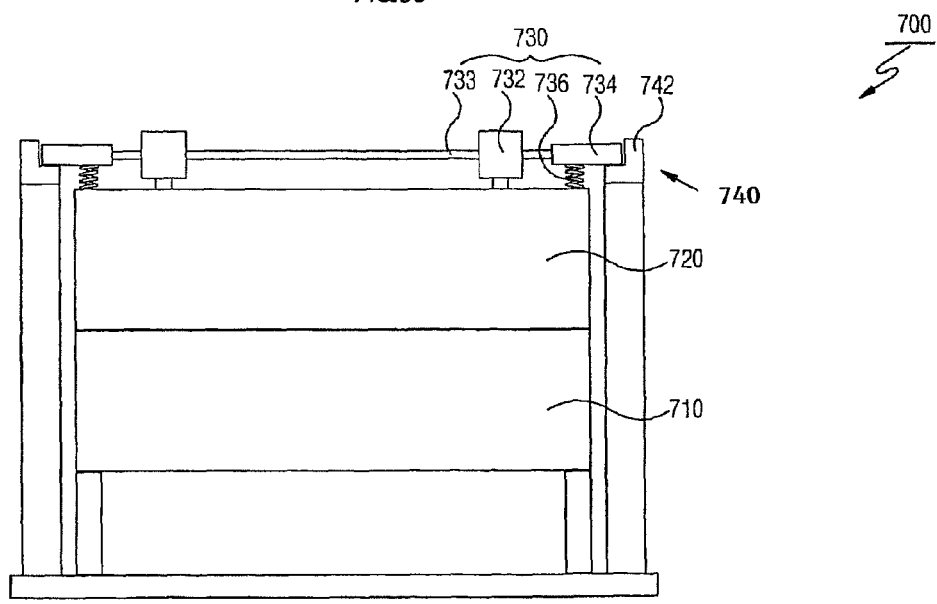
FIG. 36 is a sectional view illustrating a vacuum processing apparatus in accordance with a seventh embodiment of the present invention.

The vacuum processing apparatus according to the present embodiment comprises: a load lock chamber; a feeding chamber; and one or more process chambers, but the following description deals with only one process chamber for the convenience of explanation. Referring to FIG. 36, the vacuum processing apparatus 700 according to the present embodiment includes: a chamber body 710; an upper cover 720; an upper cover lifting device 730; and a horizontal drive device 740.

In the vacuum processing apparatus 700 according to the present embodiment, the chamber body 710 generally has a rectangular box shape and the upper cover 720 is separably disposed on the chamber body 710, to constitute a vacuum chamber. The vacuum chamber is used to process a large-area flat panel display substrate having a rectangular shape therein, and therefore, generally has a rectangular box shape corresponding to the rectangular substrate. The vacuum chamber is internally provided with an exhaust system (not shown) to create a vacuum in the chamber. After a vacuum is established in the chamber with the operation of the exhaust system, a desired process for the substrate disposed in the chamber is performed.

The chamber body 710 is formed with a substrate entrance, which serves as a passage to receive a substrate from an external station for loading the substrate or to discharge a substrate for unloading the substrate. Generally, a substrate is loaded or unloaded as it is horizontally moved in a lying state, and therefore, the substrate entrance is perforated through one of side walls of the chamber body 710. To open and close the substrate entrance, the chamber body 710 is provided with a gate valve. The substrate entrance is continuously opened during loading and unloading of a substrate, but must be closed after the substrate is completely loaded, such that a desired process for the substrate is performed in a closed state of the chamber. Accordingly, the substrate entrance is opened and closed as the gate valve is moved vertically.

Referring to FIG. 36, the upper cover lifting device 730 is separably disposed on the upper cover 720 to vertically move the upper cover 720. In the present embodiment, prior to being horizontally moved for the opening operation thereof, the upper cover 720 is lifted by a predetermined distance by use of the upper cover lifting device 730.

The upper cover lifting device 730 of the present embodiment includes: a plurality of hoist cranes 732; and a crane supporting frame 734. The hoist cranes 732 are coupled to the supporting frame 734 to extend downward, such that they are coupled to an upper surface of the upper cover 720 to lift the upper cover 720. The plurality of hoist cranes 732 are coupled to a plurality of positions of the upper cover 720, respectively, to share the load of the heavy upper cover 720. Lifting the upper cover 720 by use of the plurality of hoist cranes 732 coupled thereto has the effect of dispersing the concentration of load. Also, as a result of supporting the upper cover 720 at a plurality of positions, vibration of the upper cover 720 during the vertical movements of the upper cover 720 can be minimized.

Figure 37:
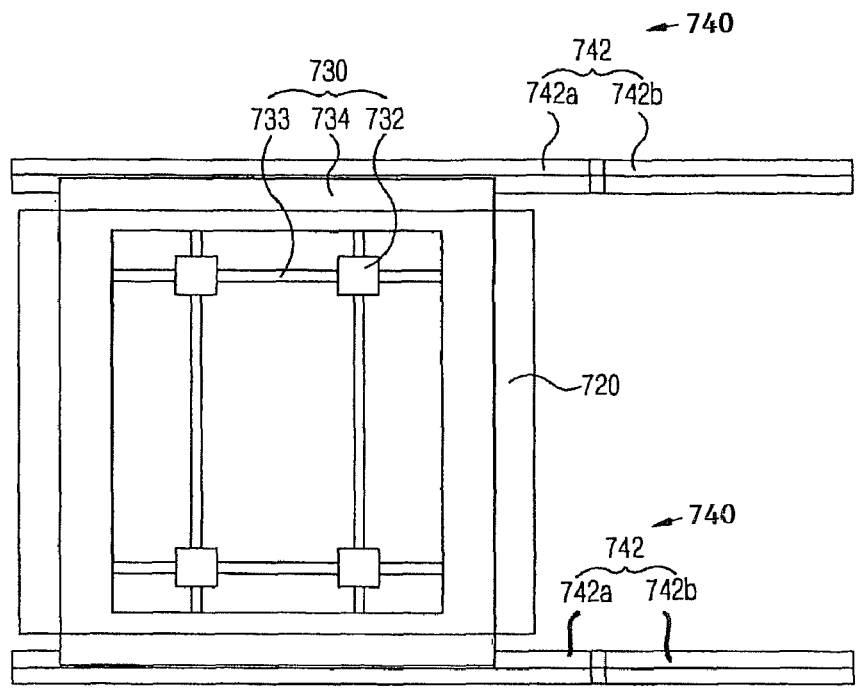
FIG. 37 is a plan view illustrating an upper cover lifting device in accordance with the seventh embodiment of the present invention.

The crane supporting frame 734 is located above the upper cover 720 to be spaced apart in parallel from the upper surface of the upper cover 720, and has a shape corresponding to the rim of the upper cover 720. The plurality of hoist cranes 732 are coupled to appropriate positions of the crane supporting frame 734 to be supported by the crane supporting frame 734. Referring to FIG. 37, the crane supporting frame 734 generally has a rectangular ring shape corresponding to the rim of the upper cover 720, but has a larger width than the upper cover 720. To allow the plurality of hoist cranes 732 to be arranged in various positions, as shown in FIG. 37, an auxiliary frame 733 is provided at the crane supporting frame 734. The auxiliary frame 733 is arranged within the crane supporting frame 734 to extend across the crane supporting frame 734. As shown in FIG. 37, the hoist cranes 732 are located at intersections of the auxiliary frame 733.

The upper cover lifting device 730 according to the present embodiment is movable from one place to the other place by a main crane (not shown) mounted to the top of a clean room in which the vacuum processing apparatus is installed. Specifically, the upper cover lifting device 730 is lifted by the main crane, such that it is moved from one vacuum processing apparatus to another vacuum processing apparatus in order to open an upper cover of the apparatus. Accordingly, it is preferable that the crane supporting frame 734 be provided at an upper surface thereof with couplers (not shown) to be coupled with the main crane. Using the movable upper cover lifting device 730 eliminates the need for providing all process chambers of the vacuum processing apparatus with upper cover lifting devices, respectively, whereby reduced manufacturing costs and simplified apparatus structure can be accomplished.

Preferably, the upper cover lifting device 730 according to the present embodiment is provided with a vibration-proof member 736. The vibration-proof member 736 is interposed between the crane supporting frame 734 and the upper cover 720 and is adapted to prevent vibration of the upper cover 720 when the upper cover 720 is lifted or lowered. In the present embodiment, as shown in FIG. 36, the vibration-proof member 736 may include a plurality of elastic springs. In this case, it is preferable that the elastic springs 736 are coupled to corners or edges of the upper surface of the upper cover 720, in order to achieve an increase in vibration-proof efficiency of the upper cover 720. When the vibration-proof member 736 is formed of the elastic springs, it can absorb the vibration of the upper cover 720, and elastically press the upper cover 720, achieving an increase of vibration-proof efficiency.

Figure 38:
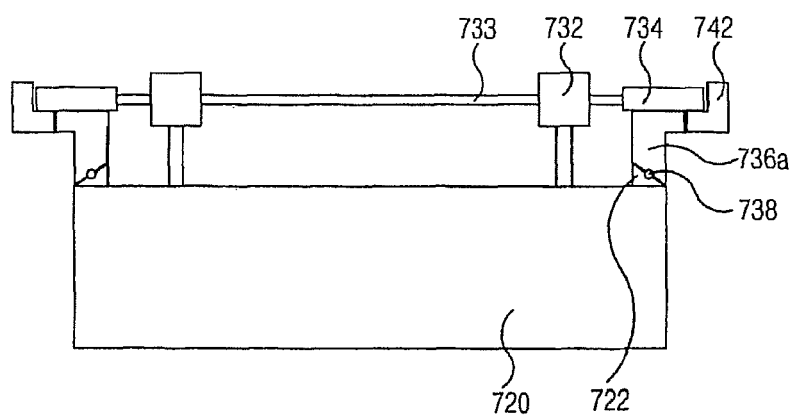
FIG. 38 is a sectional view illustrating a vibration-proof member in accordance with the seventh embodiment of the present invention.

Referring to FIG. 38, alternatively, the vibration-proof member 736 may include a vibration-proof jig 736a having a shape corresponding to the rim of the upper cover 720. The vibration-proof jig 736a is configured to be coupled with a vibration stopper 722 formed at the upper surface of the upper cover 720. In this case, to effectively prevent the vibration of the upper cover 720, the vibration stopper 722 and the vibration-proof jig 736a must be configured to come into close contact with each other. In the present embodiment, as shown in FIG. 38, it is preferable that contact surfaces of both the vibration stopper 722 and the vibration-proof jig 736a are inclined outward, in order to ensure the contact surface of the vibration stopper 722 can smoothly come into contact with the contact surface of the vibration-proof jig 736a to slide thereon as the upper cover 720 is lifted.

Preferably, the vibration-proof jig 736a is provided with upper cover height sensors 738 to accurately measure the height of the upper cover 720. The upper cover height sensors 738 are interposed between the vibration-proof jig 736a and the vibration stopper 722 to sense the height of the lifted upper cover 720. Accurately measuring the height of the upper cover 720 is important since the upper cover 720 or crane may be damaged if power is continuously applied to the hoist cranes 732 after the upper cover 720 is completely lifted. Also, when the upper cover 720 is insufficiently lifted, it may cause damage to an O-ring during the horizontal movement of the upper cover 720. Accordingly, in the present embodiment, the upper cover height sensors 738, which are of a contact type sensor, are provided at the contact surface of the vibration-proof jig 736a, such that the operation of the hoist cranes 732 stops when the lifted upper cover 720 touches the sensors 738.

The horizontal drive device 740 is configured to be disposed at opposite sides of the upper cover 720 such that the upper cover 720 is located therebetween. The horizontal drive device 740 serves to horizontally move the upper cover 720 after the upper cover 720 is lifted by the upper cover lifting device 730. Referring to FIG. 36, the horizontal drive device 740 supports opposite sides of the crane supporting frame 734 horizontally move the crane supporting frame 734, and consequently, to horizontally move the lifted upper cover 720 which is coupled to the crane supporting frame 734. Accordingly, in the present embodiment, the horizontal drive device 740 includes guide rails 742 including a pair of guide rails 742a and 742b provided at each of two opposite sides of the upper cover and a drive motor (not shown). As shown in FIG. 36, the guide rails 742 come into contact with opposite sides of the crane supporting frame 734 to horizontally guide the crane supporting frame 734. The drive motor provides power required to horizontally move the crane supporting frame 734. Accordingly, the drive motor is coupled to both the crane supporting frame 734 and the guide rails 742, to horizontally move the crane supporting frame 734.

The vacuum processing apparatus 700 according to the present embodiment may further comprise a supporting frame 770, which is disposed aside the chamber body 710 and is adapted to receive the upper cover 720 when the upper cover 720 is horizontally moved by the horizontal drive device 740. Providing the separate supporting frame 770 has an advantage in that a single supporting frame can be used for a plurality of vacuum chambers included in the vacuum processing apparatus. That is, instead of providing a plurality of vacuum chambers with supporting frames, respectively, a movable supporting frame is commonly used for a plurality of vacuum chambers.

Figure 39:
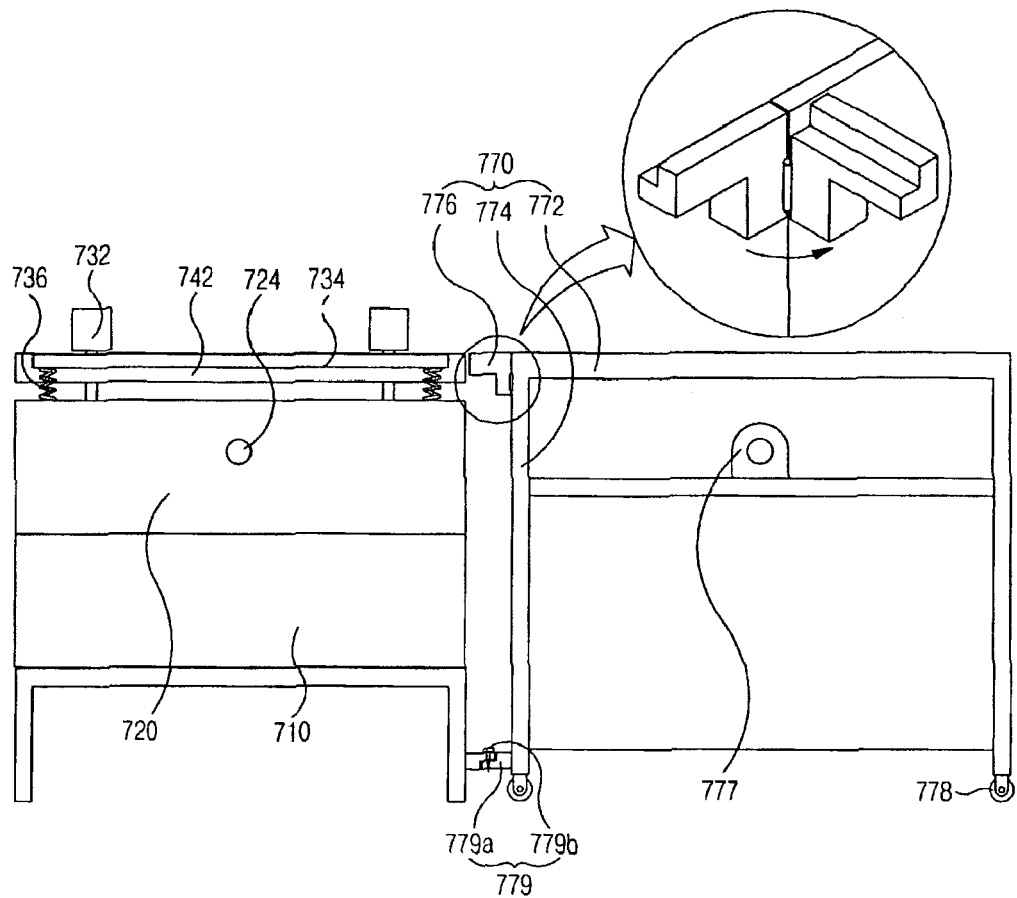
FIG. 39 is a side view illustrating a supporting frame in accordance with the seventh embodiment of the present invention.

Referring to FIG. 39, in the present embodiment, the supporting frame 770 includes: a horizontal frame piece 772; vertical frame pieces 774; gap fillers 776; and rotating members 777. The horizontal frame piece 772 has the same height as the guide rails 742, and extends in the same direction as the guide rails 742 to guide the horizontal movement of the upper cover 720. The vertical frame pieces 774 serve to support the horizontal frame piece 772 at the same height as the guide rails 742. Preferably, the vertical frame pieces 774 are adapted to regulate the height of the horizontal frame piece 772, to eliminate a height difference between the horizontal frame piece 772 and the guide rails 742.

The gap fillers 776 are provided at an end of the horizontal frame piece 772 facing the chamber. When the supporting frame 770 approaches the guide rails 742, the gap fillers 776 are adapted to fill a gap between the horizontal frame piece 772 and the guide rails 742. As is known, the horizontal frame piece 772 has difficulty coming into close contact with the guide rails 742 due to various elements provided around the chamber and due to the configuration of the supporting frame itself. Accordingly, as shown in FIG. 39, the gap fillers 776 are separately provided to fill the gap between the horizontal frame piece 772 and the guide rails 742. In the present embodiment, the gap fillers 776 are hinged to the horizontal frame piece 772 in a pivotally rotatable manner, such that they are folded during transportation, but are pivotally rotated in use to fill the gap between the horizontal frame piece 772 and the guide rails 742.

Preferably, each of the gap filler 776 may be provided with a vertical drive unit to ensure a vertical movement thereof. Although not shown, the vertical drive unit preferably takes the form of a ball screw to achieve an accurate vertical movement of the gap filler 776.

The rotating members 777 serve to rotate the upper cover 720 after the upper cover 720 is moved to the supporting frame 770. In the present embodiment, the pair of rotating members 777 are located at the center of the horizontal frame piece 772 such that they are separably coupled to the upper cover 720. That is, The rotating members 777 are located at opposite sides of the upper cover 720 and are horizontally movable to couple with couplers 724 provided at opposite side walls of the upper cover 720. Accordingly, when the upper cover 720 reaches a rotatable position, the rotating members 777 are coupled with the couplers 724 to rotate the upper cover 720 by 180°.

Preferably, each of the gap fillers 776 may be provided with a vertical drive unit to ensure a vertical movement thereof.

The supporting frame 770 according to the present embodiment preferably further includes wheels 778 for facilitating the movement thereof. The wheels 778 are mounted at lower ends of the vertical frame pieces 774, respectively, such that they reduce a frictional force between the vertical frame pieces 774 and the floor, to ensure easy horizontal movement of the vertical frame pieces 774.

Preferably, the supporting frame 770 further includes one or more fixing units 779 to fix the supporting frame 770 to the chamber body 710. The fixing units 779 serve to prevent the supporting frame 770 from moving away from the chamber body 710 during the horizontal movement and rotation of the upper cover 720. In the present embodiment, each of the fixing units 779 includes a pair of fixing blocks 779a and a fixing pin 779b. Accordingly, if the pair of fixing blocks 779 are accurately aligned to each other, the fixing pin 779b is inserted through the fixing blocks 779a to maintain the supporting frame 770 in a fixed position.

Hereinafter, the opening/closing procedure of the upper cover 720 of the vacuum processing apparatus 700 according to the present embodiment will be explained.

Figure 40A:
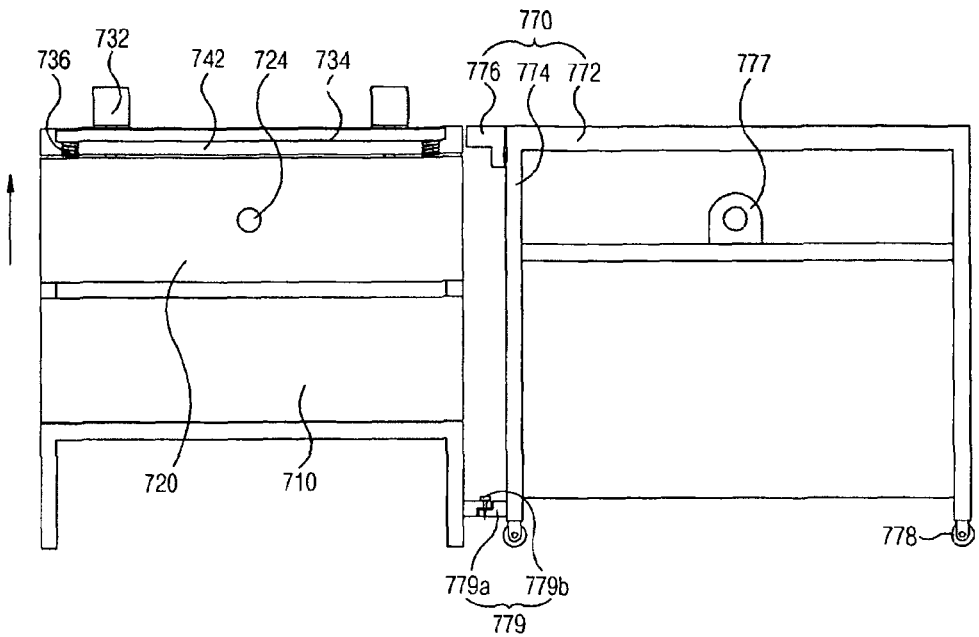
FIGS. 40A to 40C are views illustrating the opening procedure of an upper cover included in the vacuum processing apparatus in accordance with the seventh embodiment of the present invention.
Figure 40B:
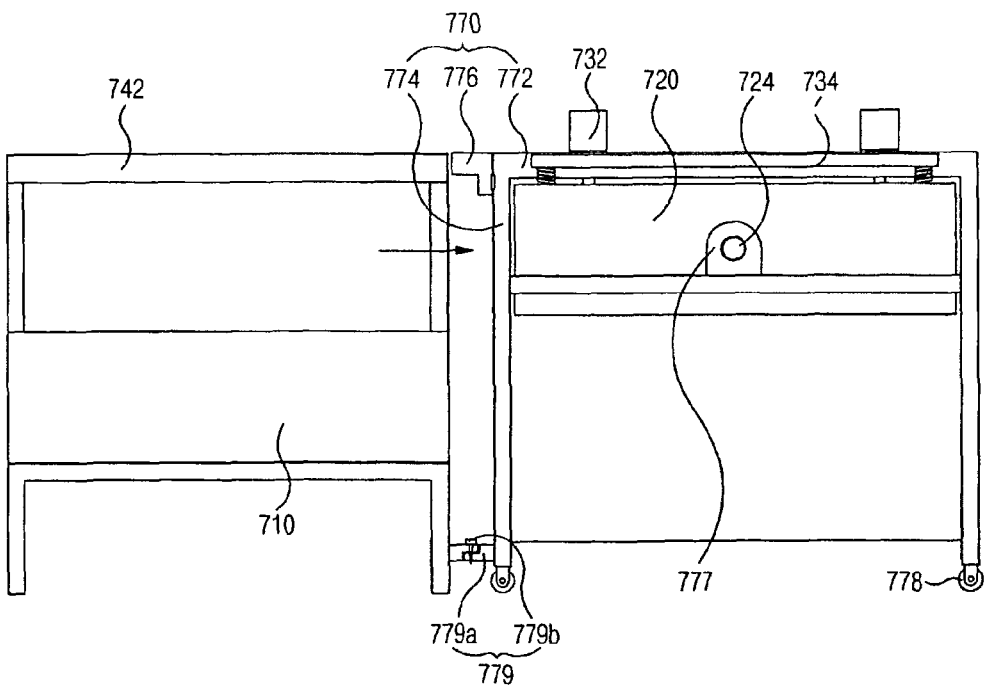
Figure 40C:
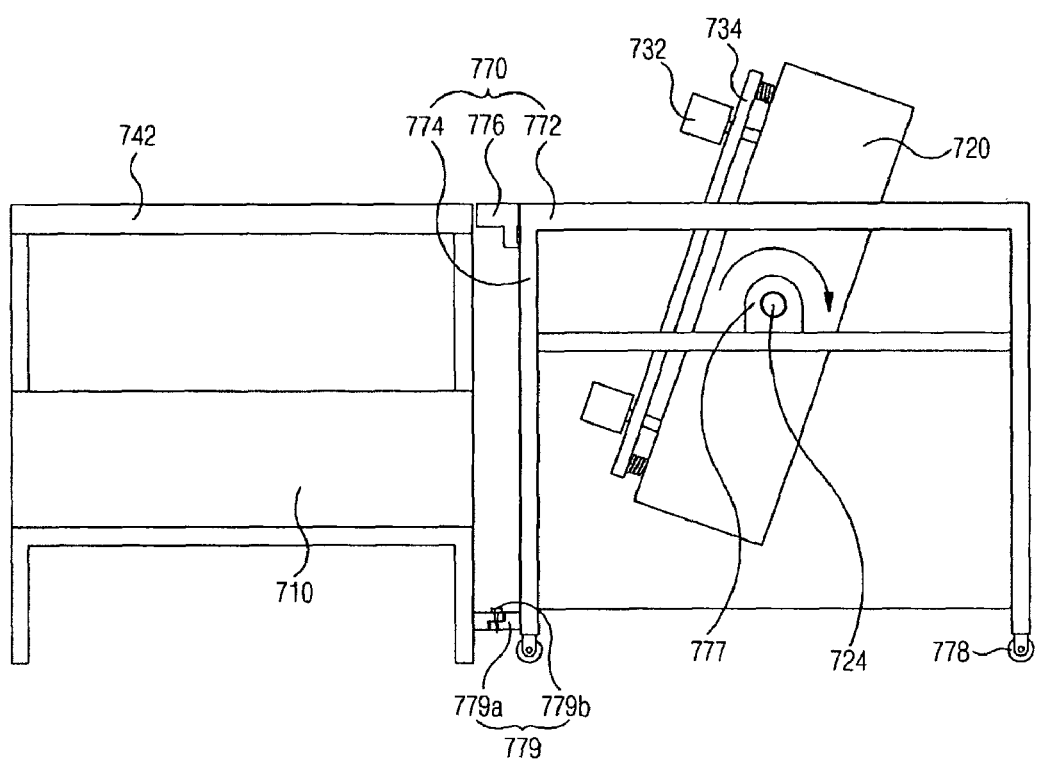

First, as shown in FIG. 40A, the upper cover 720 is lifted by a distance of 1 mm to 10 mm by simultaneously driving the plurality of hoist cranes 732. As the upper cover 720 is lifted, a vacuum in the chamber is released. Then, as shown in FIG. 40B, the upper cover 720 and the crane supporting frame 734 are horizontally moved in accordance with the operation of the horizontal drive device 740. In this case, when using the supporting frame 770, the supporting frame 770 must be disposed to come into close contact with the guide rails 742. After the upper cover 720 is horizontally moved to ensure a stable rotation thereof, as shown in FIG. 40C, the rotating members 777 are operated to rotate the upper cover 720 by 180°. In this way, the upper cover 720 is opened upward to enable the repair of equipment therein. After completing the repair of equipment, the above-described opening procedure of the upper cover 720 is performed in reverse order, to close the upper cover 720.

Eighth Embodiment

Figure 41:
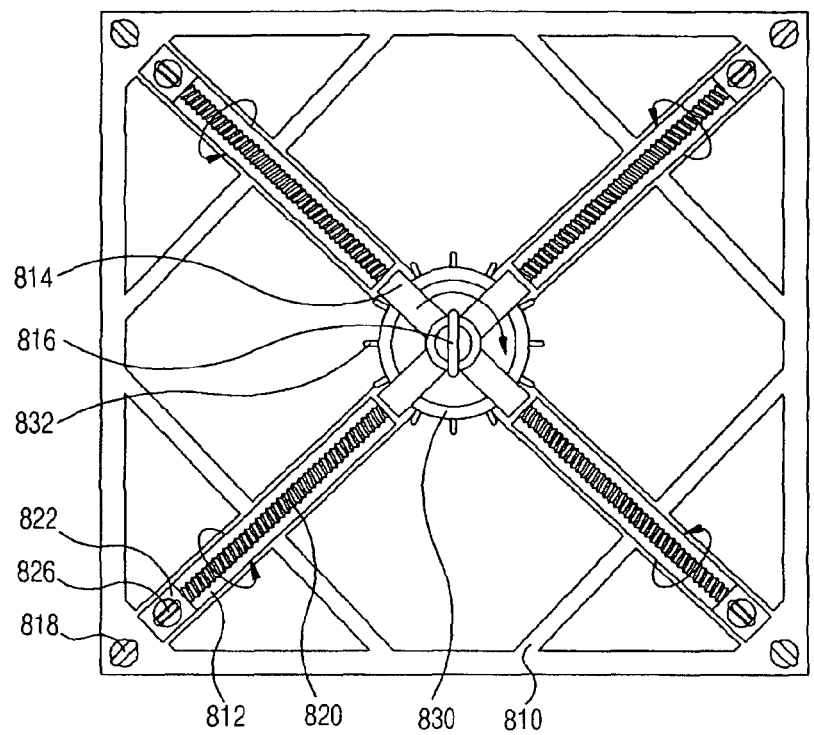
FIG. 41 is a plan view illustrating a transportation hoist jig system in accordance with an eighth embodiment of the present invention.
Figure 42:
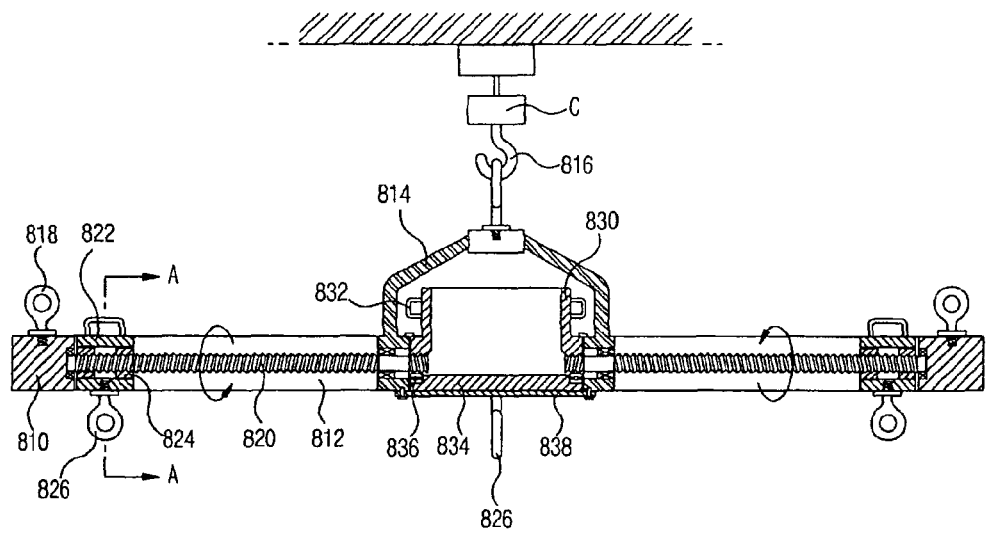
FIG. 42 is a side sectional view of FIG. 41.

Referring to FIGS. 41 and 42, a transportation hoist jig system in accordance with a preferred embodiment of the present invention includes: a body 810; first to third connecting loops 816, 818, and 826; screws 820; movers 822; a power source 830; a lower plate 834; bearings 836; and a fixing plate 838.

The body 810 has a square shape having an appropriate thickness. The body 810 has: four guide slots 812, which diagonally extend from a center point to four corners of the body 810 by a predetermined distance; and a crucial extension 814 extending upward from the center point of the body 810 by a predetermined distance.

The guide slots 812 are equidistantly spaced apart from one another by 90°, and each has a downwardly tapered cross section.

In the present embodiment, the body 810 is partially dented for the sake of a reduction in material costs. The dented structure also has the function of reinforcing the overall strength of the body 810. The second connecting loops 818 are mounted at four corners of an upper surface of the body 810, respectively, such that wires of a crane C are connected to the second connecting loops 818 when it is necessary to transfer a certain heavy object. Connecting the wires of the crane C to the corners of the body 810 by use of the connecting loops 818 has the effect of achieving an even load dispersion.

The first connecting loop 816 is mounted to an upper surface of the extension 814, which is provided at the center of the body 810, to be connected to the crane C provided at the top of a clean room.

The screws 820 are received in the guide slots 812, respectively, while each interposes bearings at positions spaced apart from front and rear ends thereof by predetermined distances. The screws 820 consist of left and right screws. Although both the left and right screws 820 have the same rotating direction as each other, the left and right screws 820 cause movers 822, which are respectively fastened to the screws 820, to simultaneously move inward or outward, whereby positions of the movers 820 are uniformly changed simultaneously.

Each of the movers 822 has a downwardly tapered block shape corresponding to the cross section of the guide slot 822. The mover 822 is horizontally perforated with a bore such that a pair of nuts 824 are mounted at opposite ends of the bore. The screw 824 is rotatably fastened to the nuts 824. The third connecting loop 826 is mounted to the center of a lower surface of the mover 822.

The power source 830 has a hollow vertical cylinder shape and is stepped such that an upper end thereof is narrower than a lower end thereof. U-shaped handles 832 are circumferentially arranged along the upper end of the power source 830. The power source 830 is located in an upper end region of a through-bore vertically perforated through the center of the body 810.

The power source 830 is formed at a lower surface thereof with helical threads, and the helical threads are engaged with threads formed at the front end of each of the screws 820. With this configuration, if the power source 830 is rotated in a direction, the plurality of screws 820 are simultaneously rotated via the engaged helical threads of the power source 830 and threads of the screws 820. Since the left and right screws 820 are located opposite to each other, simultaneously, the movers 822 fastened to the screws 820 are moved inward or outward, to be changed in position uniformly.

The lower plate 834 is inserted into a lower end region of the through-bore that is perforated through the center of the body 810. For this, the lower plate 834 is stepped such that an upper end thereof is narrower than a lower end thereof. A bearing 836 is fitted to a stepped portion of the lower plate 824. The bearing 836 serves to vertically support the lower plate 824 and is located to come into contact with a lower surface of the front end of each of the screws 820.

Specifically, if the power source 830 is rotated, the screws 820, which come into contact with the power source 830, are rotated. In this case, the bearing 836 comes into contact with the lower surface of each of the screws 820, serving to facilitate the rotation of the screws 820.

The fixed plate 838 has a disk shape, and is fastened to the center of a lower surface of the body 810 by means of a plurality of bolts. The fixed plate 838 serves to position the lower plate 834, to which the bearing 836 is fixed, in the center through-bore of the body 810, in order to allow an upper surface of the bearing 836 to come into contact with the lower surface of the front end of each of the screws 820.

Figure 43:
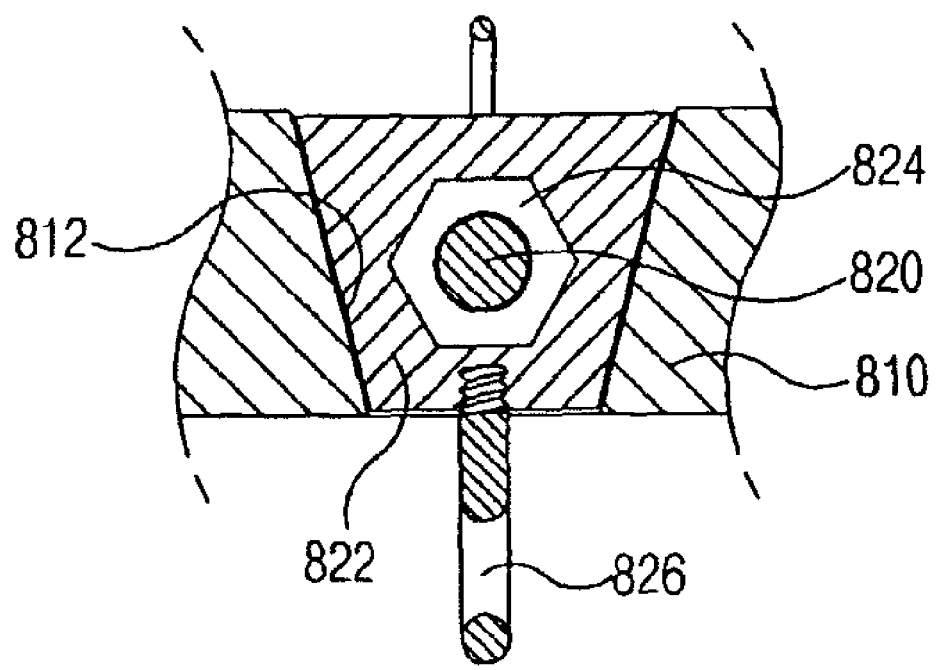
FIG. 43 is a sectional view taken along the line A-A shown in FIG. 42.

As stated above, each of the movers 822, received in the guide slot 812 of the body 810, has an inverted trapezoidal shape, and therefore, has opposite inclined surfaces. Accordingly, even if the movers 822 are not fixed to the guide portions 812 by use of separate fixing means, the movement of the movers 822 is guided via the opposite inclined surfaces thereof (See. FIG. 43).

With the above-described configuration, as shown in FIGS. 41 to 43, the transportation hoist jig system of the present invention, having a predetermined size, is able to transfer an upper cover (not shown) of a chamber (not shown) as the connecting loops 826 are moved inward or outward to appropriate positions corresponding to the size of the upper cover.

Here, to change the positions of the connecting loops 826, first, the handles 832, which are circumferentially arranged along the upper end of the power source 830, are manually rotated in a direction to rotate the power source 830. If the power source 830 is rotated, the helical threads of the lower surface of the power source 830 are rotated, causing the four screws 820 engaged with the threads of the power source 830 to be simultaneously rotated. Since the threads of the left screws 820 are formed opposite to those of the right screws 829, the movers 822 fastened to the left and right screws 820 are simultaneously moved inward or outward, thereby being changed in position. As a result, the connecting loops 826 mounted at lower surfaces of the movers 822 are also changed in position. In this way, when it is necessary to transfer a large-area upper cover or other various plates, the movers 822 are moved outward to enable easy coupling of the upper cover. Conversely, when it is necessary to transfer a small-area upper cover or other various plates, the movers 822 are moved inward to enable easy coupling of the upper cover.

The operation of the power source 830 is able to be performed by a drive motor (not shown).

As apparent from the above description, the present invention provides a large-scale vacuum processing apparatus suitable for the processing of a large-area substrate having the following effects.

Firstly, according to the present invention, an upper cover requires only simplified rotating and horizontal drive devices and a chamber body is able to be vertically moved with a simplified structure, whereby opening/closing operations of the upper cover can be easily accomplished.

Secondly, according to the present invention, the upper cover is opened after it is horizontally moved to an unused space between process chambers. This has the effect of achieving a remarkable reduction in foot-print of the vacuum processing apparatus.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A processing apparatus comprising a chamber body having a gate valve for enabling loading and unloading of a substrate and an upper cover separably disposed on the chamber body, the processing apparatus further comprising:
   an upper cover lifting device coupled to the upper cover to vertically move the upper cover; and
   a horizontal drive device disposed at opposite sides of the upper cover and adapted to horizontally move the upper cover after the upper cover is lifted by the upper cover lifting device, wherein the upper cover lifting device includes:
      a plurality of hoist cranes coupled to an upper surface of the upper cover to lift the upper cover;
      a crane supporting frame spaced apart in parallel from the upper surface of the upper cover, the plurality of hoist cranes being coupled to and supported by the crane supporting frame; and
      a vibration-proof member interposed between the crane supporting frame and the upper cover and adapted to prevent vibration of the upper cover when the upper cover is lifted.

2. The apparatus as set forth in claim 1, wherein the vibration-proof member is a vibration-proof jig having a shape corresponding to a rim region of the upper cover, the vibration-proof jig being coupled with a vibration stopper formed at the upper surface of the upper cover to prevent vibration of the upper cover.

3. The apparatus as set forth in claim 2, wherein the vibration-proof jig is provided with one or more upper cover height sensors, which are interposed between the vibration-proof jig and the vibration stopper to sense the height of the lifted upper cover.

4. The apparatus as set forth in claim 3, wherein the upper cover height sensors are contact type sensors.

* * * * *